US010867929B2

(12) United States Patent
Yu et al.

(10) Patent No.: US 10,867,929 B2
(45) Date of Patent: Dec. 15, 2020

(54) SEMICONDUCTOR STRUCTURES AND METHODS OF FORMING THE SAME

(71) Applicant: Taiwan Semiconductor Manufacturing Company, Ltd., Hsinchu (TW)

(72) Inventors: Chen-Hua Yu, Hsinchu (TW); Tzuan-Horng Liu, Longtan Township (TW); Ming-Fa Chen, Taichung (TW); Chao-Wen Shih, Zhubei (TW); Sung-Feng Yeh, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/371,808

(22) Filed: Apr. 1, 2019

(65) Prior Publication Data
US 2020/0185330 A1    Jun. 11, 2020

Related U.S. Application Data

(60) Provisional application No. 62/775,700, filed on Dec. 5, 2018.

(51) Int. Cl.
*H01L 23/538* (2006.01)
*H01L 21/48* (2006.01)
(Continued)

(52) U.S. Cl.
CPC ...... *H01L 23/5389* (2013.01); *H01L 21/4853* (2013.01); *H01L 21/4857* (2013.01); *H01L 21/4871* (2013.01); *H01L 21/565* (2013.01); *H01L 21/78* (2013.01); *H01L 22/12* (2013.01); *H01L 23/3128* (2013.01); *H01L 23/3675* (2013.01); *H01L 23/5383* (2013.01); *H01L 23/5386* (2013.01); *H01L 24/19* (2013.01); *H01L 24/20* (2013.01); *H01L 25/105* (2013.01); *H01L 2224/214* (2013.01);
(Continued)

(58) Field of Classification Search
None
See application file for complete search history.

(56) References Cited

U.S. PATENT DOCUMENTS 9,484,227 B1 * 11/2016 Cheng ............... H01L 25/105
2008/0210935 A1    9/2008 Ebara
(Continued)

FOREIGN PATENT DOCUMENTS

KR    20070090820 A    9/2007
KR    20140058268 A    5/2014
(Continued)

*Primary Examiner* — Bilkis Jahan
(74) *Attorney, Agent, or Firm* — Slater Matsil, LLP

(57) ABSTRACT

A method of forming semiconductor structure includes attaching backsides of top dies to a front side of a bottom wafer, the bottom wafer comprising a plurality of bottom dies; forming first conductive pillars on the front side of the bottom wafer adjacent to the top dies; forming a first dielectric material on the front side of the bottom wafer around the top dies and around the first conductive pillars; and dicing the bottom wafer to form a plurality of structures, each of the plurality of structures comprising at least one of the top dies and at least one of the bottom dies.

20 Claims, 43 Drawing Sheets

(51) Int. Cl.
*H01L 21/56* (2006.01)
*H01L 21/78* (2006.01)
*H01L 21/66* (2006.01)
*H01L 23/00* (2006.01)
*H01L 23/31* (2006.01)
*H01L 23/367* (2006.01)
*H01L 25/10* (2006.01)

(52) U.S. Cl.
CPC ............. *H01L 2225/1035* (2013.01); *H01L 2225/1058* (2013.01); *H01L 2924/19103* (2013.01)

(56) References Cited

U.S. PATENT DOCUMENTS

| | | | |
|---|---|---|---|
| 2009/0250800 A1 | 10/2009 | Harayama et al. | |
| 2013/0049195 A1* | 2/2013 | Wu | H01L 21/561 257/738 |
| 2013/0062760 A1* | 3/2013 | Hung | H01L 24/97 257/738 |
| 2013/0075936 A1* | 3/2013 | Lin | H01L 23/49816 257/777 |
| 2013/0341784 A1* | 12/2013 | Lin | H01L 24/20 257/737 |
| 2014/0103527 A1* | 4/2014 | Marimuthu | H01L 23/3128 257/737 |
| 2014/0124949 A1 | 5/2014 | Paek et al. | |
| 2017/0007197 A1 | 1/2017 | Beyerlein et al. | |
| 2017/0110438 A1 | 4/2017 | Chen et al. | |
| 2018/0082964 A1* | 3/2018 | Wu | H01L 23/5383 |

FOREIGN PATENT DOCUMENTS

| | | |
|---|---|---|
| KR | 20180032516 A | 3/2018 |
| TW | 201725661 A | 7/2017 |
| TW | 201737432 A | 10/2017 |

* cited by examiner

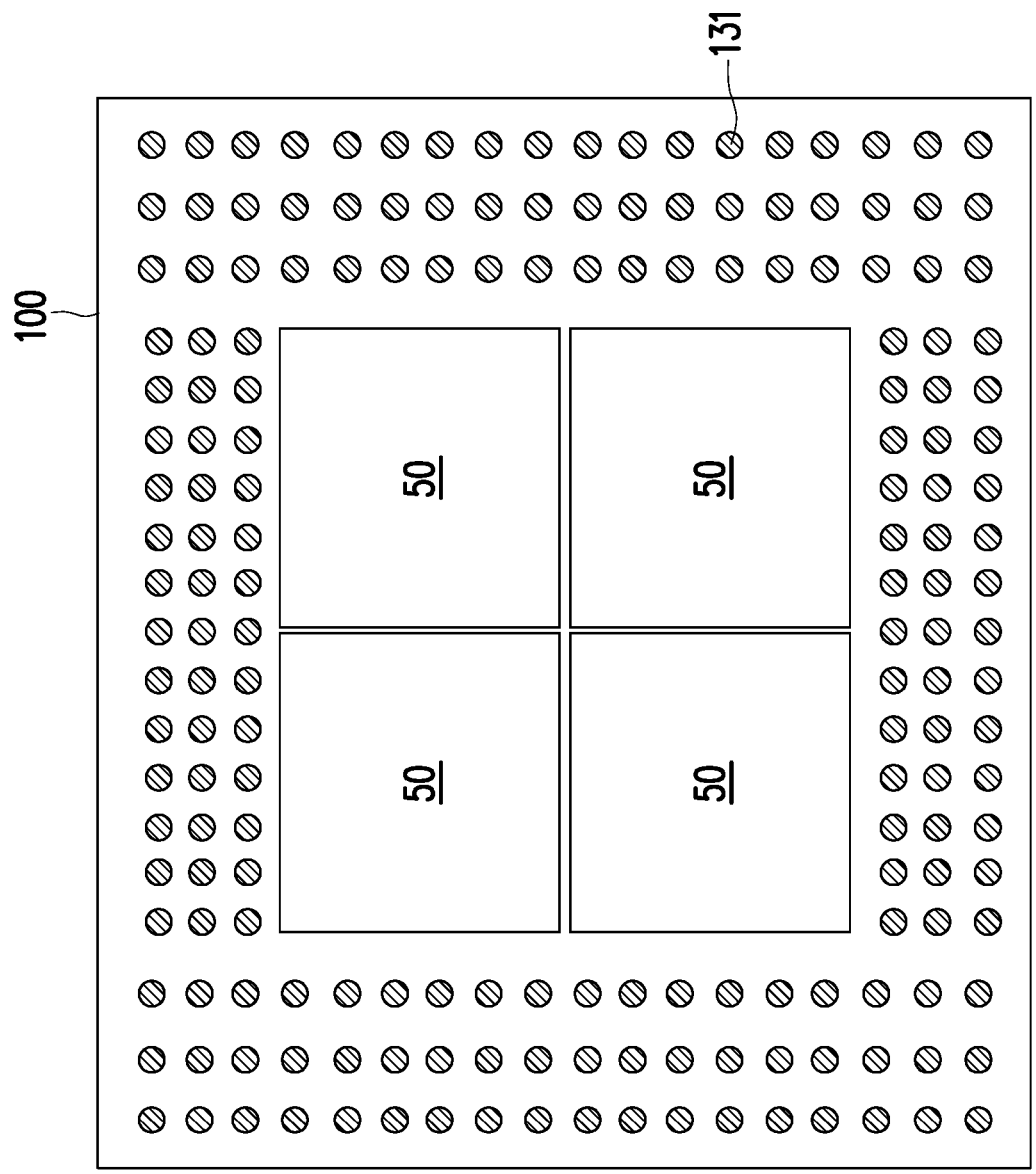

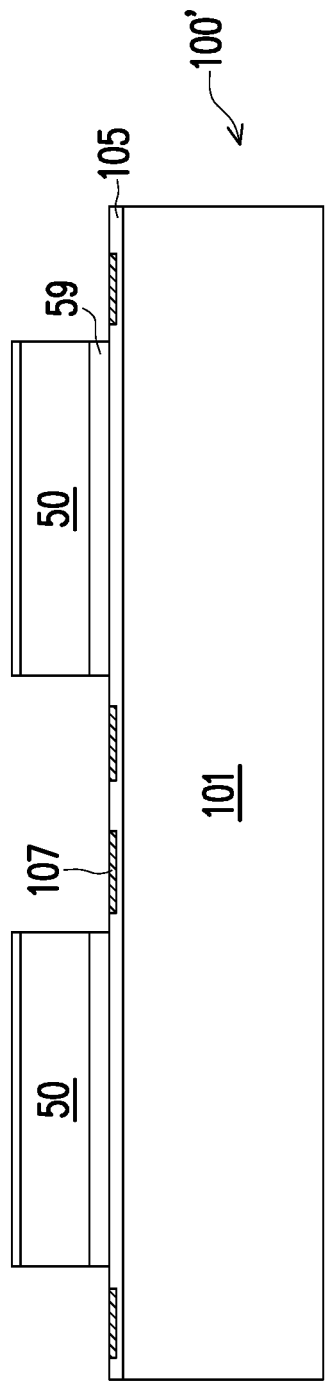
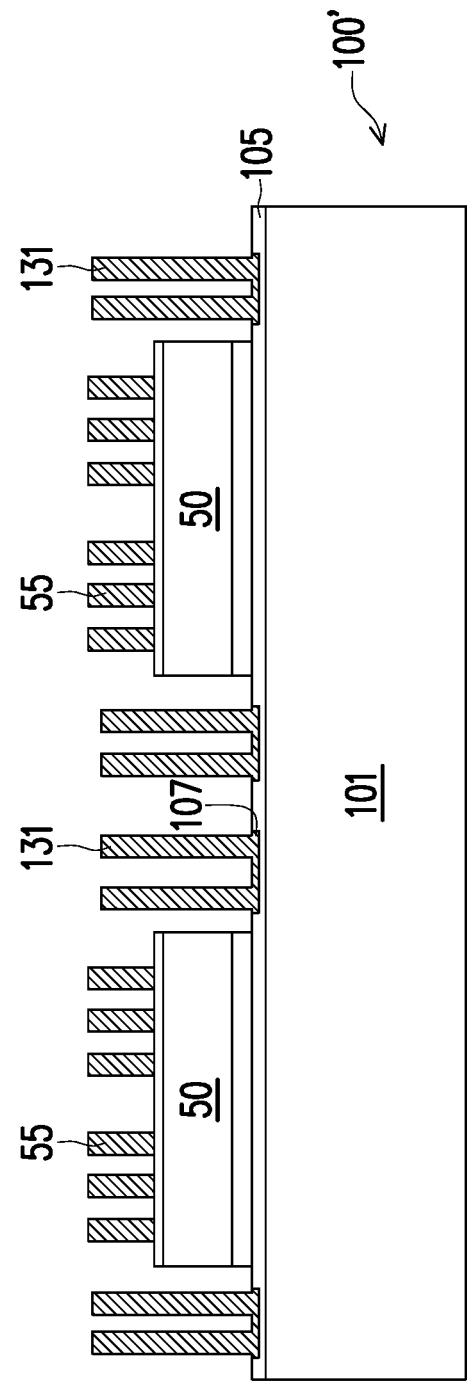

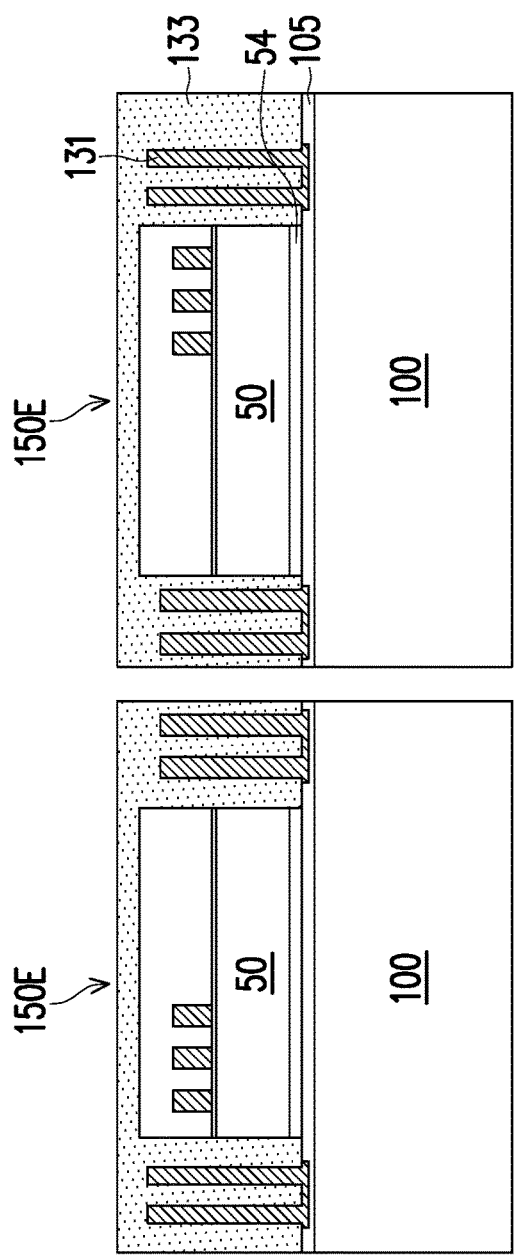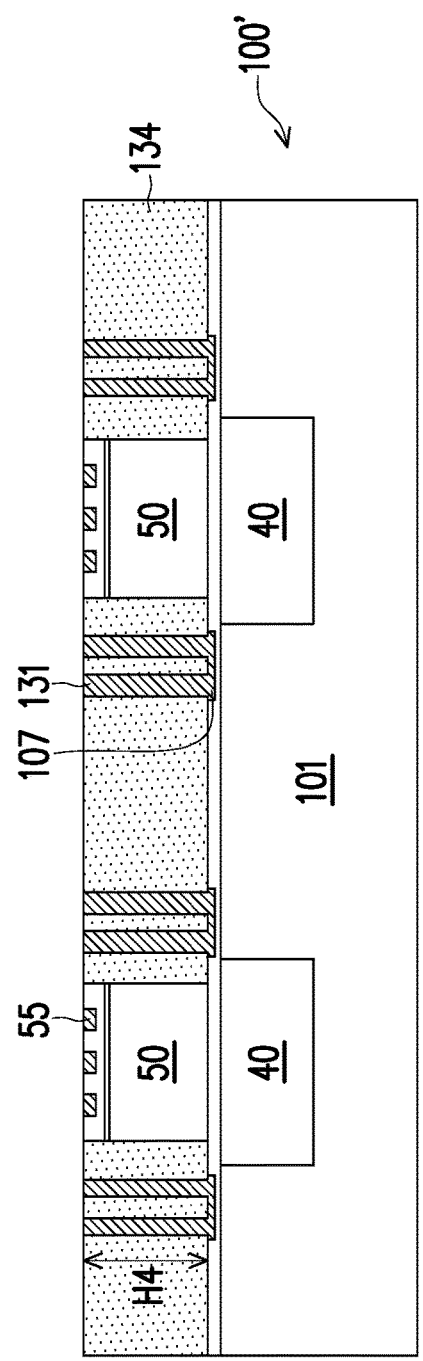

US 10,867,929 B2

SEMICONDUCTOR STRUCTURES AND METHODS OF FORMING THE SAME

PRIORITY CLAIM AND CROSS-REFERENCE

This application claims priority to U.S. Provisional Patent Application No. 62/775,700, filed Dec. 5, 2018, entitled "Semiconductor Structures and Methods of Forming the Same," which application is hereby incorporated by reference in its entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. Another example is a Chip-On-Wafer-On-Substrate (CoWoS) structure, where a semiconductor chip is attached to a wafer (e.g., an interposer) to form a Chip-On-Wafer (CoW) structure. The CoW structure is then attached to a substrate (e.g., a printed circuit board) to form a CoWoS structure. These and other advanced packaging technologies enable production of semiconductor devices with enhanced functionalities and small footprints.

Integrated Fan Out (InFO) package technology is becoming increasingly popular, particularly when combined with Wafer Level Packaging (WLP) technology. Package structures using InFO package technology provide for high functional density with relatively low cost and high performance packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 20A and 20B illustrate cross-sectional views of a semiconductor structure, in accordance with an embodiment.

FIGS. 21-27 illustrate cross-sectional views of a System on Integrated Chips (SoIC) at various stages of fabrication, in accordance with an embodiment.

FIGS. 28-33 illustrate cross-sectional views of a System on Integrated Chips (SoIC) at various stages of fabrication, in accordance with an embodiment.

FIGS. 34-36, 37A, 37B, and 38-42 illustrate cross-sectional views of a semiconductor structure at various stages of fabrication, in accordance with an embodiment.

DETAILED DESCRIPTION

Figure 2:
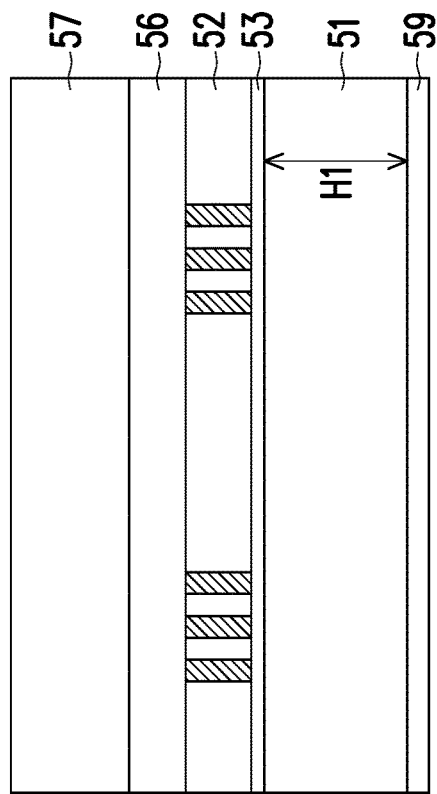
FIGS. 1-3 illustrate a process to form a plurality of dies, in accordance with an embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Throughout the description herein, unless otherwise specified, the same reference numeral in different figures refer to the same or similar component formed by a same or similar formation method using a same or similar materials(s).

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming a stacking semiconductor structure with fine pitch between conductive lines and good heat dissipation for high performance applications such as Field-Programmable Gate Array (FPGA), Graphics Processing Unit (GPU), memory device, and the like. In some embodiments, to form a System on Integrated Chips (SoIC), the backside of a top die is bonded to the front side of a bottom die through a fusion bonding process. Conductive pillars are formed on bonding pads of the bottom die at the front side of the bottom die and adjacent to the top die. A dielectric material is formed on the front side of the bottom die around the top die and around the conductive pillars. A redistribution structure is then formed over the dielectric material. The SoIC may be integrated to form different semiconductor packages, such as packages with a Chip-On-Wafer-On-Substrate (CoWoS) structure, or Integrated Fan-Out (InFO) packages.

Figure 1:
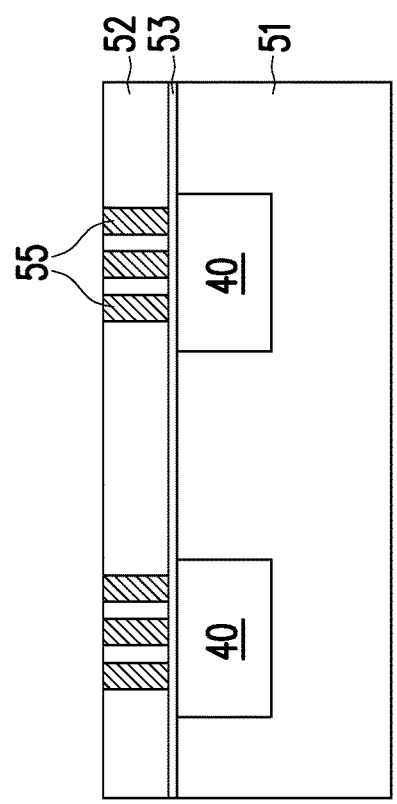
Figure 3:
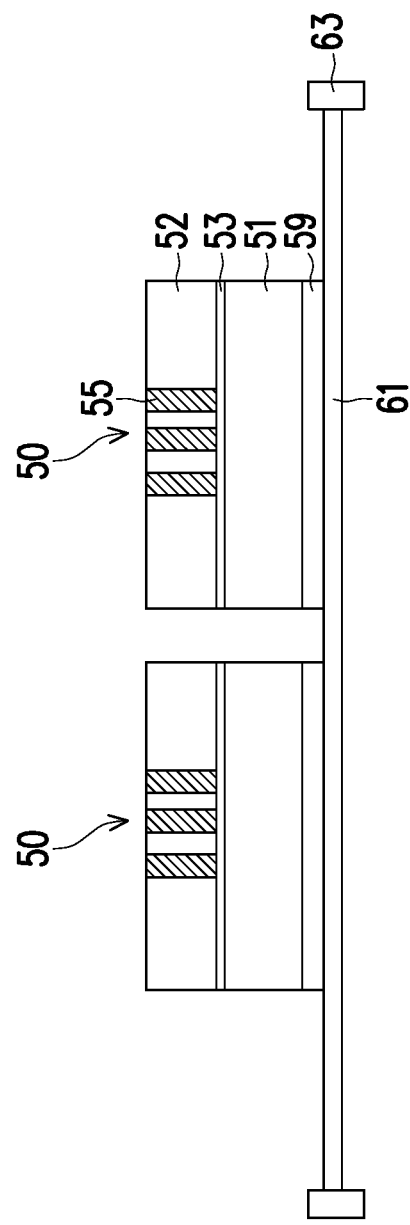

FIGS. 1-3 illustrate a process to form top dies 50, which top dies 50 may be attached to bottom dies 100 to form System on Integrated Chips (SoIC) (see, e.g., integrated circuit device 150 in FIG. 11) in subsequently processing. Referring first to FIG. 1, device regions 40 are formed in or on the substrate 51 (e.g., a wafer). Electrical components in each of the device regions 40 are interconnected to form functional circuits of a respective top die, and a subsequent dicing process will singulate the substrate 51 to form a plurality of top dies 50, as discussed hereinafter.

The substrate 51 may be a semiconductor substrate, such as silicon, doped or undoped, or an active layer of a semiconductor-on-insulator (SOI) substrate. The substrate 51 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, or the like, may be formed in and/or on the substrate 51 (e.g., formed in device regions 40) and may be interconnected by metallization layers 53 to form functional circuits. The metallization layers 53 may include metallization patterns (e.g., metal lines and vias) formed in one or more dielectric layers over the substrate 51, using suitable formation methods such as deposition, damascene, dual-damascene, the like, or combinations thereof. Note that for simplicity, the device regions 40 may not be illustrated in subsequent figures.

A first passivation layer (not shown) may be formed over the metallization layers 53 in order to provide protection for the underlying structures. The first passivation layer may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The first passivation layer may be formed through a process such as chemical vapor deposition (CVD), although any suitable process may be utilized.

Conductive pads (e.g., aluminum pads, not shown) may be formed over and in electrical contact with the metallization layers 53. The conductive pads may extend through the first passivation layer to electrically couple to the metallization layers 53. The conductive pads may comprise aluminum, but other materials, such as copper, may alternatively be used. The conductive pads may be formed using a deposition process, such as sputtering, to form a layer of material and portions of the layer of material may then be removed through a suitable process (such as photolithographic masking and etching) to form the conductive pads. However, any other suitable process may be utilized to form the conductive pads.

A second passivation layer 52, which comprises a suitable dielectric material, is formed over the first passivation layer. The second passivation layer 52 may be a polymer such as polybenzoxazole (PBO), polyimide (PI), low-temperature polyimide (LPTI), benzocyclobutene (BCB), or the like, and may be formed by spin coating, lamination, chemical vapor deposition (CVD), or the like. Die connectors 55 are formed which extend through the second passivation layer 52 to electrically couple to the respective conductive pads. The die connectors 55 may be conductive pillars such as copper pillars, and may be formed by, e.g., plating, or the like.

In some embodiments, after the die connectors 55 are formed, the plurality of top dies 50 in the substrate 51 are tested by a circuit probing process through the die connectors 55 to identify known good dies (KGDs). The known good dies are used to form the SoICs 150 in subsequent processing.

Next, in FIG. 2, the second passivation layer 52 is attached to a carrier 57 through an adhesive layer 56. The carrier 57 may be made of a material such as glass, silicon, polymer, polymer composite, metal foil, ceramic, glass epoxy, beryllium oxide, tape, or other suitable material for structural support. The adhesive layer 56 is deposited or laminated over the carrier 57, in some embodiments. In some embodiments, the adhesive layer 56 is a Die Attaching Film (DAF).

Next, a thinning process is performed to reduce a thickness of the substrate 51. The thinning process is performed from a backside (e.g., the lower side of the substrate 51 in FIG. 2) of the substrate 51 using a grinding process and/or a chemical mechanical planarization (CMP) process. In some embodiments, the thickness of the substrate is reduced from, e.g., about 780 µm, to a thickness $H_1$ between about 1 µm and about 100 µm, such as about 40 µm.

Next, an optional nitride layer 59, such as a silicon nitride layer, is formed over the backside of the substrate 51. The nitride layer 59 may be formed using a low-temperature deposition process and may be referred to as a low-temperature silicon nitride layer. After being deposited, the nitride layer 59 may be planarized, e.g., by a CMP process. In some embodiments, the nitride layer 59 is omitted. The nitride layer 59 may be used to form a stronger bond between, e.g., the top die 50 and a bottom wafer 100' (see FIG. 10) in a subsequent fusion bonding process.

Next, in FIG. 3, the structure illustrated in FIG. 2 is attached to a dicing tape 61 supported by a frame 63 (e.g., a metal frame), and the carrier 57 is removed by a carrier de-bonding process. After the carrier 57 is de-bonded, a cleaning process (e.g., a DAF cleaning process) may be performed to remove remaining portions of the adhesive layer 56. Next, a dicing process is performed to singulate the substrate 51, and a plurality of top dies 50 are formed. The upper side of the top die 50 in FIG. 3, where the die connectors 55 are formed, is referred to as the front side of the top die 50, and the lower side of the top die 50 in FIG. 3 is referred to as the backside of the top die 50.

Figure 4:
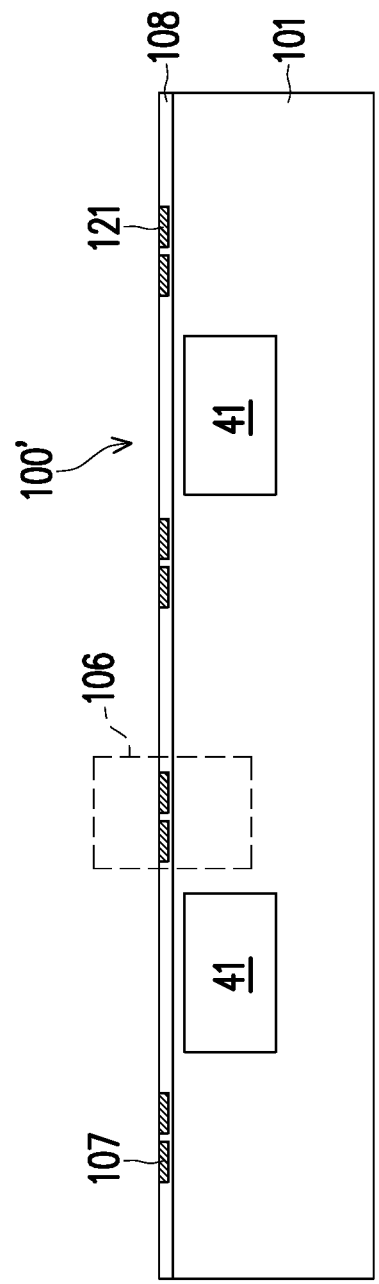
FIGS. 4-7 illustrate a circuit probing process to test a bottom wafer, in accordance with an embodiment.
Figure 11:
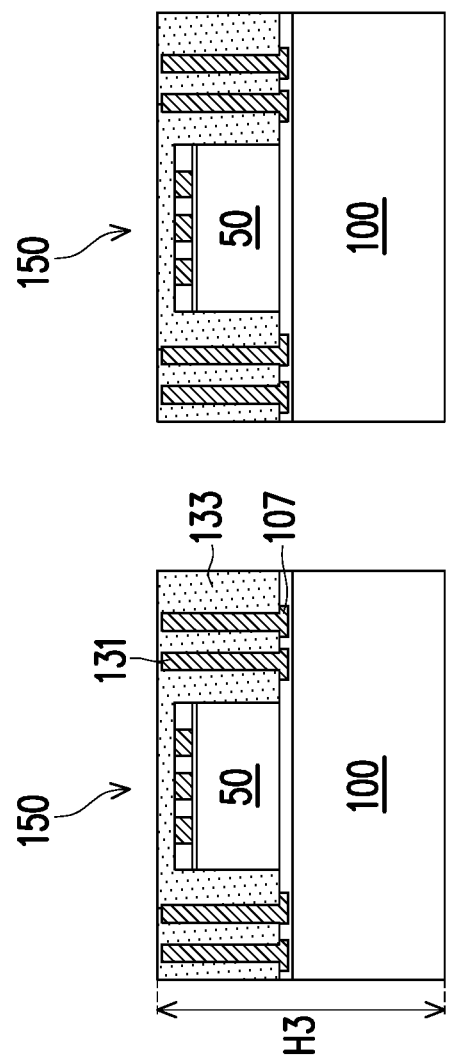

FIGS. 4-7 illustrate a circuit probing process to test a bottom wafer 100', which the bottom wafer 100', after the circuit probing process, will be singulated in subsequent processing to form a plurality of bottom dies 100 used in forming SoICs (see, e.g., FIG. 11). Referring to FIG. 4, the bottom wafer 100' is provided, which includes a substrate 101, device regions 41 (same as or similar to the device regions 40 in FIG. 1), and metallization layers 108 over the front side of the substrate 101. FIG. 4 further illustrates disposable probing pads 121 over the metallization layers 108. Note that for simplicity, not all features of the bottom wafer 100' are illustrated in FIG. 4, and the device regions 41 may not be illustrated in subsequent figures.

Figure 5:
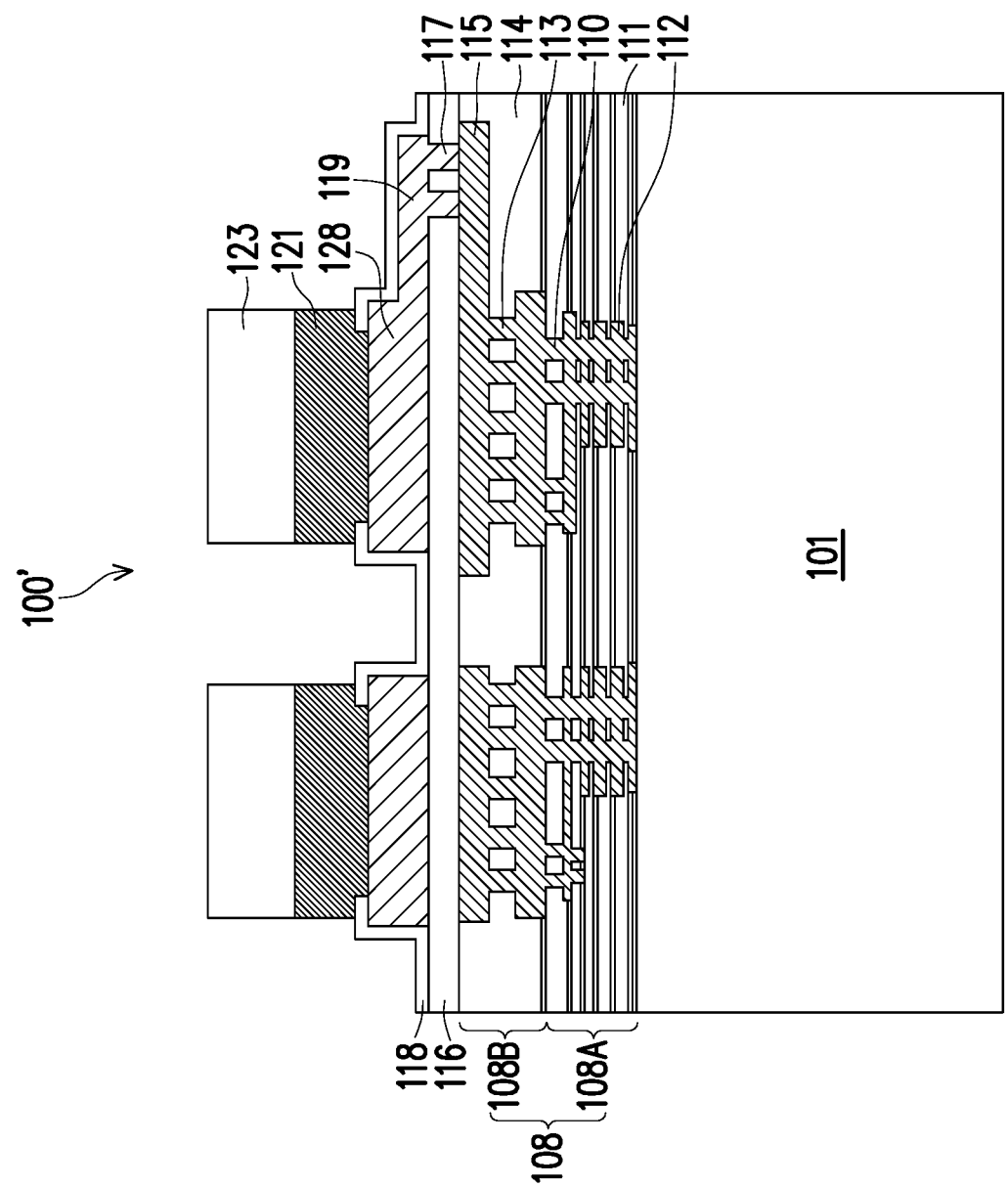

FIG. 5 illustrates a zoomed-in view of a portion 106 of the bottom wafer 100' of FIG. 4. As illustrated in FIG. 5, the bottom wafer 100' includes the substrate 101, the metallization layers 108, a first passivation layer 116, a second passivation layer 118, conductive pads 128, redistribution lines 119 and redistribution vias 117. In addition, FIG. 5 illustrates disposable probing pads 121 over and electrically coupled to respective conductive pads 128, and solder caps 123 on the disposable probing pads 121.

In the example of FIG. 5, the metallization layers 108 include lower metallization layers 108A and upper metallization layers 108B. The lower metallization layers 108A includes a plurality of dielectric layers 111 formed of, e.g., extreme low-K (ELK) material, and electrically conductive features (e.g., metal lines 112, vias 110) formed in the dielectric layers 111. The upper metallization layers 108B includes a plurality of dielectric layers 114 formed of, e.g., un-doped silicate glass (USG), and electrically conductive features (e.g., metal lines 115, vias 113) formed in the dielectric layers 114. In some embodiments, the dimensions (e.g., thicknesses and/or widths of the metal lines/vias, or spacing between adjacent metal lines or vias) of the electrically conducive features (e.g., lines, vias) in the upper metallization layers 108B are larger than the corresponding dimensions of the electrically conducive features in the lower metallization layers 108A. Formation methods of the metallization layers 108, the first passivation layer 116, the second passivation layer 118, and the conductive pads 128 are the same or similar to those of the top dies 50, thus details are not repeated.

As illustrated in FIG. 5, redistribution lines 119 (e.g., metal lines) are formed over the first passivation layer 116 and connected to the conductive pads 128 (e.g., aluminum pads). The redistribution lines 119 re-route electrical signals at the conductive pads 128 to different locations, and are electrically couple to, e.g., a topmost metal feature (e.g., 115) of the metallization layers 108 through redistribution vias 117. As shown in FIG. 5, the redistribution via 117 extends through the first passivation layer 116 and electrically couples the redistribution line 119 to the metallization layer 108. The disposable probing pads 121 may be copper pillars that extend through the second passivation layer 118 to electrically couple to the respective conductive pads 128.

In some embodiments, the second passivation layer 118 is a silicon nitride layer with a thickness of about 1000 angstroms, the conductive pads 128 are aluminum pads with thicknesses (measured a direction perpendicular to the upper surface of the substrate 101) between about 0.5 µm and about 5 µm, such as 2.8 µm. The disposable probing pads 121 are copper pillars with thicknesses between about 0.5 µm and about 10 µm, such as 1 µm, and the solder caps 123 (e.g., lead-free solder regions) have thicknesses between about 1 µm and about 20 µm, such as 2 µm.

In some embodiments, a circuit probing process is performed to test the functions of the dies in the bottom wafer 100' to identify the known good dies. The circuit probing process is performed through the disposable probing pads 121. The identified known good dies in the bottom wafer 100' will be used to form the SoICs.

Figure 6:
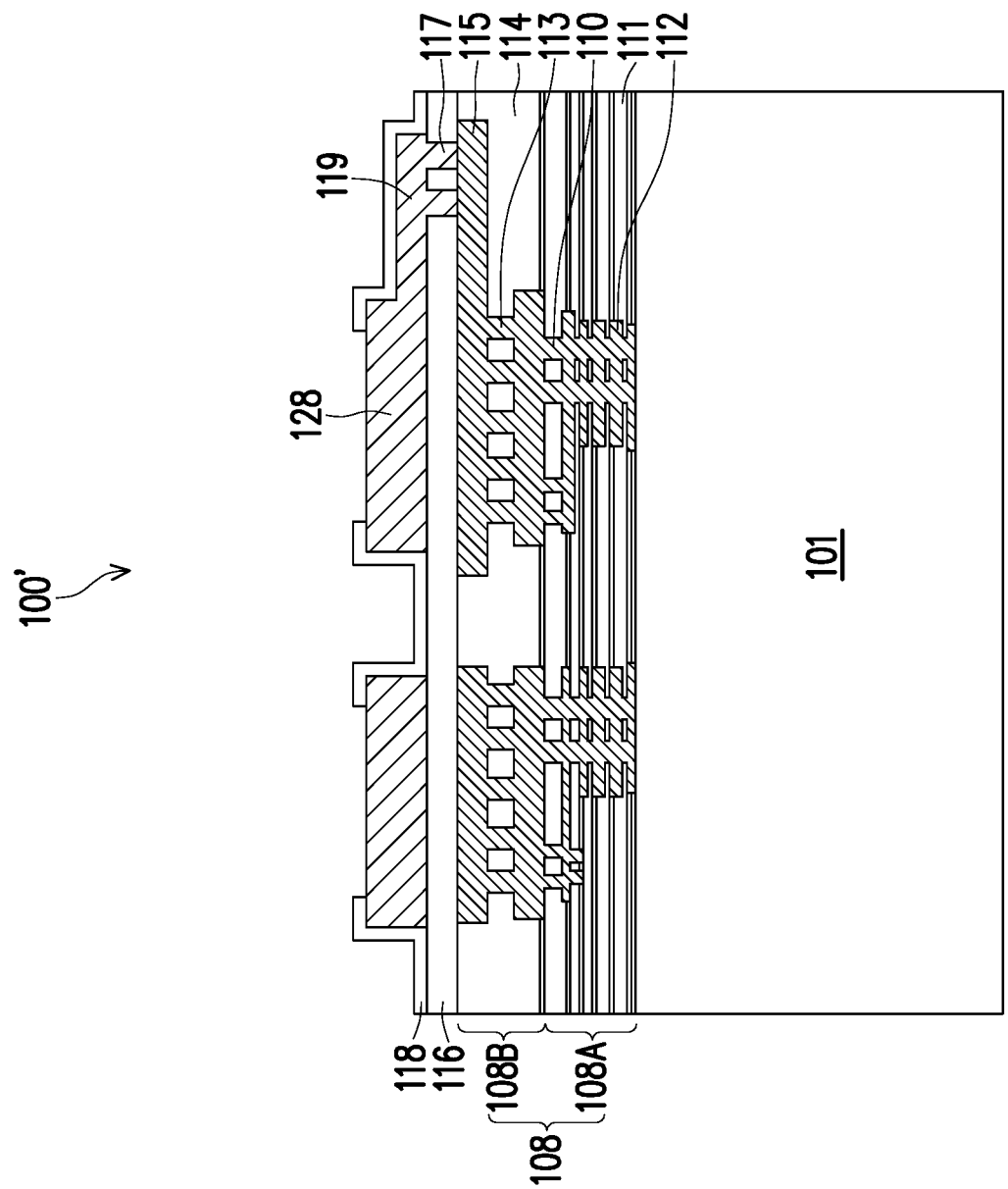

Next, in FIG. 6, after the circuit probing process for the bottom wafer 100' is finished, the disposable probing pads 121 and the solder caps 123 are remove, and the conductive pads 128 are exposed. For example, a wet etch process using sulfuric acid (e.g., $H_2SO_4$) may be performed to remove the disposable probing pads 121 and the solder caps 123.

Figure 7:
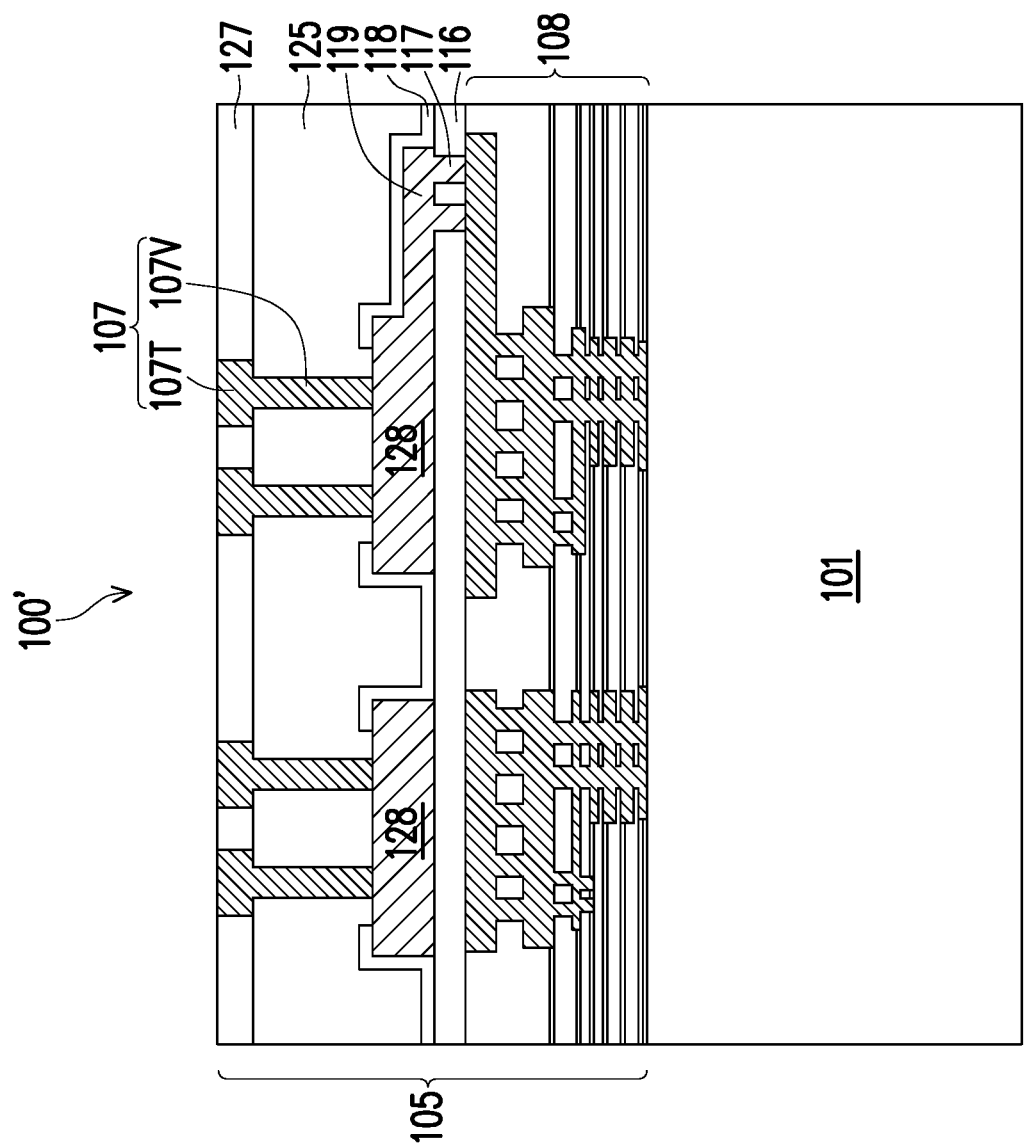

Next, in FIG. 7, one or more dielectric layers (e.g., 125 and 127) are formed over the second passivation layer 118 and over the conductive pads 128. The dielectric layer 125 is formed of an oxide, such as tetraethyl orthosilicate (TEOS), as an example. The dielectric layer 127 is formed of a same material (e.g., an oxide) as the dielectric layer 125, in some embodiments. In other embodiments, the dielectric layer 127 is formed of a different dielectric material than the dielectric layer 125. For example, the dielectric layer 127 may be formed of an oxide different from the dielectric layer 125, such as USG or a high density plasma (HDP) chemical vapor deposition oxide. Planarization processes, such as CMP, may be performed to planarize the deposited dielectric layers 125/127.

Next, bonding pads 107 are formed in the dielectric layers 127/125. Each of the bonding pads 107 in FIG. 7 includes a bonding pad metal (BPM) 107T and a bonding pad via (BPV) 107V. The bonding pads 107 are formed of an electrically conductive material such as copper using, e.g., a dual-damascene process. As illustrated in FIG. 7, the bonding pads 107 extend from an upper surface of the dielectric layer 127 to the conductive pads 128. An upper surface of the bonding pad 107 is level with the upper surface of the dielectric layer 127, and a lower surface of the bonding pad 107 contacts the conductive pad 128. In subsequent processing, conductive pillars 131 (see FIG. 10) are formed on the bonding pads 107 to electrically couple to the metallization layers 108. The metallization layers 108 and the structures over the metallization layers 108 in FIG. 7, such as the first passivation layer 116, the second passivation layer 118, the conductive pads 128, the redistribution lines 119, the redistribution vias 117, the dielectric layers 125/127, and the bonding pads 107 may be collectively referred to as an interconnect structure 105.

In some embodiments, a height (measured along a direction perpendicular to the upper surface of the substrate 101) of the bonding pad metal 107T is between about 0.1 µm and about 2 µm, such as 0.85 µm, and a height of the bonding pad via 107V is between about 0.5 µm and about 5 µm, such as 2.4 µm.

Figure 8:
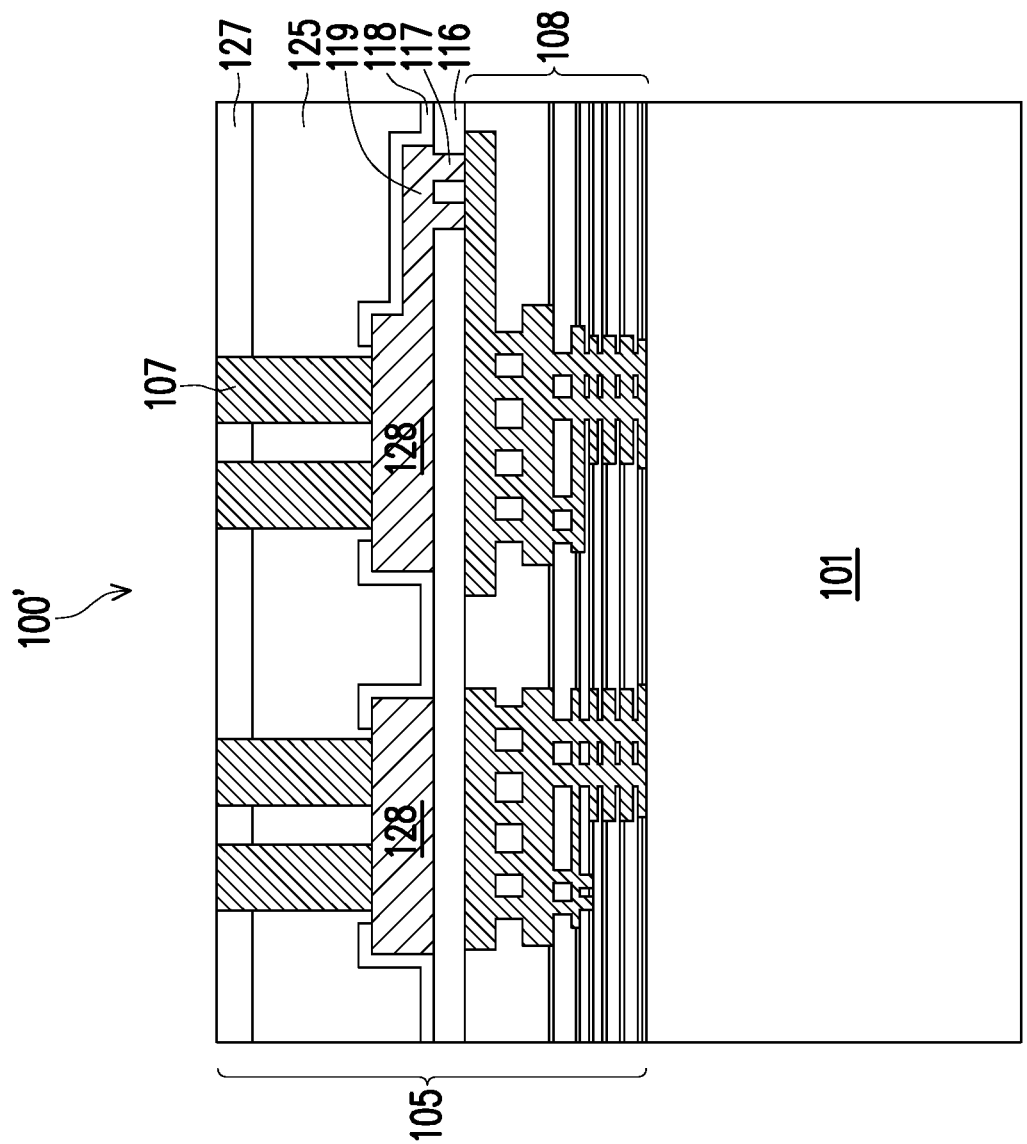
FIGS. 8 and 9 illustrate additional embodiments of the bottom wafer.

FIG. 8 illustrates another embodiment of the bonding pads 107, where each of the bonding pads 107 has a substantially uniform width between the top surface and the bottom surface of the bonding pads 107. The bonding pads 107 in FIG. 8 may be formed by a single damascene process.

Figure 9:
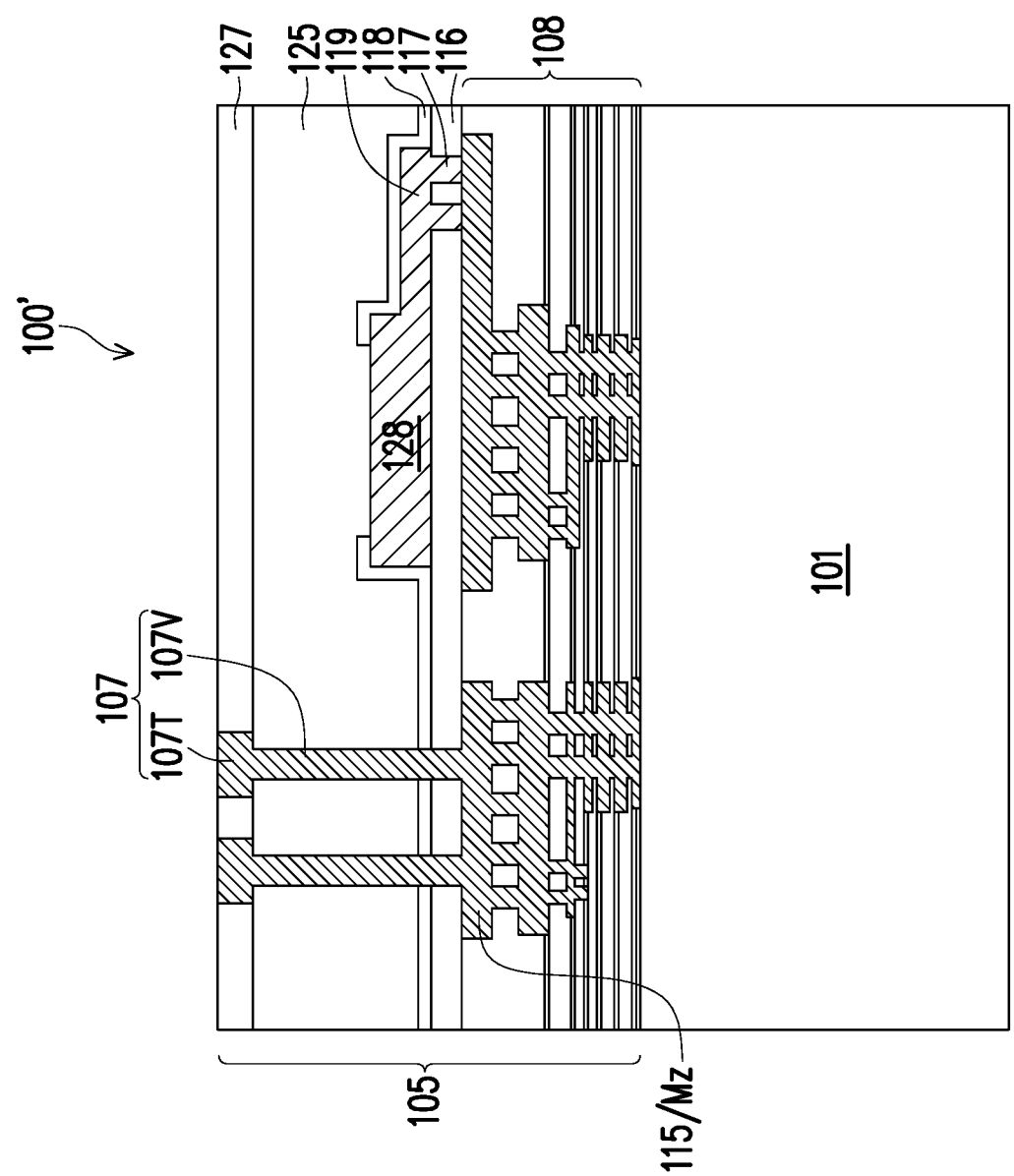

FIG. 9 illustrates yet another embodiment of the bonding pads 107. The bonding pads 107 in FIG. 9 are similar to those of FIG. 7, but the bonding pads 107 in FIG. 9 are directly coupled to a top metal layer Mz (e.g., a topmost metal layer) in the metallization layers 108. In other words, while the bonding pads 107 in FIGS. 7 and 8 are directly coupled to the conductive pads 128, the bonding pads 107 in FIG. 9 are directly coupled to the top metal layer Mz of the metallization layers 108. Since the bonding pads 107 in FIG. 9 extend deeper beneath the dielectric layer 127, a height (measured along a direction perpendicular to the upper surface of the substrate 101) of the bonding pad via 107V in FIG. 9 may be larger than that of FIG. 7, such as having a value of about 6 µm.

Note that FIGS. 7-9 illustrate a portion of the bottom wafer 100' where bonding pads 107 are formed at the upper surface of the bottom wafer 100'. The upper surface of the bottom wafer 100' has other regions where the bonding pads 107 are not formed. In subsequent processing, the top dies 50 will be bonded to regions of the upper surface of the bottom wafer 100' without bonding pads 107 through a fusion bonding process, in some embodiments.

FIGS. 10-17 illustrate cross-sectional views of a semiconductor package 500 (see FIG. 17) at various stages of fabrication, in accordance with an embodiment. The semiconductor package 500 has a Package-on-Package (PoP) structure, and includes a top package 520 attached to a bottom package 510. The bottom package 510 is an Integrated Fan-Out (InFO) package with a System on Integrated Chips (SoIC) 150 (see FIG. 11) integrated. Details are discussed hereinafter.

Figure 10:
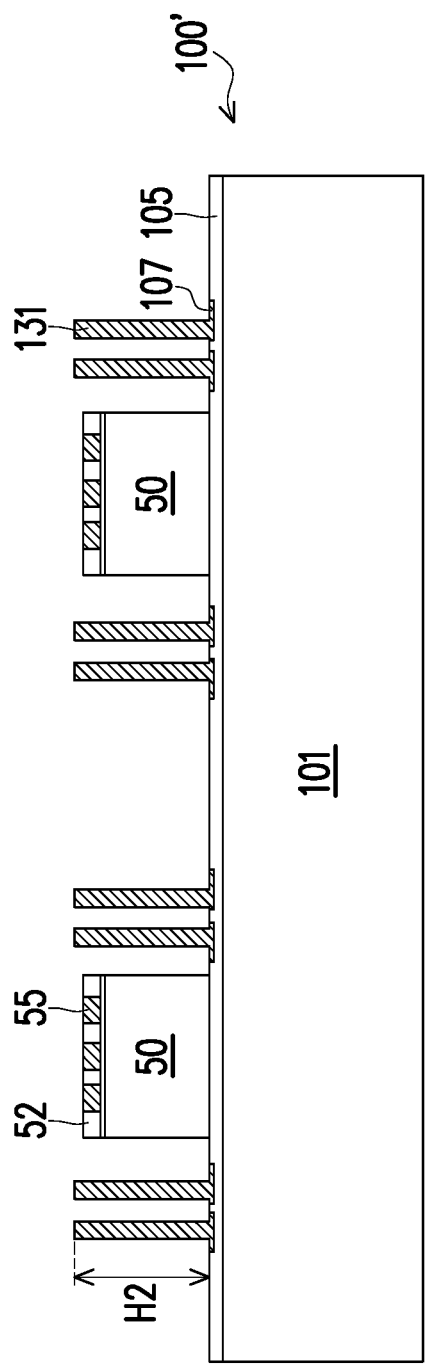
FIGS. 10-17 illustrate cross-sectional views of a semiconductor structure at various stages of fabrication, in accordance with an embodiment.

Referring to FIG. 10, a plurality of top dies 50, such as the known good dies 50 from FIG. 3, are attached to the front side of the bottom wafer 100', such as those illustrated in FIGS. 7-9, by a fusion bonding process. In the illustrated embodiment, the backsides of the top dies 50 are bonded to the topmost dielectric layer (e.g., 127) of the bottom wafer 100' in regions without the bonding pads 107 by a fusion bonding process, where the topmost dielectric layer (e.g., 127) is an oxide layer such as a silicon oxide layer. In some embodiments, before the fusion bonding process, a mechanical stress is applied to press the top dies 50 and the bottom wafer 100' together. Next, the fusion bonding process is performed by heating the top dies 50 and the bottom wafer 100' to a temperature between about 200° C. and about 500° C. A pressure of the fusion bonding chamber (where the top dies 50 and the bottom wafer 100' are in during the fusion bonding process) may be between about 0.1 torr and about 100 torr.

Recall that in FIG. 2, a nitride layer 59 (e.g., a silicon nitride layer) may be formed on the backsides of top dies 50. In embodiments where the nitride layer 59 is formed on the backsides of the top dies 50, the fusion bonding process forms bonds between the nitride layer 59 and the topmost dielectric layer (e.g., a silicon oxide layer) of the bottom wafer 100'. In embodiments where the nitride layer 59 is omitted, the fusion bonding process forms bonds between the material (e.g., silicon) of the substrate of the top die 50 and the topmost dielectric layer (e.g., a silicon oxide layer) of the bottom wafer 100'. In some embodiments, the bonds between silicon nitride and silicon oxide is stronger than the bonds between silicon and silicon oxide, and therefore, forming the nitride layer 59 on the backsides of the top dies 50 provides stronger bonding between the top dies 50 and the bottom wafer 100'.

Still referring to FIG. 10, after the top dies 50 are bonded to the bottom wafer 100', conductive pillars 131 are formed on the bonding pads 107 of the bottom wafer. The conductive pillars 131 may be formed by forming a patterned mask layer (e.g., a patterned photoresist) with openings over the bottom wafer 100', where locations of the openings correspond to locations of the conductive pillars 131 to be formed, and the openings expose the underlying bonding pad 107. Next, an electrical conductive material, such as copper, is formed in the openings of the patterned mask layer by, e.g., a plating process. After the openings are filled with the electrically conductive material, the patterned mask layer (e.g., a patterned photoresist) is then removed using a suitable removal method, such as ashing. The conductive pillars 131 become vias after being surrounded by a dielectric material in subsequent processing.

In some embodiments, a height $H_2$ of the conductive pillar 131 is between about 10 μm and about 100 μm, such as about 30 μm. A width of the conductive pillar 131 is between about 10 μm and about 50 μm, such as about 30 μm, and a pitch between adjacent conductive pillars 131 is between about 20 μm and about 100 μm, such as about 70 μm.

Next, in FIG. 11, a dielectric material 133 is formed over the front side of the bottom wafer 100' around the conductive pillars 131 and around the top dies 50. The dielectric material 133 may be polyimide, a low-temperature polyimide, a molding material, or the like, and may be formed by, e.g., a coating process such as spin coating. After the dielectric material 133 is formed, a carrier is attached to the dielectric material 133, and the bottom wafer 100' is thinned from the backside by, e.g., a grinding process.

After the backside grinding process, the backside of the bottom wafer 100' is attached to a dicing tape, and a dicing process is performed to separate the bottom wafer 100' into bottom dies 100 and to form a plurality of integrated circuit devices 150. In an embodiment, the integrated circuit devices 150 are SoICs. Each of the SoICs 150 includes a bottom die 100, a top die 50 attached to the front side of the bottom die 100, conductive pillars 131 on the front side of the bottom die 100, and the dielectric material 133. Although FIG. 11 only shows two SoICs 150, the number of SoICs 150 formed after the dicing process may be any suitable number. In addition, the number of top dies 50 attached to the bottom die 100 and the structure of the SoIC 150 may be varied to have different structures, details of which are discussed hereinafter.

In the example of FIG. 11, the SoIC 150 includes a top die 50 and a bottom die 100, with the backside of the top die 50 attached to the front side of the bottom die 100. Therefore, the SoIC 150 is also referred to as having a back-to-face bonding scheme, or referred to as a back-to-face SoIC. The conductive pillars 131 are formed over the bonding pads 107. The conductive pillars 131 and the top die 50 are surrounded by the dielectric material 133, which is laterally conterminous with the bottom die 100. In other words, the sidewalls of the dielectric material 133 are aligned with respective sidewalls of the bottom die 100. In some embodiments, a height $H_3$ of the SoIC 150 is between about 100 μm and about 300 μm, such as about 180 μm.

Figure 12:
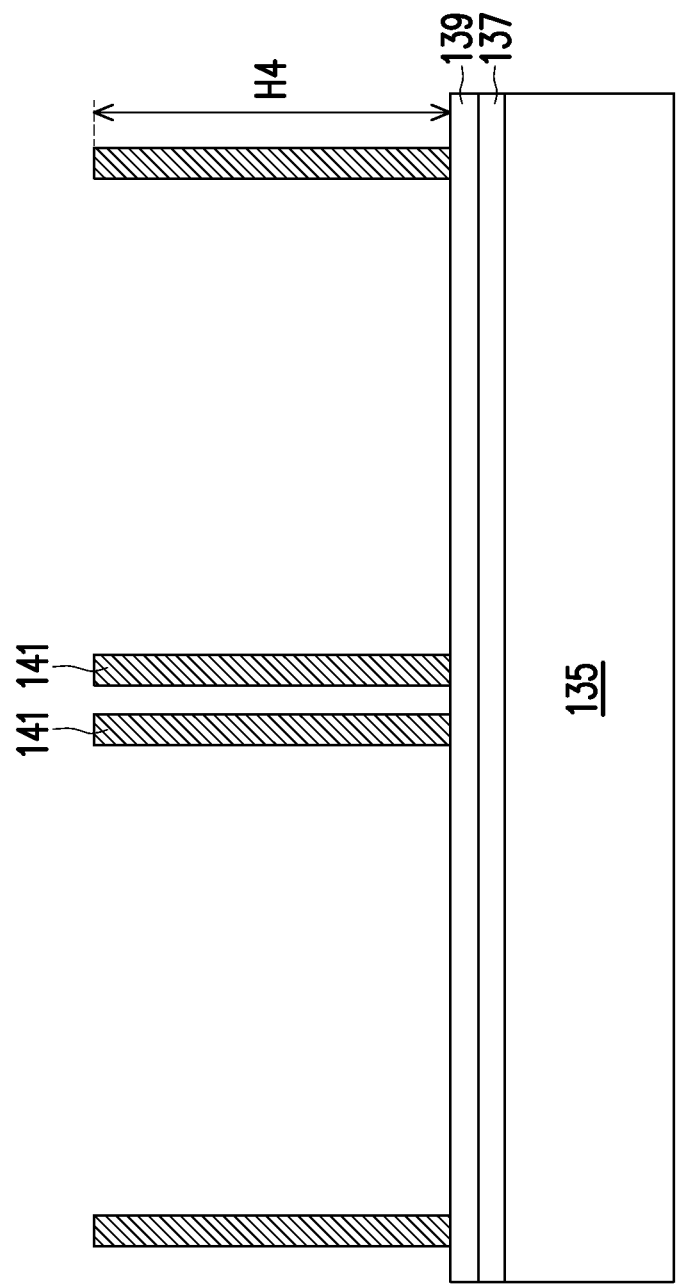

Next, in FIG. 12, an adhesive layer 137 and a backside dielectric layer 139 are formed successively over a carrier 135. The carrier 135 supports the semiconductor structure formed thereon, and may be made of a material such as silicon, polymer, polymer composite, metal foil, ceramic, glass, glass epoxy, beryllium oxide, tape, or other suitable material for structural support. In some embodiments, the carrier 135 is a glass carrier. The adhesive layer 137 is deposited or laminated over the carrier 135, in some embodiments. The adhesive layer 137 may be photosensitive, and could be easily detached from the carrier 135 by shining, e.g., an ultra-violet (UV) light on the carrier 135 in a subsequent carrier de-bonding process. For example, the adhesive layer 137 may be a light-to-heat-conversion (LTHC) coating made by 3M Company of St. Paul, Minn.

The backside dielectric layer 139 may function as a buffer layer, and may be made of a polymer, such as polyimide (PI), polybenzoxazole (PBO), or benzocyclobutene, in some embodiments. Any suitable methods known in the art, such as physical vapor deposition (PVD), chemical vapor deposition (CVD), printing, spin coating, spray coating, sintering, or the like, may be used to form the backside dielectric layer 139.

Next, a sacrificial material (not shown) is formed over the backside dielectric layer 139. The sacrificial material may comprise a photoresist, an organic material, an insulating material, or other materials, as examples, and may be formed by PVD, CVD, spin coating, or other suitable deposition techniques. The sacrificial material is patterned with patterns or openings for forming conductive pillars 141 using, e.g., a lithography process or a direct patterning process. Next, the openings in the sacrificial material are filled with electrically conductive material to form the conductive pillars 141. The conductive material may comprise copper (Cu), although other suitable conductive materials may also be used. In some embodiments, a plating process is used to form the conductive material in the openings of the sacrificial material. A seed layer may be formed before the plating process. The plating process may comprise an electro-chemical plating (ECP), electroless plating, or other types of plating processes, for example. After the plating process, the sacrificial material is stripped or removed, and the conductive pillars 141 are formed over the backside dielectric layer 139, as shown in FIG. 12. The conductive pillars 141 become vias after being surrounded by a molding material in subsequent processing. A height $H_4$ of the conductive pillars 141 may be between about 100 µm and about 300 µm, such as about 200 µm. A width of the conductive pillars 141 may be between about 50 µm and about 300 µm, such as about 190 µm, and a pitch between adjacent conductive pillars 141 may be between about 100 µm and about 400 µm, such as about 300 µm.

Figure 13:
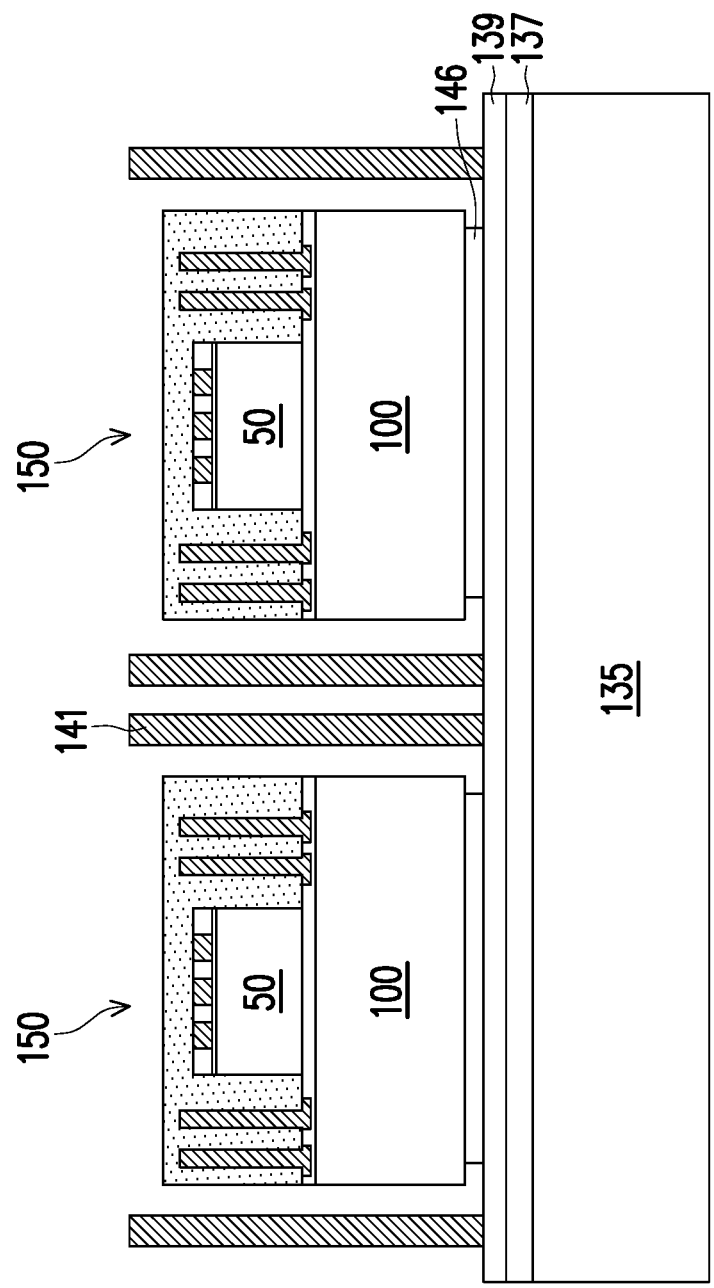

Next, in FIG. 13, a plurality of the SoICs 150, such as those formed after the processing of FIG. 11, are attached to the backside dielectric layer 139 using, e.g., an adhesive film 146 such as a DAF.

Figure 14:
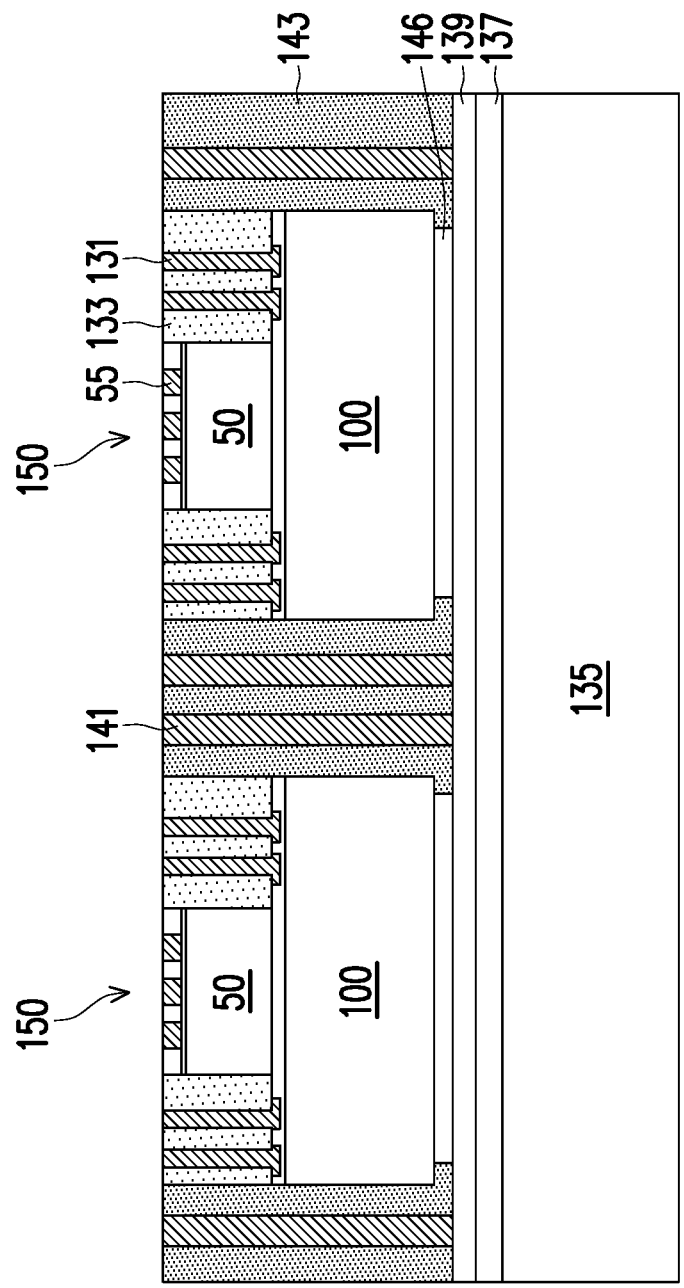

Next, in FIG. 14, a molding material 143 is disposed over the backside dielectric layer 139 and around the SoICs 150 and the conductive pillars 141. For example, in a top down view of the molding material 143, the molding material 143 may encircle the SoICs 150 and the conductive pillars 141. In the example of FIG. 14, the molding material 143 surrounds the SoICs 150 and contacts (e.g., physically contacts) sidewalls of the dielectric material 133.

The molding material 143 may include any suitable material such as an epoxy resin, a molding underfill, and the like. Suitable methods for forming the molding material 143 may include compressive molding, transfer molding, liquid encapsulant molding, or the like. After the molding material 143 is formed, a planarization process, such as CMP, may be performed to achieve a level upper surface for the molding material 143. After the planarization process, the conductive pillars 141, the conductive pillars 131, and the die connectors 55 are exposed at the upper surface of the molding material 143. The conductive pillars 141 become vias after being surrounded by the molding material 143.

Figure 15:
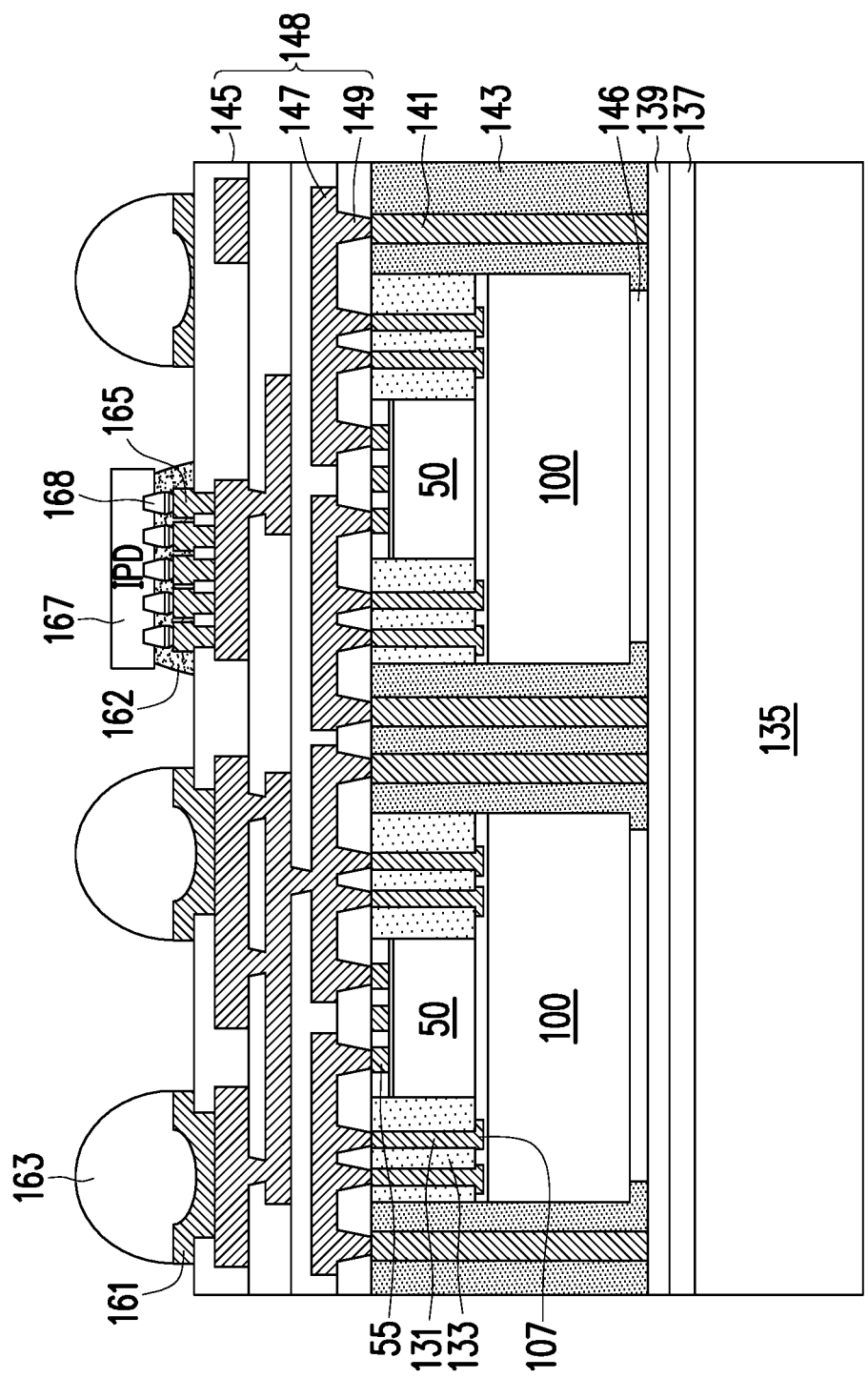

Next, in FIG. 15, a redistribution structure 148 is formed over the molding material 143 and electrically coupled to the conductive pillars 141, the conductive pillars 131, and the die connectors 55 of the top dies 50. The redistribution structure 148 comprises conductive features such as one or more layers of conductive lines 147 and vias 149 formed in one or more dielectric layers 145. In some embodiments, the one or more dielectric layers 145 are formed of a polymer, such as polybenzoxazole (PBO), polyimide, benzocyclobutene (BCB), or the like. The one or more dielectric layers 145 may be formed by any acceptable deposition process, such as spin coating, chemical vapor deposition (CVD), laminating, the like, or a combination thereof.

In some embodiments, the conductive features of the redistribution structure 148 comprise conductive lines 147 and vias 149 formed of a suitable conductive material such as copper, titanium, tungsten, aluminum, or the like. The conductive features may be formed by, e.g., forming openings in the dielectric layer 145 to expose underlying conductive features, forming a seed layer over the dielectric layer 145 and in the openings, forming a patterned photoresist with a designed pattern over the seed layer, plating (e.g., electroplating or electroless plating) the conductive material in the designed pattern and over the seed layer, and removing the photoresist and portions of seed layer on which the conductive material is not formed.

As illustrated in FIG. 15, communication between the top dies 50 and the bottom dies 100 goes through the redistribution structure 148. For example, an electrical signal from the bottom die 100 travels through the conductive pillar 131 to the redistribution structure 148, before going into the die connector 55 of the top die 50.

Still referring to FIG. 15, external connectors 163 (may also be referred to as conductive bumps) are formed over pads 161 that are electrically coupled to the conductive features of the redistribution structure 148. The external connectors 163 may be solder balls, such as Ball Grid Array (BGA) balls, Controlled Collapse Chip Connector (C4) bumps, micro-bumps, and the like. In some embodiments, one or more Integrated Passive Devices (IPDs) 167 are electrically coupled to micro-pads 165, which micro-pads 165 are electrically coupled to the conductive features of the redistribution structure 148. In the example of FIG. 15, connectors 168 of the IPD device 167 are bonded to the micro-pads 165 by, e.g., solder regions, and an underfill material 162 may fill a gap between the IPD device 167 and the redistribution structure 148. A wide variety of passive devices, such as baluns, couplers, splitters, filters and diplexers can be integrated in IPD devices. IPD devices may replace traditional discrete surface mount devices (SMDs) for smaller footprint, cost reduction, and performance improvement.

Figure 16:
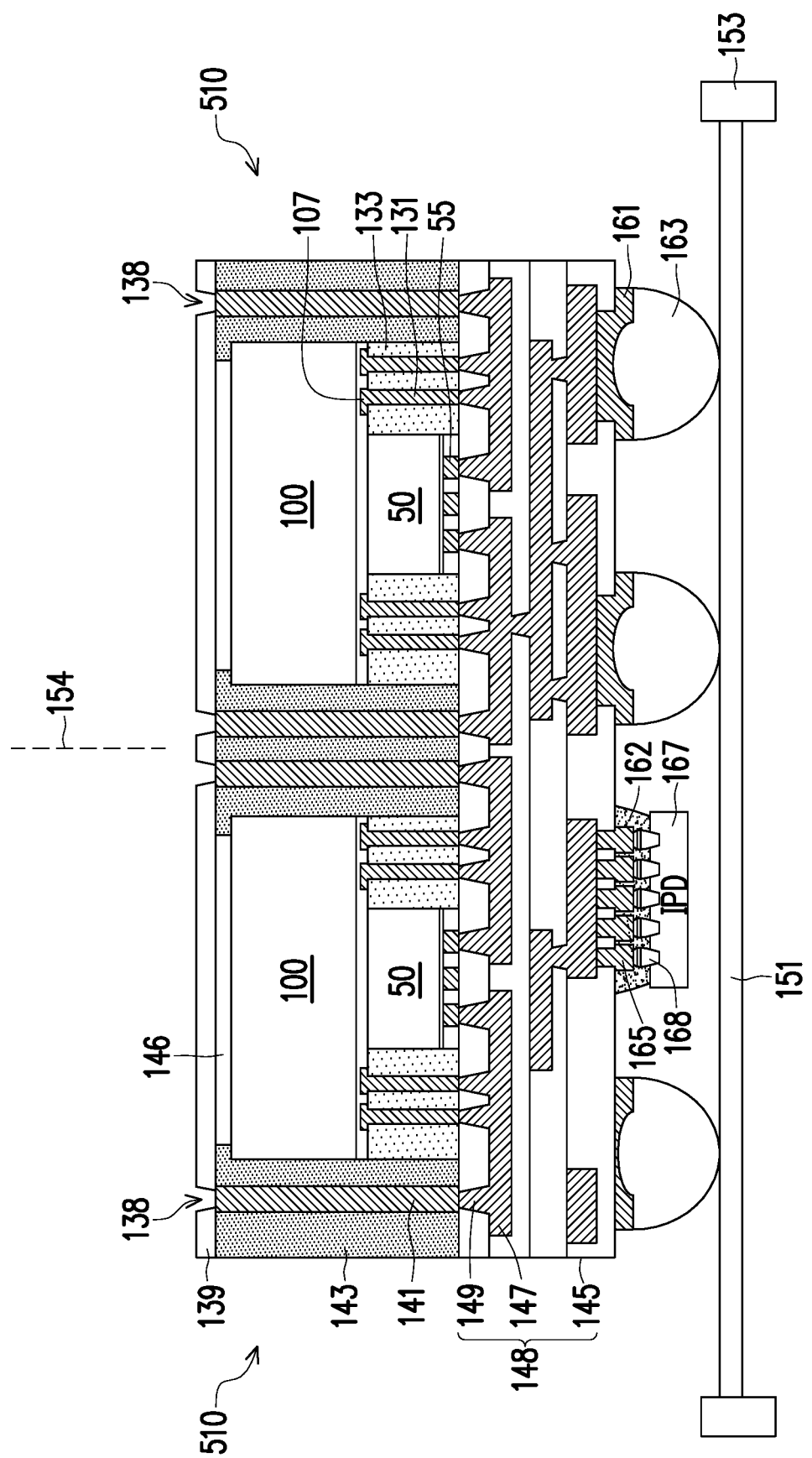

Next, in FIG. 16, the semiconductor structure illustrated in FIG. 15 is flipped over, and the external connectors 163 are attached to, e.g., a dicing tape 151 supported by a frame 153. Next, the carrier 135 is removed in a carrier de-bonding process. The carrier 135 may be de-bonded by chemical wet etching, plasma dry etching, mechanical peel-off, CMP, mechanical grinding, thermal bake, laser scanning, or wet stripping, as examples. In some embodiments, the carrier 135 is a glass carrier and is de-bonded by shining a UV light on the glass carrier. After the carrier de-bonding, openings 138 are formed in the backside dielectric layer 139 to expose the conductive pillars 141. The openings 138 may be formed by an etching process, a laser drilling process, or other suitable process. The semiconductor structure illustrated in FIG. 16 comprises a plurality of semiconductor packages 510. In subsequent processing, the semiconductor structure illustrated in FIG. 16 are diced along dicing lines 154 to form a plurality of individual semiconductor packages 510 (also referred to as bottom packages, see FIG. 17).

Figure 17:
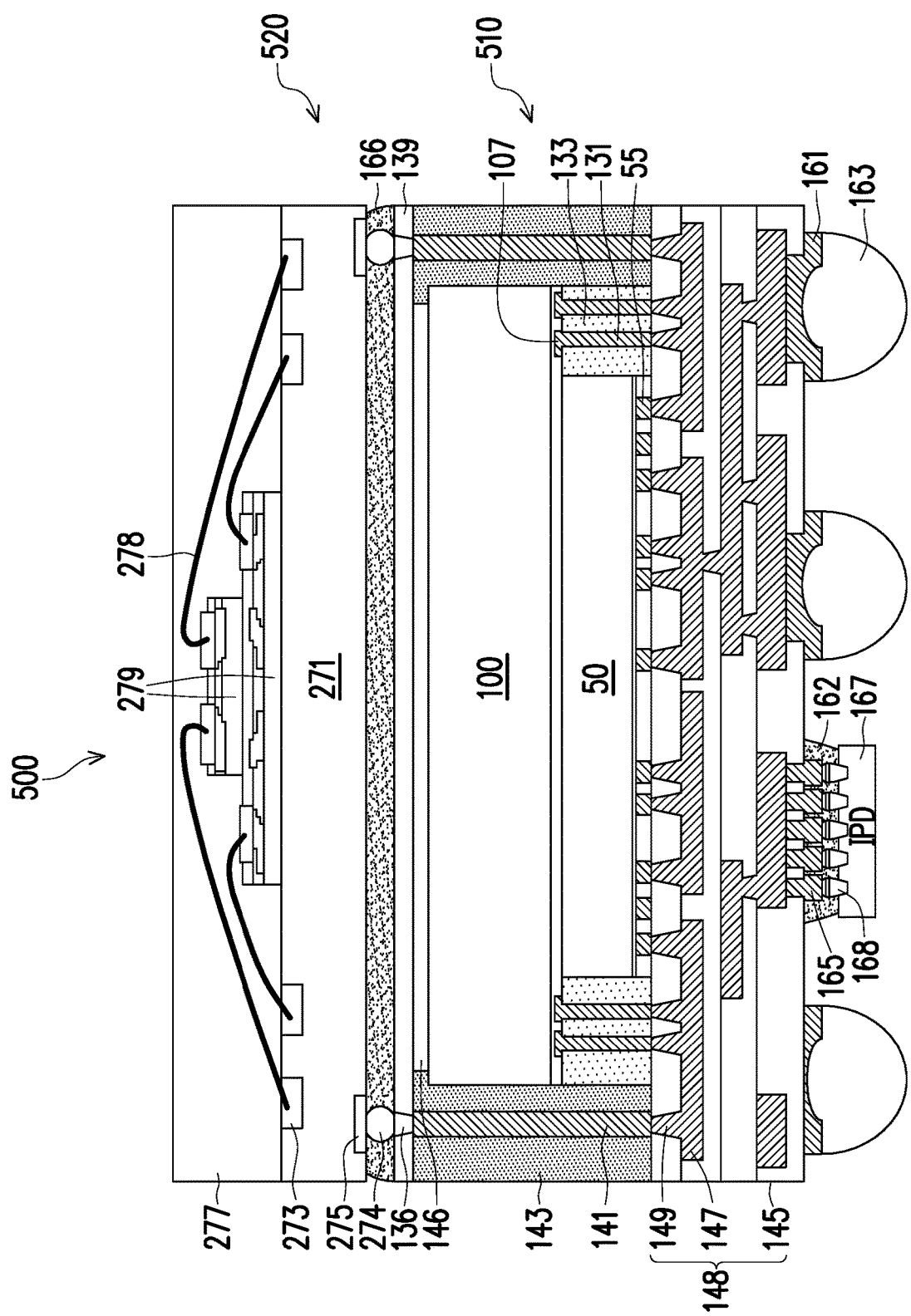

Next, in FIG. 17, a plurality of semiconductor packages 520 (also referred to as top packages) are attached to the semiconductor structure illustrated in FIG. 16. Each of the semiconductor packages 520 is aligned with a corresponding semiconductor packages 510 so that locations of external connectors 274 of the semiconductor packages 520 match locations of top surfaces of the conductive pillars 141. Each semiconductor package 520 may include one or more die 279 attached to a substrate 271, with molding compound 277 around the dies 279. The substrate 271 has conductive pads 273 and 275 on the upper surface and the lower surface of the substrate 271, respectively. Conductive features (e.g., metal lines, vias) may be formed in the substrate 271 and electrically couple the conductive pads 273 with the conductive pads 275. In some embodiments, prior to attaching the semiconductor package 520, solder paste 136 is deposited on the exposed top surfaces of the conductive pillars 141 using, e.g., a solder printing machine. After the semiconductor packages 520 are attached to the semiconductor packages 510, a reflow process may be performed to bond the semiconductor package 520 to the respective semiconductor package 510. An underfill material 166 may be formed to fill the gap between the semiconductor package 510 and the semiconductor package 520.

Next, a dicing process is performed to form a plurality of individual semiconductor packages 500 with the PoP structure. FIG. 17 illustrates a PoP package 500, which includes a top package 520 bonded to a bottom package 510. The top package 520 may be a memory device and includes a plurality of memory dies (e.g., 279), the bottom package 510 may be a logic device and includes an SoIC 150 (see FIG. 11).

Figure 18:
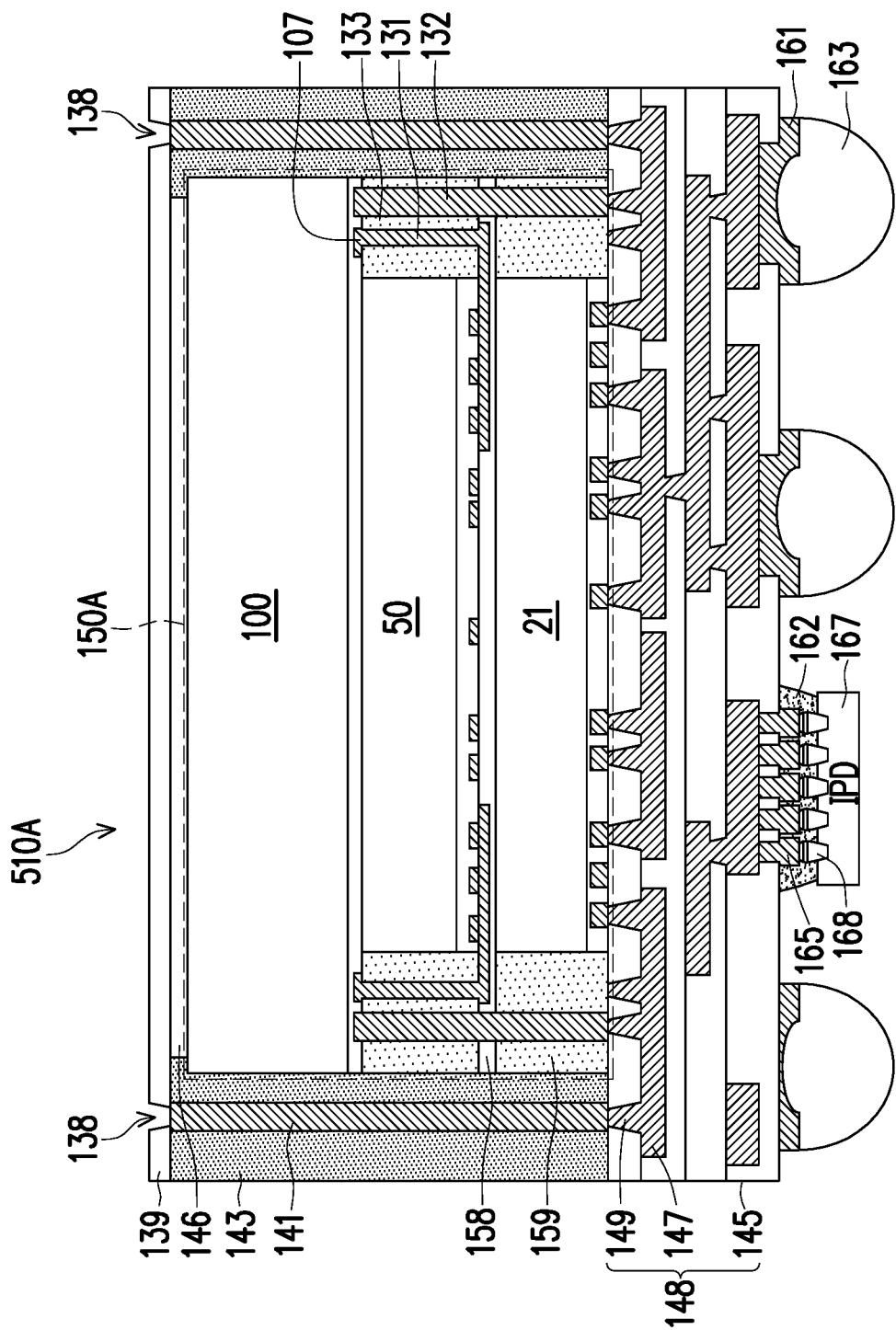
FIG. 18 illustrates a cross-sectional view of a semiconductor structure, in accordance with an embodiment.

FIG. 18 illustrates a cross-sectional view of a semiconductor package 510A, in accordance with an embodiment. The semiconductor package 510A is similar to the semiconductor package 510 in FIG. 17, but with a different SoIC 150A (see the dashed rectangle). The SoIC 150A is similar to the SoIC 150 in FIG. 11, but with a third die 21 attached to the top die 50 in the back-to-face bonding configuration using, e.g., a fusion bonding process. As illustrated in FIG. 18, the SoIC 150A further includes a redistribution structure 158 between the third die 21 and the top die 50, a dielectric material 159 on the redistribution structure 158 and around the third die 21, and conductive pillars 132. The conductive pillars 132 extends through the dielectric layers 133/159 and through the redistribution structure 158, and electrically couples the bottom die 100 to the redistribution structure 148. The redistribution structure 158 and the dielectric material 159 may be formed using a same or similar formation method as the redistribution structure 148 and the dielectric material 133, respectively, thus details are not repeated.

In some embodiments, the conductive pillars 132 are formed in a single process step after the dielectric material 159 and the dielectric material 133 are formed, e.g., using a damascene or a dual-damascene process. In the example of FIG. 18, the bottom die 100 communicates with the top die 50 through the conductive pillars 131 and the redistribution structure 158; and the bottom die 50 communicates with the die 21 through the conductive pillars 132 and the redistribution structure 148.

Figure 19A:
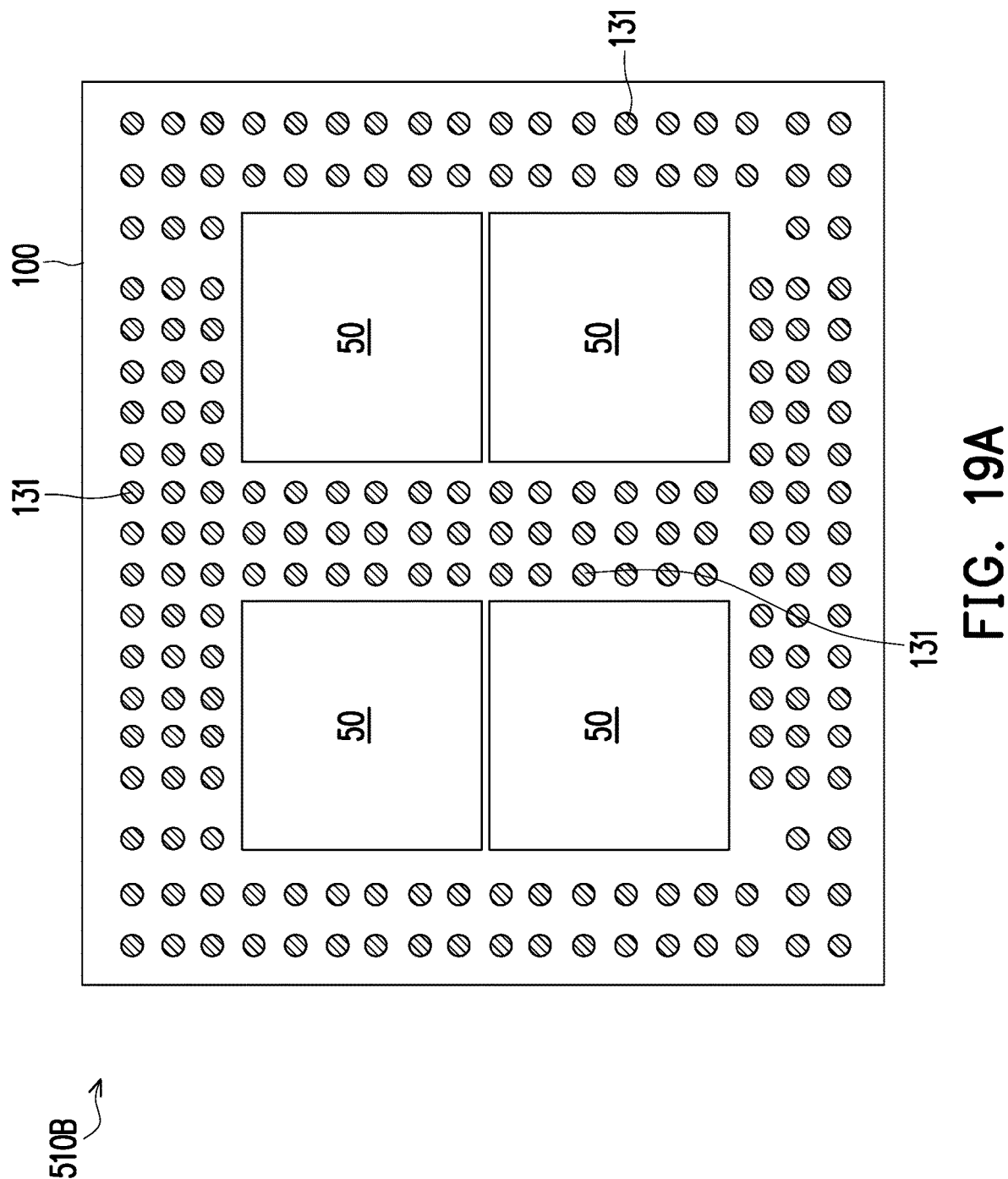
FIGS. 19A and 19B illustrate cross-sectional views of a semiconductor structure, in accordance with an embodiment.
Figure 19B:
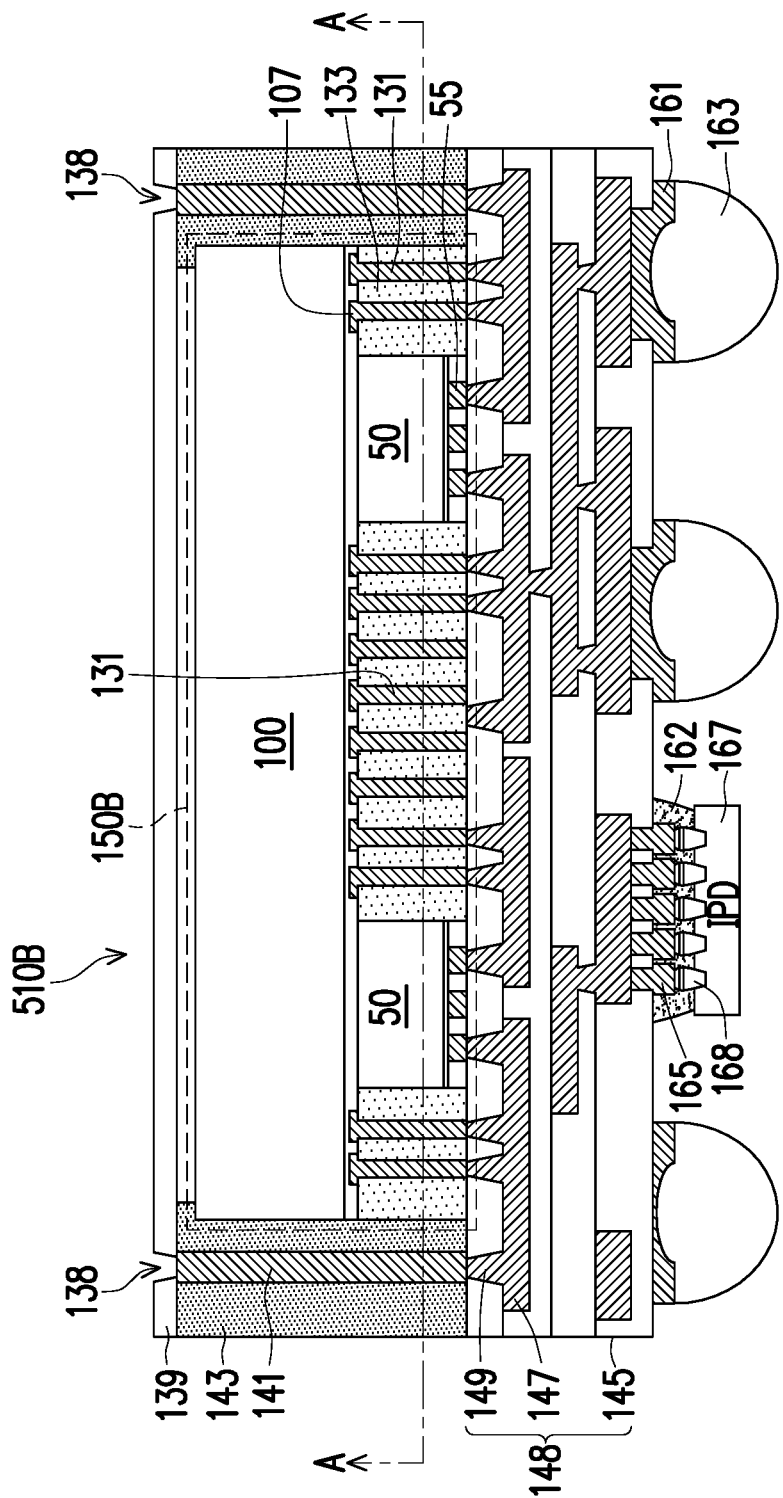

FIGS. 19A and 19B illustrate cross-sectional views of a semiconductor structure 510B, in accordance with an embodiment. The semiconductor package 510B is similar to the semiconductor package 510 in FIG. 17, but with a different SoIC 150B (see the dashed rectangle). FIG. 19A is the cross-sectional view of the semiconductor structure 510B along cross-section A-A in FIG. 19B.

The SoIC 150B is similar to the SoIC 150 of FIG. 11, but with more than one top dies 50 attached to the bottom die 100. FIG. 19A illustrates four top dies 50 attached to the bottom die 100 as a non-limiting example. More or less than four top dies 50 may be attached to the bottom die 100, these and other variations are fully intended to be included within the scope of the present disclosure. FIGS. 19A and 19B further illustrates conductive pillars 131 formed around the top dies 50 and between the top dies 50.

Figure 20B:
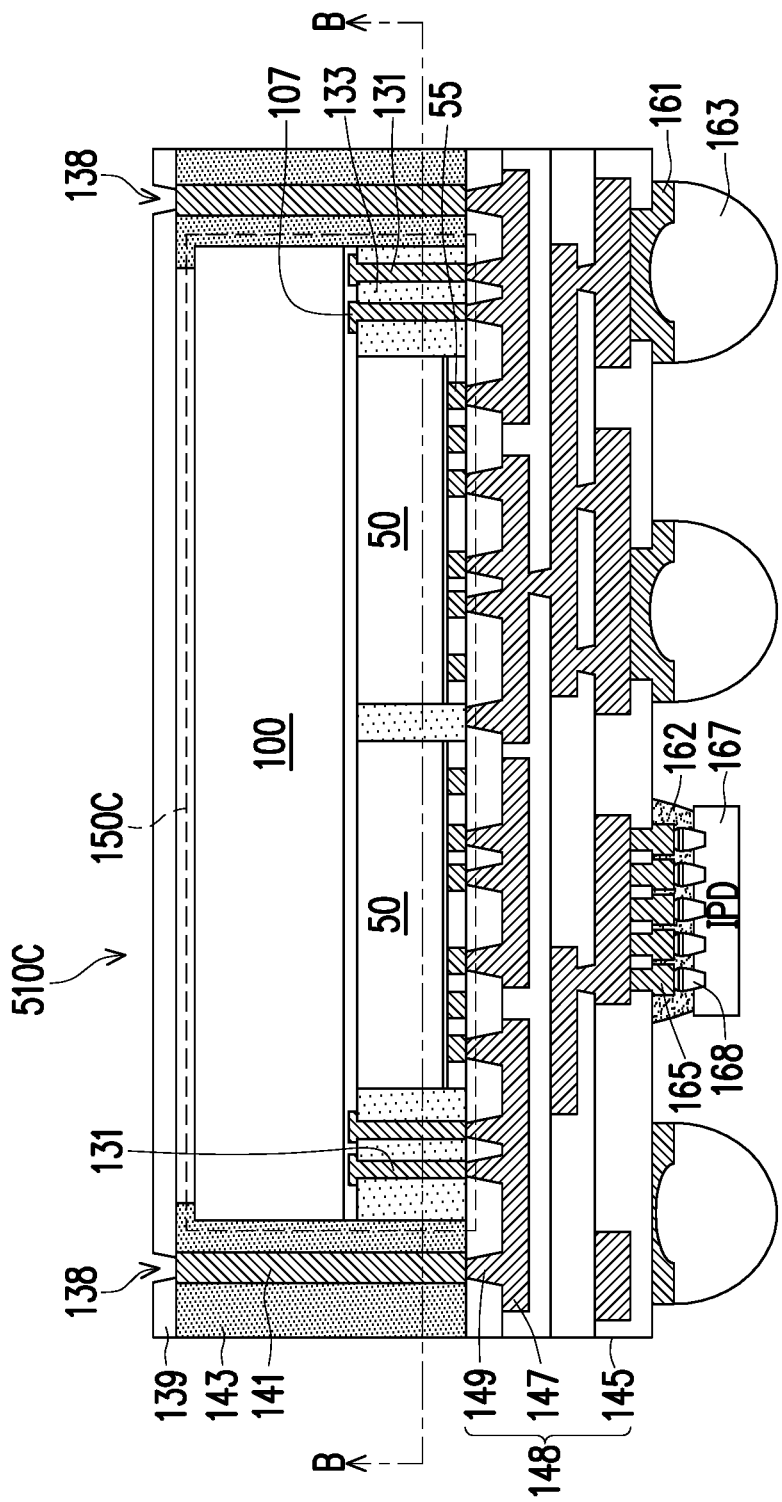

FIGS. 20A and 20B illustrate cross-sectional views of a semiconductor structure 510C, in accordance with an embodiment. The semiconductor package 510C is similar to the semiconductor structure 510B in FIGS. 19A and 19B, but with a different SoIC 150C (see the dashed rectangle). FIG. 20A is the cross-sectional view of the semiconductor structure 510C along cross-section B-B in FIG. 20B.

The SoIC 150C is similar to the SoIC 150B of FIGS. 19A and 18B, but without the conductive pillars 131 disposed between the top dies 50. In other words, the conductive pillars 131 are only disposed around the top dies 50 in the embodiment of FIGS. 20A and 20B.

FIGS. 21-27 illustrates cross-sectional views of a System on Integrated Chips (SoIC) 150D at various stages of fabrication, in accordance with an embodiment. In particular, FIGS. 21-27 illustrate a method for forming an SoIC where the die connectors 55 and the conductive pillars 131 are formed in a same processing step.

Figure 21:
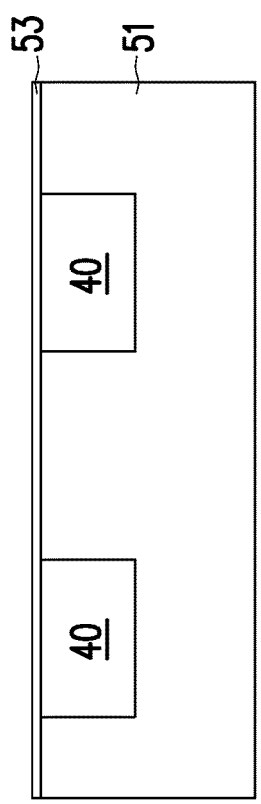
Figure 23:
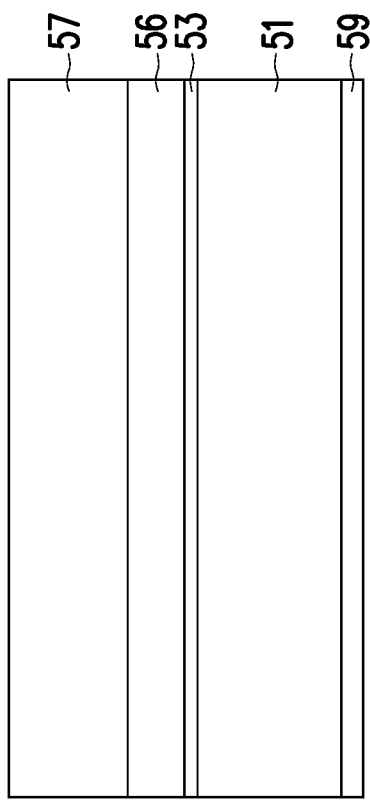
Figure 24:
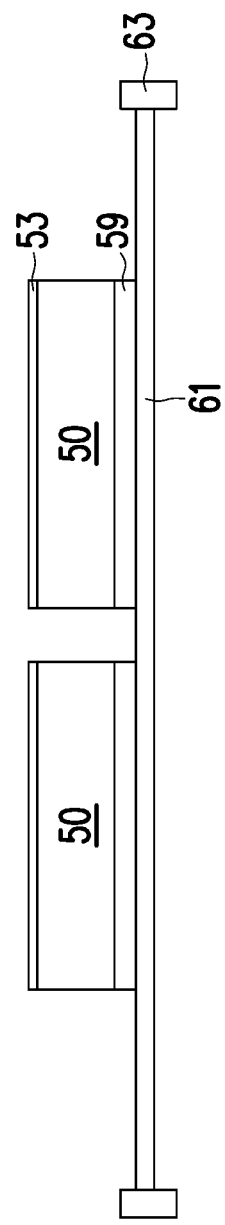

Referring to FIG. 21, a substrate 51 (e.g., a top wafer) with the device regions 40, a first passivation layer (not shown), and conductive pads (e.g., aluminum pads, not shown) are formed. The substrate 51 comprises a plurality of top dies 50. Note that at this stage of processing, the second passivation layer 52 and the die connectors 55 (see FIG. 1) are not formed. A circuit probing process is performed through the conductive pads to identify the known good dies in the substrate 51. For simplicity, the device regions 40 may not be illustrated in subsequent figures.

Figure 22:
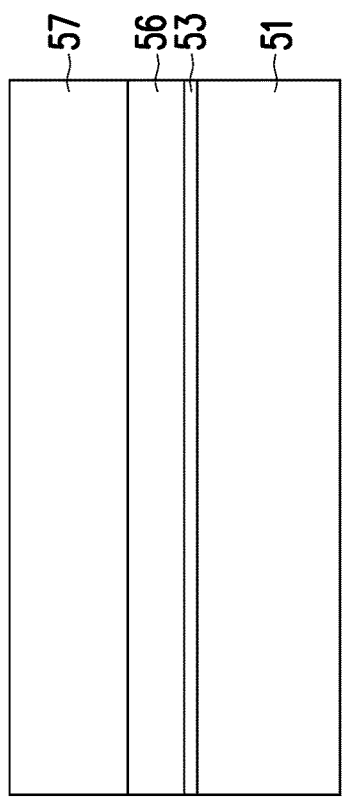

Next, in FIG. 22, the front side of the substrate 51 is attached to a carrier 57 using, e.g., an adhesive layer 56 such as a DAF. Next, in FIG. 23, a thinning process is performed at the backside of the substrate 51 to reduce a thickness of the substrate 51 to, e.g., between about 1 μm and about 100 μm, such as about 40 μm. The thinning process may be performed using a grinding process and/or a CMP process, as examples.

After the thinning process, an optional nitride layer 59, such as a silicon nitride layer, is formed on the backside of the substrate 51. As discussed above, the nitride layer 59 may be used to form a stronger bond between the top die 50 and the bottom die 100 in a subsequent fusion bonding process. In some embodiments, the nitride layer 59 is omitted.

Next, substrate 51 is attached to a dicing tape 61 supported by a frame 63. The carrier 57 is de-bonded, and a cleaning process (e.g., a DAF cleaning process) is performed to remove residues of the adhesive layer 56. The substrate 51 is then diced to form a plurality of top dies 50.

Next, in FIG. 25, the backsides of the top dies 50 (e.g., the known good top dies 50) are bonded to the front side of a bottom wafer 100' through the fusion bonding process in the back-to-face bonding configuration. In some embodiments, the top dies 50 are bonded to regions of a topmost dielectric layer of the bottom wafer 100' that do not have bonding pads 107.

In some embodiments, before the top dies 50 are bonded to the bottom wafer 100', the bottom wafer 100' is tested using disposable probing pads, following the processing illustrated in, e.g., FIGS. 4-7. The structure of the bottom wafer 100' after the testing may be same as or similar to those illustrated in FIG. 7, 8, or 9.

Next, in FIG. 26, conductive pillars 55 are formed on the top dies 50 and conductive pillars 131 are formed on the bonding pads 107. The conductive pillars 55 are electrically coupled to the conductive pads of the top dies 50 and function as the die connectors. In some embodiments, the conductive pillars 131 and the conductive pillars 55 are formed in a same processing step using methods similar to those describe above for the conductive pillars 131 in FIG. 10, thus details are not repeated.

Figure 27:
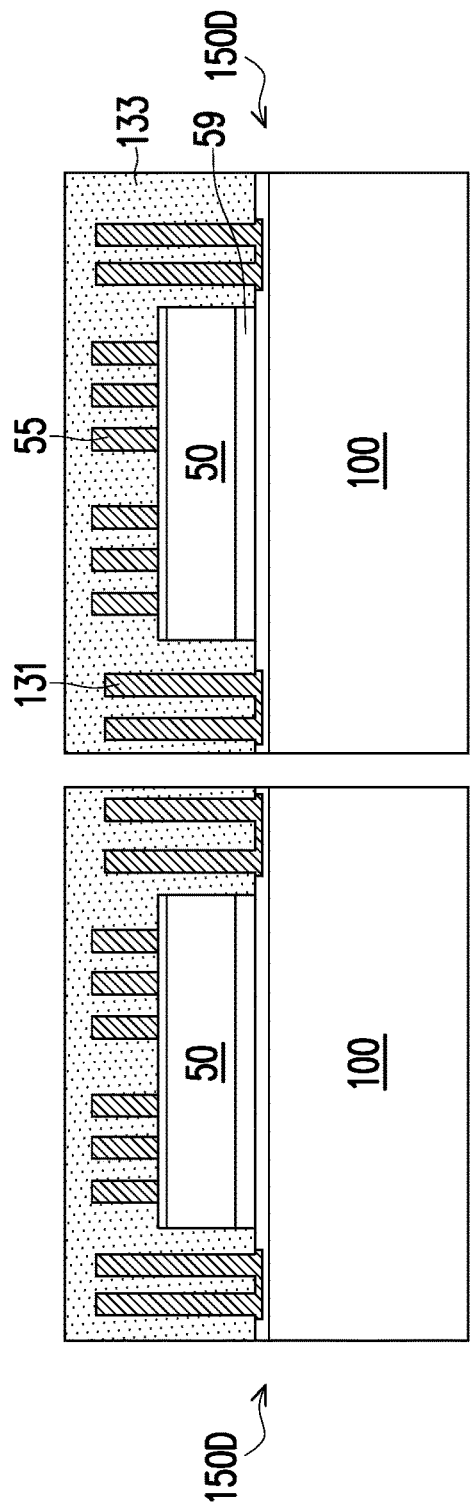

Next, in FIG. 27, a dielectric material 133, which may be a polymer such as polyimide, low-temperature polyimide, PBO, or the like, is formed over the bottom wafer 100' and around the top dies 50 and around the conductive pillars 131/55. A planarization process, such as CMP, may be performed to planarize the dielectric material 133. Next, a dicing processing is performed to singulate the bottom wafer 100' and form a plurality of SoICs 150D, wherein each SoIC 150D includes a top die 50 bonded to a bottom die 100. As illustrated in FIG. 27, the dielectric material 133 is laterally conterminous with the bottom die 100.

FIGS. 28-33 illustrates cross-sectional views of a System on Integrated Chips (SoIC) 150E at various stages of fabrication, in accordance with an embodiment. In particular, FIGS. 28-33 illustrates a method for forming an SoIC where an adhesive film 54 is used to bond the top die 50 to the bottom die 100.

Figure 28:
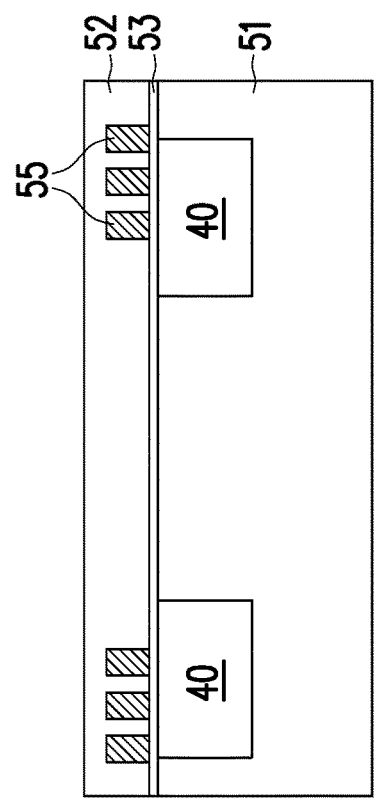

Referring to FIG. 28, a substrate 51 (e.g., a top wafer) with device regions 40, a first passivation layer (not shown), conductive pads (e.g., aluminum pads, not shown), and die connectors 55 are formed. The substrate 51 comprises a plurality of dies (e.g., top dies 50). A circuit probing process is performed through the die connectors 55 to identify the known good dies in the substrate 51. After the circuit probing process, a second passivation layer 52 is formed over the substrate 51. For simplicity, the device regions 40 may not be illustrated in subsequent figures.

Figure 29:
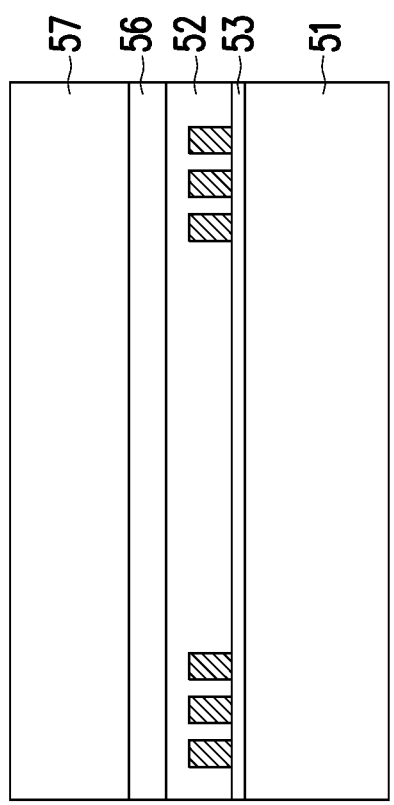

Next, in FIG. 29, a carrier 57 is attached to the second passivation layer using an adhesive layer 56, and a thinning process is performed from the backside of the substrate 51 to reduce a thickness of the substrate 51 to a value between about 1 µm and about 100 µm, such as about 40 µm.

Figure 30:
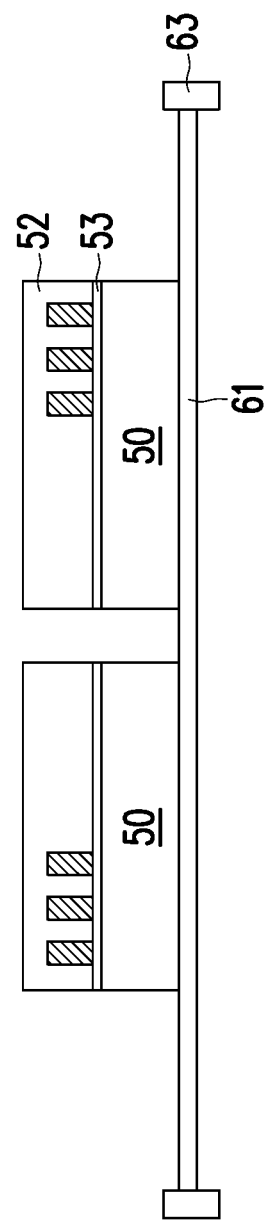

Next, in FIG. 30, the substrate 51 is attached to a dicing tape 61, and a dicing process is performed to singulate the substrate 51 and form a plurality of top dies 50.

Figure 31:
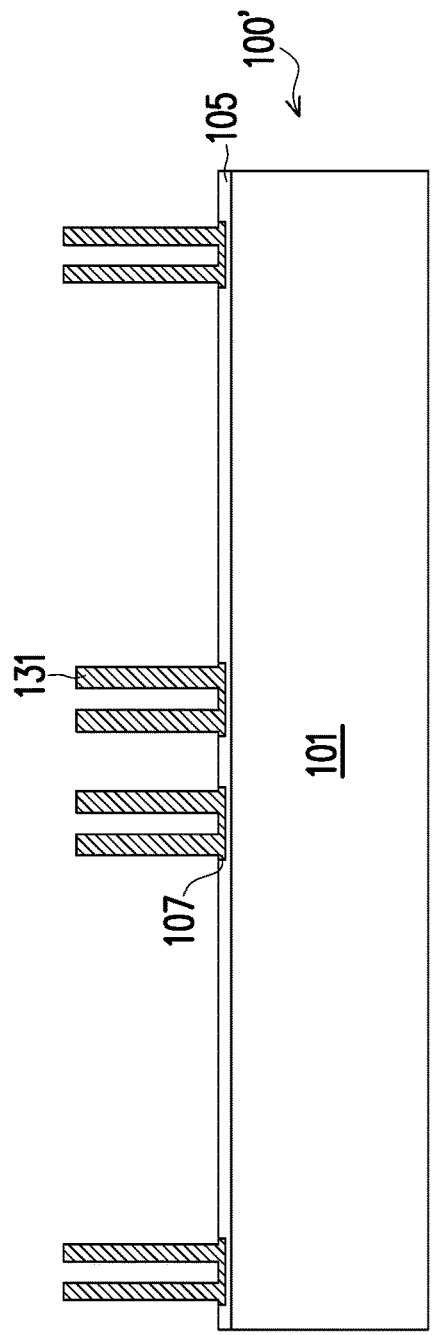

Next, in FIG. 31, a bottom wafer 100' is tested using disposable probing pads, following the processing illustrated in, e.g., FIGS. 4-7. The structure of the bottom wafer 100' after the testing may be the same as or similar to those illustrated in FIG. 7, 8, or 9. Next, conductive pillars 131 are formed on the bonding pads 107 of the bottom wafer 100', using the same or similar processing as describe above in FIG. 10.

Figure 32:
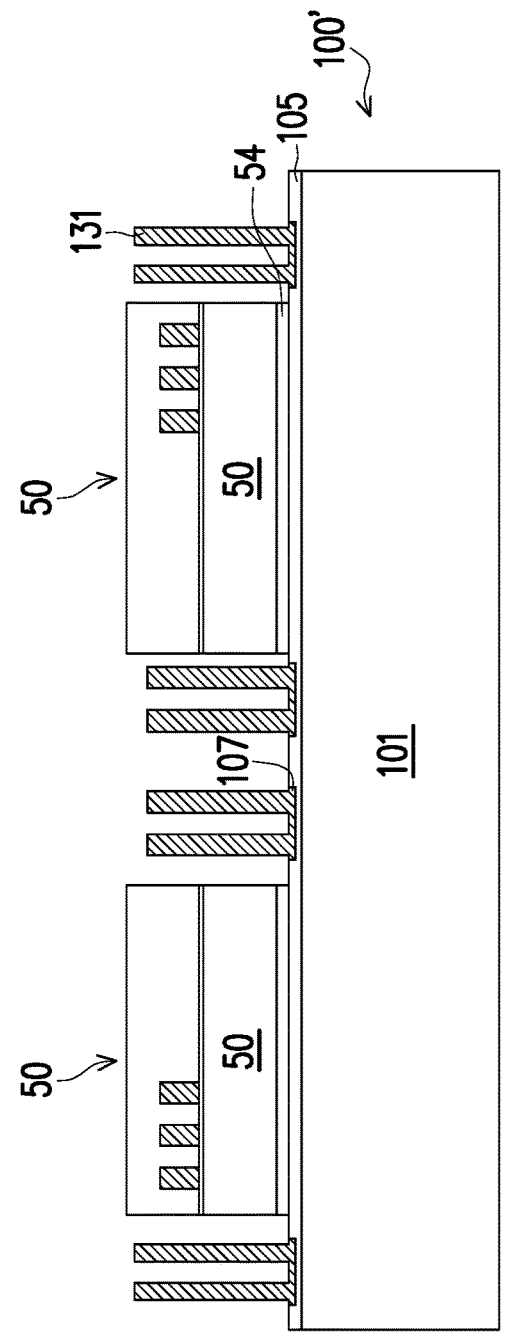

Next, in FIG. 32, the top dies 50 (e.g., known good top dies 50) formed in FIG. 30 are attached to the front side of the bottom wafer 100' using adhesive films 54, such as DAF. In some embodiments, the top dies 50 are attached to areas of the topmost dielectric layer of the bottom wafer 100' that does not have the bonding pads 107.

Next, in FIG. 33, a dielectric material 133, which may be polyimide, a low-temperature polyimide, a molding material, or the like, is formed on the bottom wafer 100'. The dielectric material surrounds the top dies 50 and the conductive pillars 131. After the dielectric material 133 is formed, a dicing process is performed to singulate the bottom wafer 100' and to form a plurality of SoICs 150E.

FIGS. 34-36, 37A, 37B, and 38-42 illustrate cross-sectional views of a semiconductor structure 220 (see FIGS. 41 and 42) at various stages of fabrication, in accordance with an embodiment. The semiconductor structure 220 has a Chip-On-Wafer-On-Substrate (CoWoS) structure, which includes a Chip-On-Wafer (CoW) structure 190 (see FIG. 40) attached to a substrate 201, details of which are described hereinafter.

Referring to FIG. 34, a plurality of top dies 50 are bonded to a bottom wafer 100' in the back-to-face bonding configuration using the fusion bonding process. The fusion bonding process and the back-to-face bonding configuration are discussed above, thus details may not be repeated. The top dies 50 may be formed following the same or similar processing as illustrated in FIGS. 1-3. The bottom wafer 100' may be the same or similar as the bottom wafer 100' of FIG. 10. In some embodiments, before the top dies 50 are bonded to the bottom wafer 100', the bottom wafer 100' is tested using disposable probing pads following the same or similar processing as illustrated in FIGS. 4-7.

In some embodiments, after the top dies 50 are bonded to the bottom wafer 100', a dielectric material 134 is formed on the bottom wafer 100' around the top dies 50. In the illustrated embodiment, the dielectric material 134 is an oxide, such as silicon oxide, and is formed by a suitable formation method such as PCV, CVD, or the like. The use of oxide as the dielectric material 134 allows for conductive pillars 131 (discussed hereinafter) with fine pitch (e.g., pitch between about 5 µm and about 30 µm) to be formed subsequently. Although oxide is used as an example of the dielectric material 134, the dielectric material 134 may be formed of other suitable materials, such as a polymer or a molding material. In embodiments where a polymer or a molding material is used as the dielectric material 134, the pitch between the subsequently formed conductive pillars 131 may be larger, such as between about 50 µm and about 100 µm.

Next, openings are formed in the dielectric material 134 using, e.g., photolithography and etching techniques (e.g., dry etching). The openings extend through the dielectric material 134 and expose the underlying bonding pads 107. Next, an electrically conductive material, such as copper, is formed in the openings to fill the openings, thereby forming conductive pillars 131 (may also be referred to as vias). The electrically conductive material may be formed by a plating process (e.g., electroplating, or electroless plating), as an example, although other suitable method may also be used.

After the conductive pillars 131 are formed, a planarization process, such as CMP, may be performed to achieve a level upper surface for the dielectric material 134. After the planarization process, upper surfaces of the conductive pillars 131 and upper surfaces of the die connectors 55 of the top dies 50 are exposed at the upper surface of the dielectric material 134. A height of $H_4$ of the top dies 50 and/or of the conductive pillars 131 after the planarization process is between about 10 µm and about 100 µm, such as about 30 µm, in some embodiments. A width of the conductive pillars 131 may be between about 10 µm and about 50 µm, such as about 30 µm, and a pitch between adjacent conductive pillars may be between about 20 µm and about 100 µm, such as about 70 µm.

Figure 35:
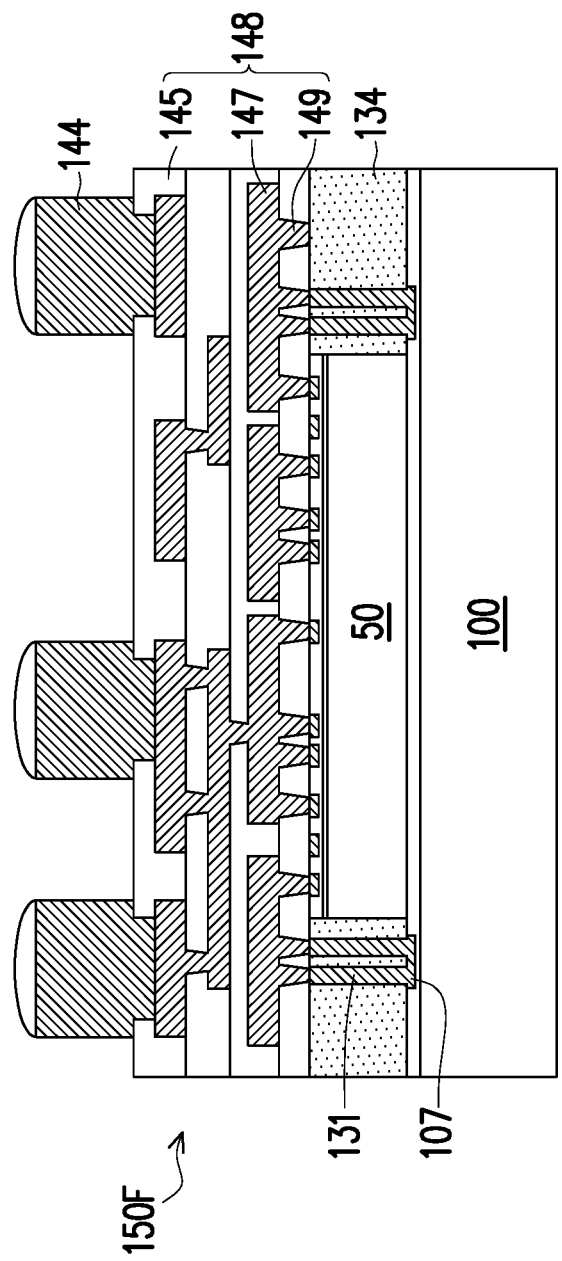

Next, as illustrated in FIG. 35, a redistribution structure 148 is formed over the dielectric material 134 and is electrically coupled to the conductive pillars 131 and the top dies 50. The redistribution structure 148 includes a plurality of dielectric layers 145 and conductive features (e.g., conductive lines 147 and vias 149) formed in the dielectric layers 145. External connectors 144, such as micro-bumps, are formed over the redistribution structure 148 and are electrically coupled to the conductive features of the redistribution structure 148. Formation of the redistribution structure 148 in FIG. 35 may be the same as or similar to those of the redistribution structure 148 in FIG. 15, thus details are not repeated here. Next, a dicing process is performed to singulate the bottom wafer 100' and to form a plurality of SoICs 150F. FIG. 35 illustrates a SoIC 150F formed after the dicing process. In the example of FIG. 35, the redistribution structure 148 and the dielectric material 134 are laterally conterminous with the bottom die 100.

In some embodiments, the material used to form the dielectric layers 145 of the redistribution structure 148 of FIG. 35 is adjusted to accommodate different design targets regrading line spacing (e.g., spacing between adjacent conductive lines) of the redistribution structure 148. For example, to achieve a line spacing of 0.8 µm or less, an oxide (e.g., silicon oxide, un-doped silicate glass (USG), or the like) may be used to form the dielectric layers 145. To achieve a line spacing of 10 µm or more, a polymer (e.g., polyimide, LPTI, or the like) may be used to form the dielectric layers 145.

In some embodiments, when an oxide is used to form the dielectric layers 145, processing steps similar to those of a damascene process may be used to form the conductive features (e.g., lines) and to achieve the fine line spacing of 0.8 µm or less. For example, after the oxide is formed by, e.g., CVD, a patterned photoresist (e.g., a high qualify photoresist with high resolution) is formed over the oxide.

Next, a dry etching process is performed using the patterned photoresist as an etching mask to form openings in the oxide. Next, the patterned photoresist is removed (e.g., by ashing or stripping), and barrier layer/seed layer are formed in the openings in the oxide. Next, a plating process, such as electro-chemical plating is performed to fill the openings with a conductive material (e.g., copper), and a CMP is then performed to remove portions of the conductive material outside the openings. The remaining portions of the conductive material in the openings thereby form the conductive features.

In some embodiments, when a polymer is used to form the dielectric layers 145, the conductive features (e.g., lines, vias) of the redistribution structure 148 may be formed following the same or similar processing steps discussed above with reference to FIG. 15, due to the physical properties of the polymer (e.g., softer compared with an oxide). The photoresist formed over the polymer layer may also have lower quality and lower resolution. As a result, the line spacing is larger (e.g., 10 μm or more) when polymer is used as the dielectric layers 145 of the redistribution structure 148.

Figure 36:
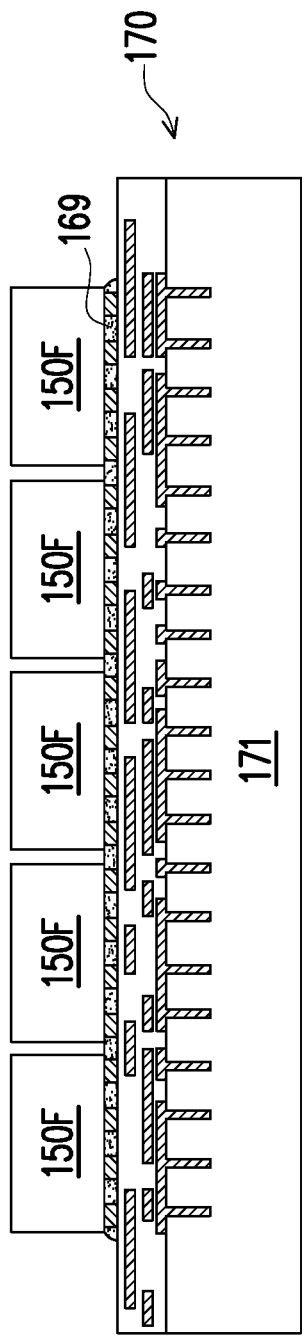

Next, in FIG. 36, a plurality of SoICs 150F are attached to an interposer 170 by bonding the external connectors 144 (see FIG. 35) of the SoICs 150F to external connectors 174 (e.g., micro-bumps, see FIG. 37A) at an upper surface of the interposer 170. An underfill material 169 may be formed between the SoICs 150F and the interposer 170 after the SoICs 150F are attached to the interposer 170.

Figure 37A:
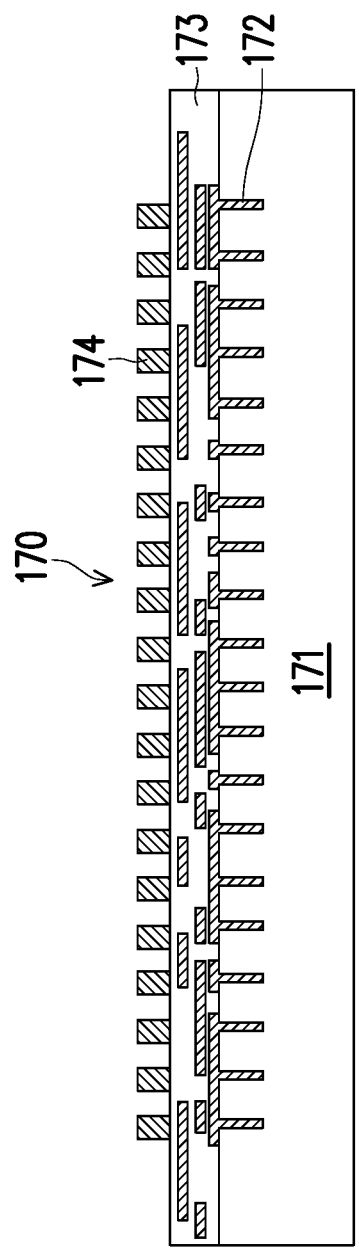
Figure 37B:
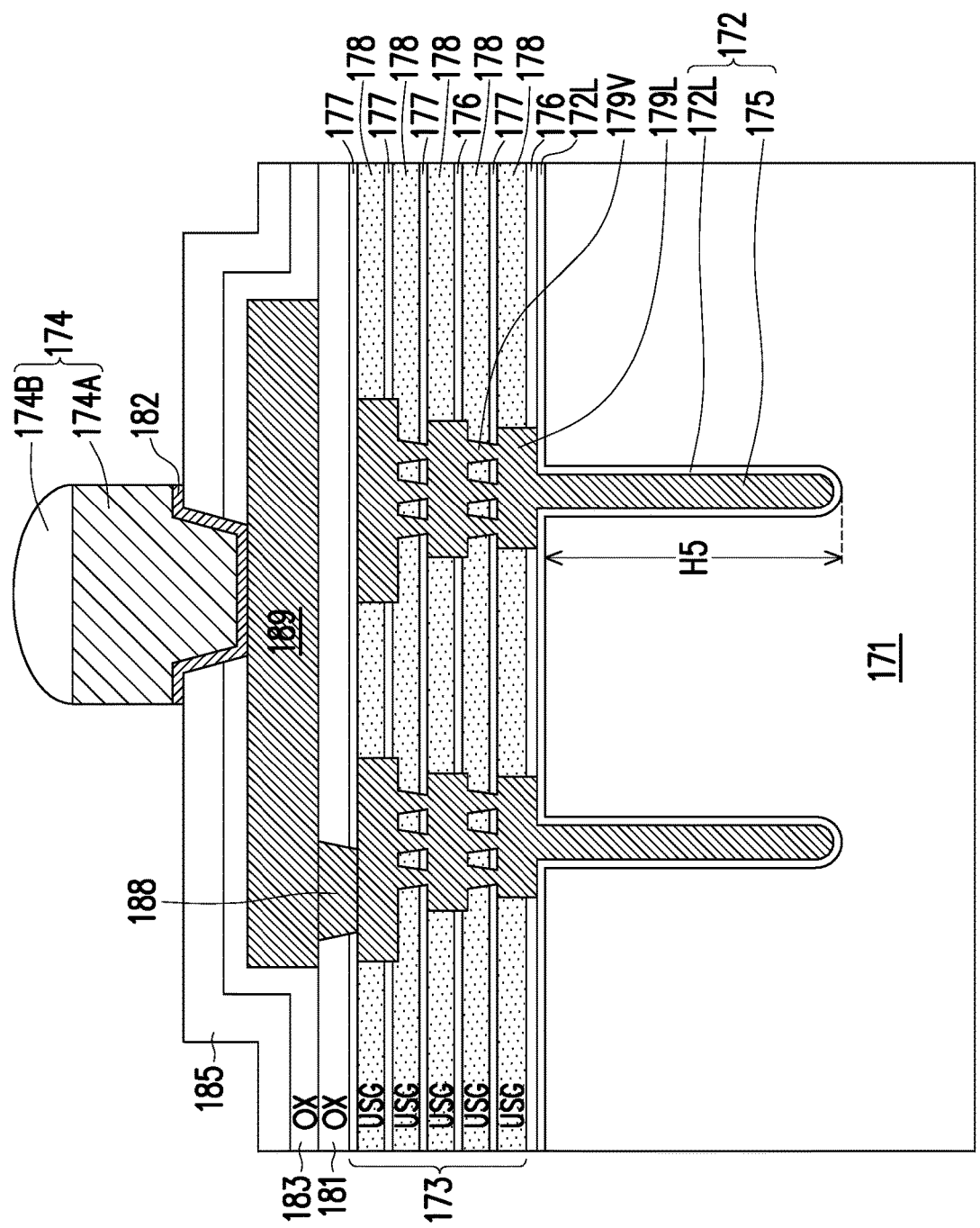

FIG. 37A illustrates a cross-sectional view of the interposer 170 in FIG. 36 with more details. FIG. 37B is a zoomed-in view of a portion of the interposer 170. Referring to FIG. 37A, the interposer 170 comprises a substrate 171, through-substrate vias (TSVs) 172 in the substrate 171, a redistribution structure 173, and external connectors 174.

Referring to FIG. 37B, the substrate 171 may be, e.g., a silicon substrate, doped or undoped, or an active layer of a silicon-on-insulator (SOI) substrate. However, the substrate 171 may alternatively be a glass substrate, a ceramic substrate, a polymer substrate, or any other substrate that may provide a suitable protection and/or interconnection functionality. These and any other suitable materials may alternatively be used for the substrate 171.

In some embodiments, the substrate 171 may include electrical components, such as resistors, capacitors, signal distribution circuitry, combinations of these, or the like. These electrical components may be active, passive, or a combination thereof. In other embodiments, the substrate 171 is free from both active and passive electrical components therein. All such combinations are fully intended to be included within the scope of the embodiments.

The TSV 172 may be formed by forming openings in the substrate 171 and filling the openings with electrically conductive material(s). In the illustrated embodiment, the openings extend into the substrate 171 without extending through the substrate 171. The openings for the TSV 172 may be lined with a liner 172L and filled with a conductive material 175. In an embodiment, the liner 172L is a dielectric material such as silicon nitride, silicon oxide, a dielectric polymer, combinations of these, or the like, formed by a process such as chemical vapor deposition, oxidation, physical vapor deposition, atomic layer deposition, or the like.

In some embodiments, The conductive material 175 may comprise copper, although other suitable materials such as aluminum, tungsten, alloys, doped polysilicon, combinations thereof, and the like, may alternatively be utilized. The conductive material 175 may be formed by depositing a seed layer and then electroplating copper onto the seed layer, filling and overfilling the openings for the TSV 172. A planarization process, such as CMP, may be performed next to remove excess portions of the conductive material 175 disposed outside the openings for the TSV 172.

In the illustrated embodiment, after the planarization process, the liner 172L that remains along the upper surface of the substrate 171 has a thickness between about 0.7 μm and about 0.8 μm, such as 0.75 μm, and the liner 172L along the sidewalls of the openings has a larger thickness of, e.g., about 1 μm. The TSV 172, after being formed initially, does not extend through the substrate 171, as illustrated in FIG. 37B. In an embodiment, a width of the TSV 172 is between about 5 μm and about 20 μm, and a height $H_5$ of the TSV 172 is between about 50 μm and about 150 μm.

Next, a redistribution structure 173 is formed over the substrate 171 and is electrically coupled to the TSVs 172. The redistribution structure 173 may be formed using the same or similar method as the redistribution structure 148 in FIG. 15, thus details may not be repeated. In the example of FIG. 37B, the redistribution structure 173 includes dielectric layers 176/177/178, and conductive features, such as conductive lines 179L and vias 179V. In an embodiment, the dielectric layers 176 are formed of silicon nitride (e.g., SiN), the dielectric layers 177 are formed of silicon carbide (e.g., SiC), and the dielectric layers 178 are formed of USG.

Next, a dielectric layer 181 (e.g., an oxide layer) is formed over the redistribution structure 173, and vias 188 are formed in the dielectric layer 181 and electrically coupled to the conductive features of the redistribution structure 173. Next, conductive pads 189 (e.g., aluminum pads) are formed over the dielectric layer 181 and electrically coupled to the vias 188. A first passivation layer 183 (e.g., an oxide layer) is formed over the dielectric layer 181 and covers peripheral portions of the conductive pads 189. A second passivation layer 185 (e.g., a SiN layer) is formed over the first passivation layer 183. External connectors 174, which may include conductive bumps 174A (e.g., micro-bumps, copper pillars) and solder caps 174B, are formed which extend through the second passivation layer 185 and are electrically coupled to the respective conductive pads 189. Under-bump-metallurgy (UBM) structures 182 may be formed between the external connectors 174 and the conductive pads 189.

Figure 38:
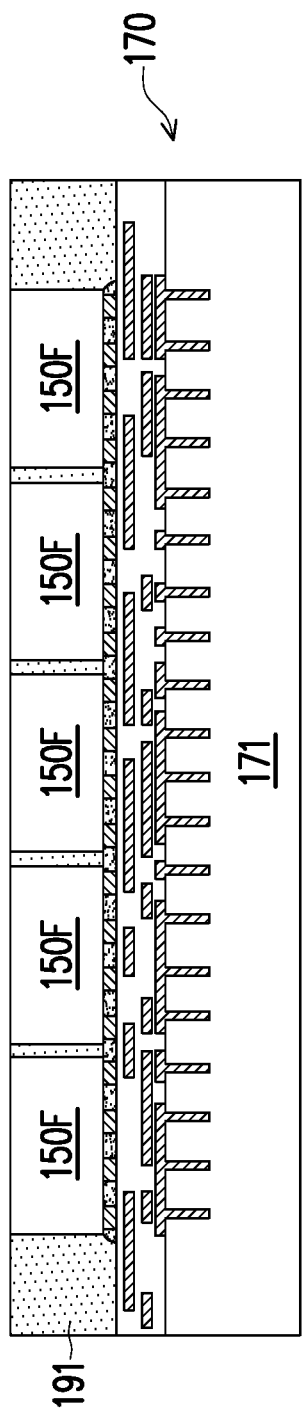

Referring next to FIG. 38, a molding material 191 is formed over the interposer 170 and around the SoICs 150F. A planarization process, such as CMP, may be performed to remove excess portions of the deposited molding material 191. The planarization process may also expose the backsides of the SoICs 150F. The molding material 191 physically contacts sidewalls of the redistribution structure 148 (see FIG. 35), sidewalls of the dielectric material 134 (see FIG. 35), and sidewalls of the bottom die 100 of the SoIC 150F.

Figure 39:
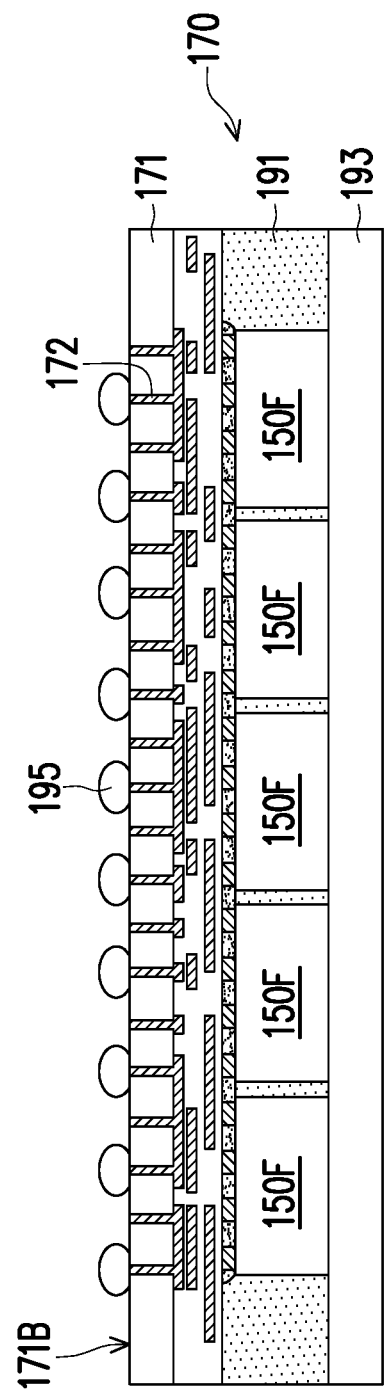

Next, in FIG. 39, a carrier 193 is attached to the molding material 191, and a thinning process is performed, e.g., through backside grinding, to reduce the thickness of the substrate 171. After the backside thinning process, the TSVs 172 are exposed at a surface 171B of the substrate 171. Next, conductive bumps 195, such as C4 bumps, are formed on the exposed end surfaces of the TSVs 172.

Figure 40:
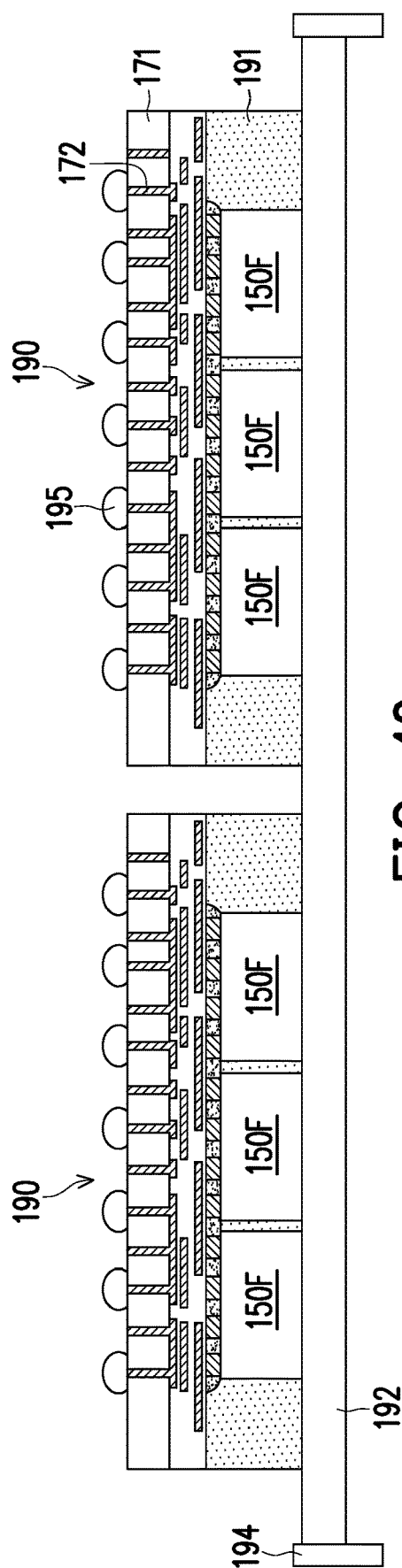

Next, in FIG. 40, the semiconductor structure in FIG. 39 is attached to a tape 192 supported by a frame 194, and a dicing process is performed to singulate the interposer 170 and form a plurality of Chip-On-Wafer (CoW) structures 190, where each of the CoW structures 190 includes one or more SoICs 150F bonded to an interposer.

Figure 41:
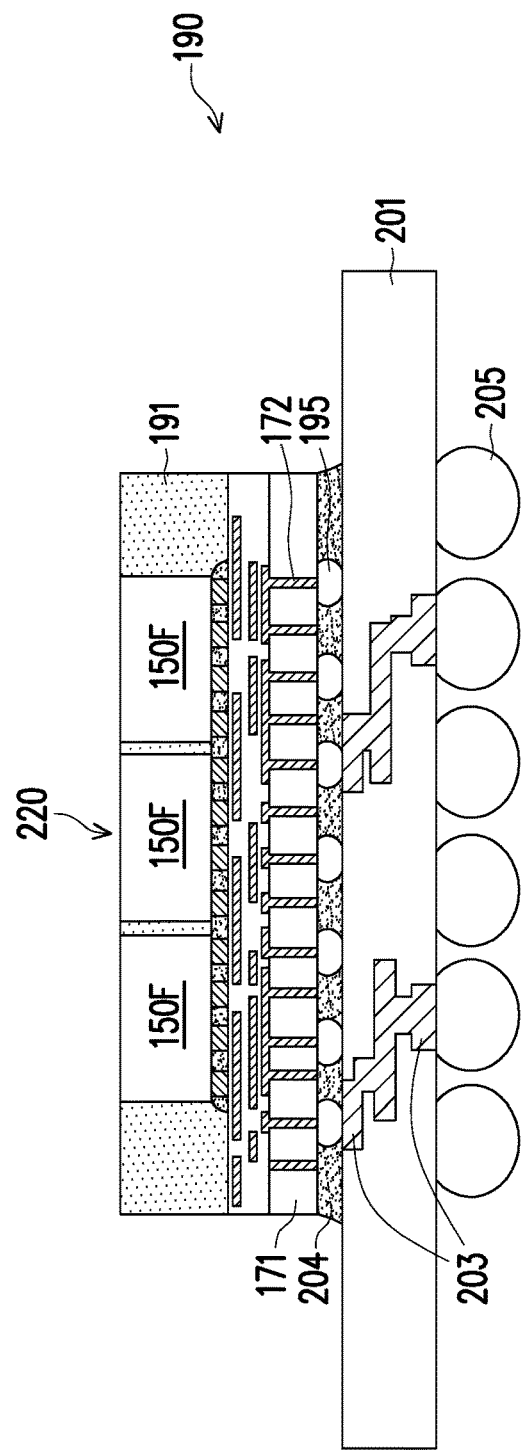

Next, in FIG. 41, the CoW structure 190 of FIG. 40 is bonded to a substrate 201, e.g., by bonding the conductive bumps 195 of the CoW structure 190 to conductive pads 203 on an upper surface of the substrate 201, thereby forming a Chip-On-Wafer-On-Substrate (CoWoS) structure 220. An underfill material 204 may be formed in a gap between the CoW structure 190 and the substrate 201.

In some embodiments, the substrate 201 is a multiple-layer circuit board (e.g., a Printed Circuit Board (PCB)). In some embodiments, the substrate 201 includes bismaleimide triazine (BT) resin, FR-4 (a composite material composed of woven fiberglass cloth with an epoxy resin binder that is flame resistant), ceramic, glass, plastic, tape, film, or other supporting materials. The substrate 201 may include conductive features (e.g., conductive lines and vias) formed in/on the substrate 201. As illustrated in FIG. 41, the substrate 201 has conductive pads 203 formed on an upper surface and a lower surface of the substrate 201, which conductive pads 203 are electrically coupled to the conductive features of the substrate 201.

Figure 42:
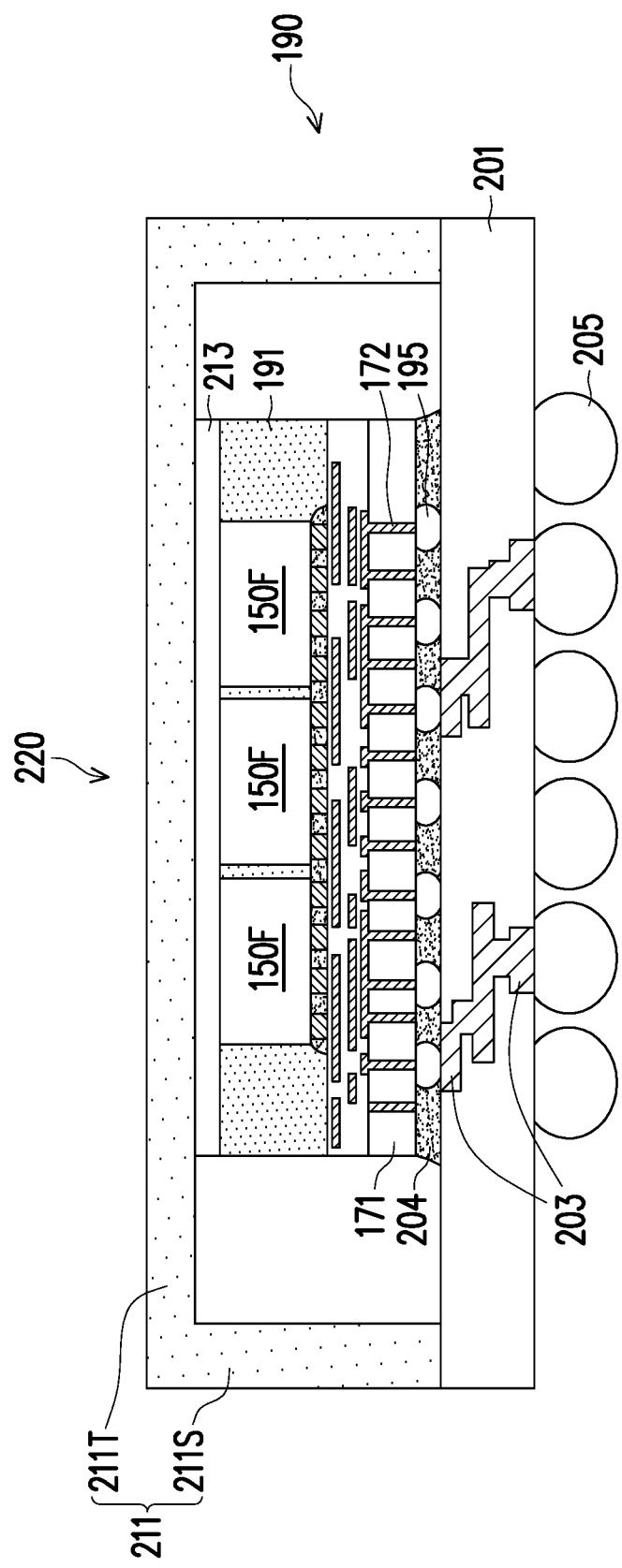

Next, in FIG. 42, a lid 211 is attached to the upper surface of the substrate 201 using, e.g., an adhesive. The lids 211 may include a sidewall portion 211S that encircles the CoWoS structure 220, and a top portion 211T over the CoWoS structure 220. The lid 211 may be formed of a material (e.g., a metal) with good thermal conductivity and may function as a heat dissipation device. The lid 211 also provides protection of the CoWoS structure 220. FIG. 42 further illustrates a Thermal Interface Material (TIM) 213 between the top portion 211T of the lid 211 and the CoW structure 190. The TIM 213 may include a polymer, resin, or epoxy as a base material, and a filler to improve its thermal conductivity. The filler may include a dielectric filler such as aluminum oxide, magnesium oxide, aluminum nitride, boron nitride, and diamond powder. The filler may also be a metal filler such as silver, copper, aluminum, or the like.

FIGS. 43-46, 47A, 47B, 48, 49, and 50A-50C illustrate cross-sectional views of various embodiments of System on Integrated Chips (SoICs). The SoICs illustrated in FIGS. 43-46, 47A, 47B, 48, 49, and 50A-50C may be used to form various semiconductor structures such as the CoWoS structure 220 and the semiconductor package 510.

Figure 43:
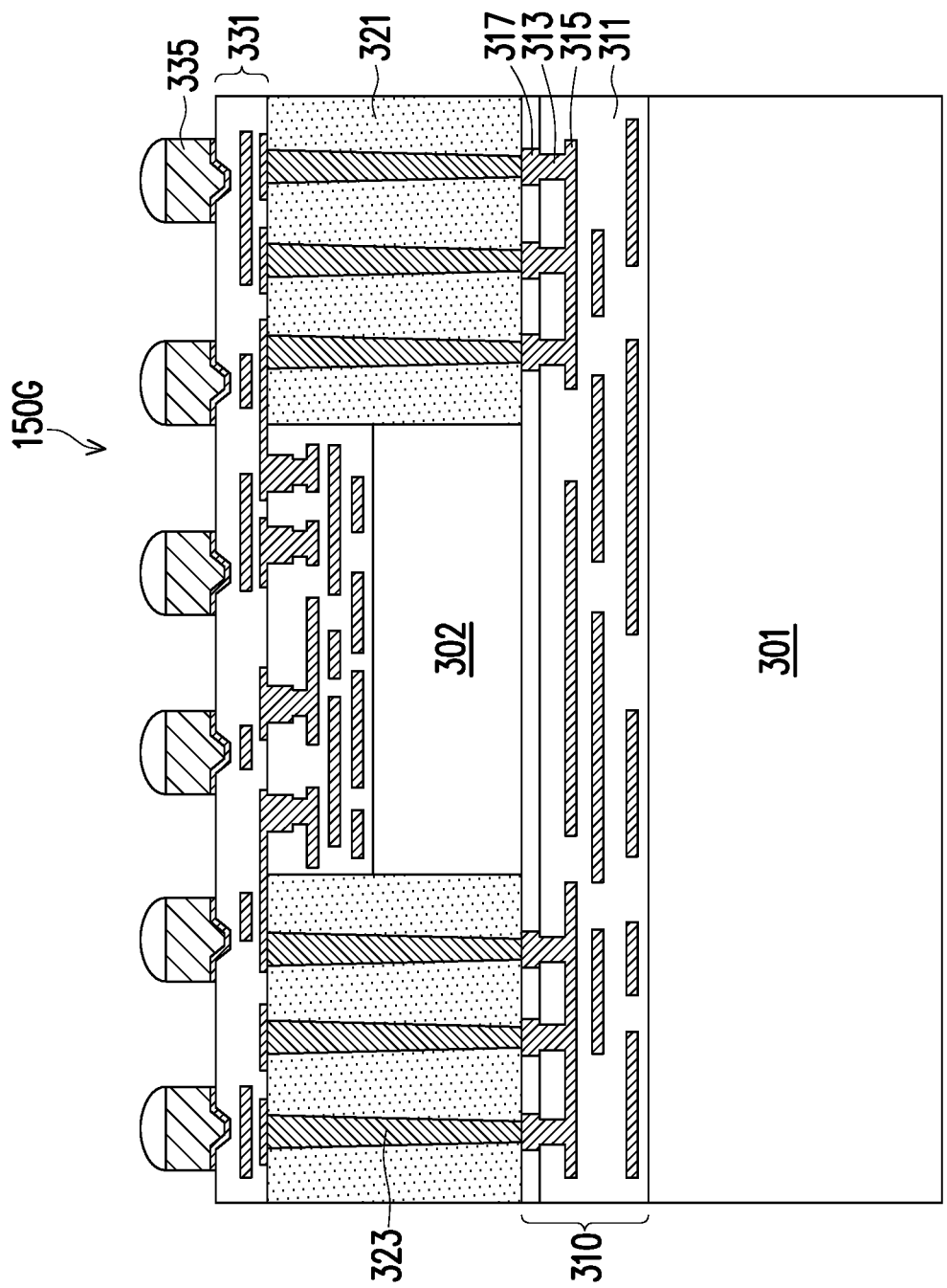
FIGS. 43-46, 47A, 47B, 48, 49, and 50A-50C illustrate cross-sectional views of various embodiments of System on Integrated Chips (SoIC).

FIG. 43 illustrates a cross-sectional view of an SoIC 150G, which includes a die 301 having an interconnect structure 310 at the front side of the die 301, and a die 302 with its backside attached to the interconnect structure 310. For example, the die 302 may be bonded by silicon-to-oxide bonds formed between the material (e.g., silicon) of the die 302 and the material (e.g., oxide) of an uppermost dielectric layer of the interconnect structure 310 using a fusion bonding process. The interconnect structure 310 may be the same as or similar to the interconnect structure 105 illustrated in FIG. 7, 8, or 9, and includes conductive features such as conductive lines 315, vias 313, and bonding pads 317 formed in a plurality of dielectric layers 311.

The SoIC 150G further includes a dielectric layer 321 around the die 302, and conductive pillars 323 embedded in the dielectric layer 321. The dielectric layer 321 may be formed of a suitable material such as an oxide (e.g., silicon oxide), a polymer such as polyimide or LTPI, a molding material, or the like. The conductive pillars 323 extends through the dielectric layer 321 and may have a height of, e.g., between about 10 µm and about 200 µm.

FIG. 43 further illustrates a redistribution structure 331 that is the same as or similar to the redistribution structure 148 illustrated in FIG. 15. Conductive bumps 335, such as micro-bumps, C4 bumps, BGAs, or the like, are formed over and electrically coupled to the redistribution structure 331. In the example of FIG. 43, the die 301 and the die 302 communicate through the redistribution structure 331 and the conductive pillars 323.

Figure 44:
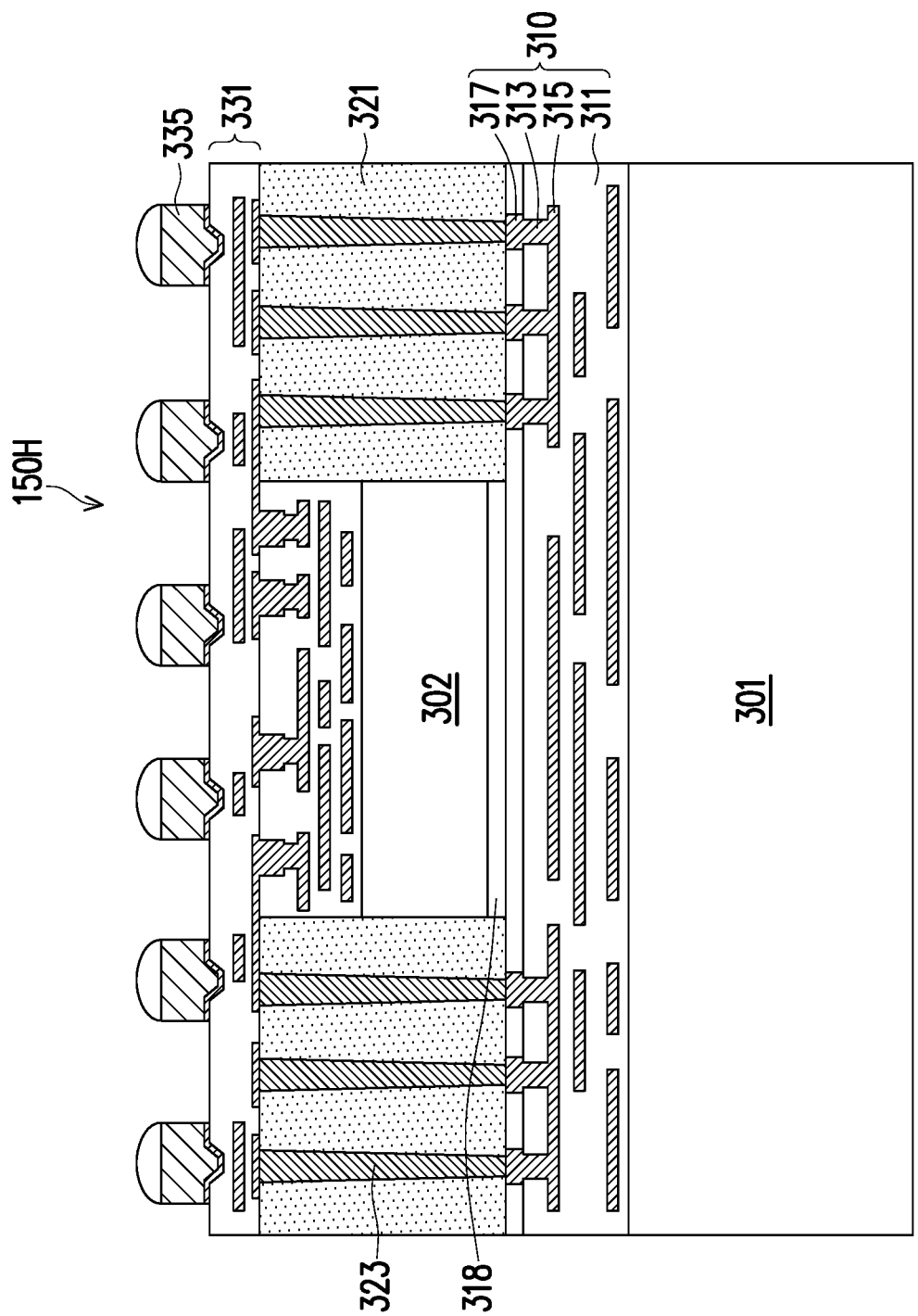

FIG. 44 illustrates a cross-sectional view of an SoIC 150H, which is similar to the SoIC 150G in FIG. 43. The die 302 in FIG. 44, however, is bonded to the die 301 through an adhesive film 318, such as a DAF.

Figure 45:
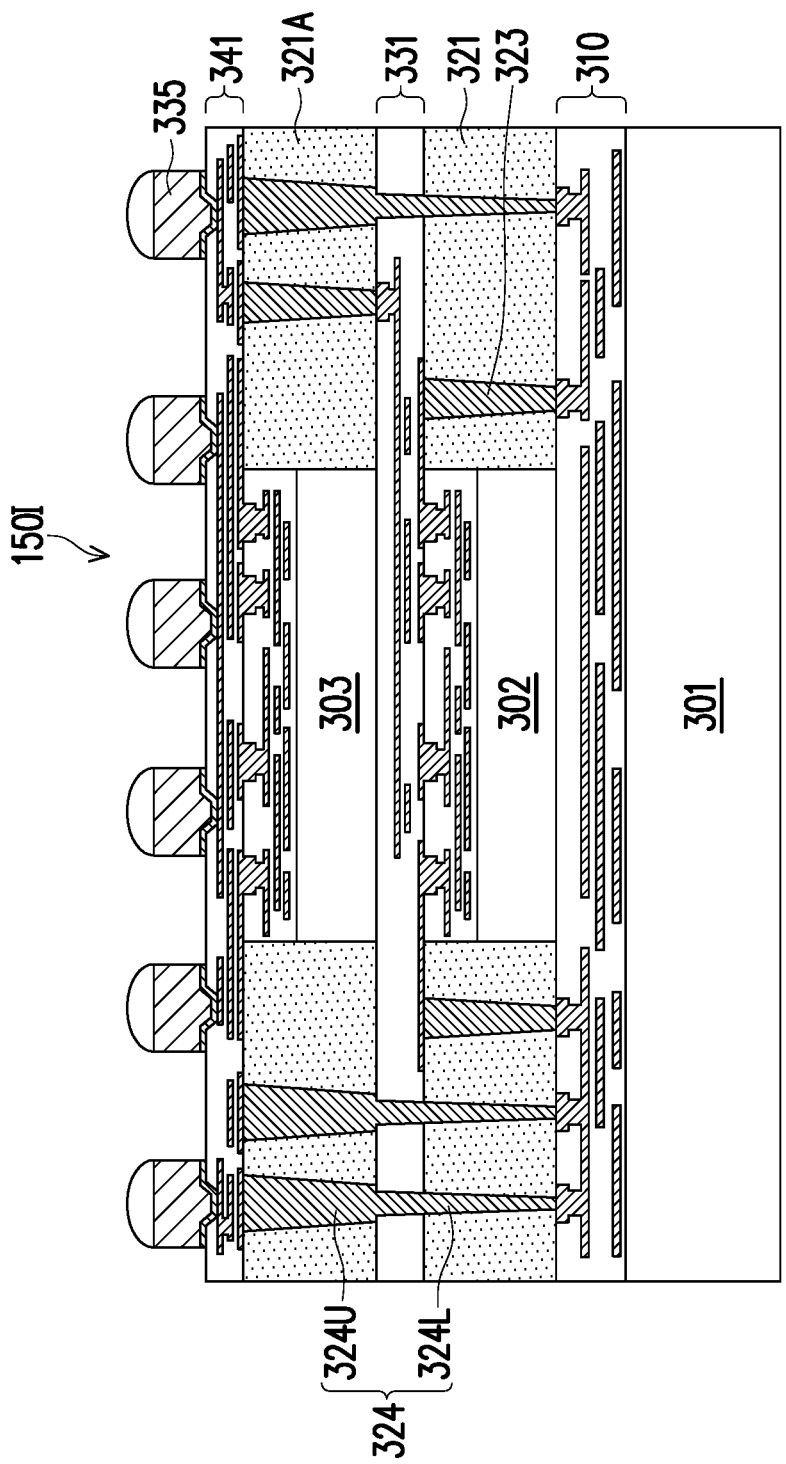

FIG. 45 illustrates a cross-sectional view of an SoIC 150I, which is similar to the SoIC 150G in FIG. 43, but with an additional level of vertical stacking. In particular, after the redistribution structure 331 is formed over the dielectric layer 321, a die 303 is bonded (e.g., using a fusion bonding process) to the redistribution structure 331 using the back-to-face bonding configuration, and a dielectric layer 321A, which may be the same as or similar to the dielectric layer 321, is formed over the redistribution structure 331. After the dielectric layer 321A is formed, conductive pillars 324, which may include an upper portion 324U and a lower portion 324L, are formed extending through the dielectric layers 321/321A in a single processing step using, e.g., a dual damascene process or a damascene process, in an embodiment. Note that in the example of FIG. 45, the conductive pillars 323 are formed after the dielectric layer 321 is formed and before the redistribution structure 331 is formed. After the conductive pillars 324 are formed, the redistribution structure 341 is formed, and subsequently, conductive bumps 335 are formed over and electrically coupled to the redistribution structure 341.

Figure 46:
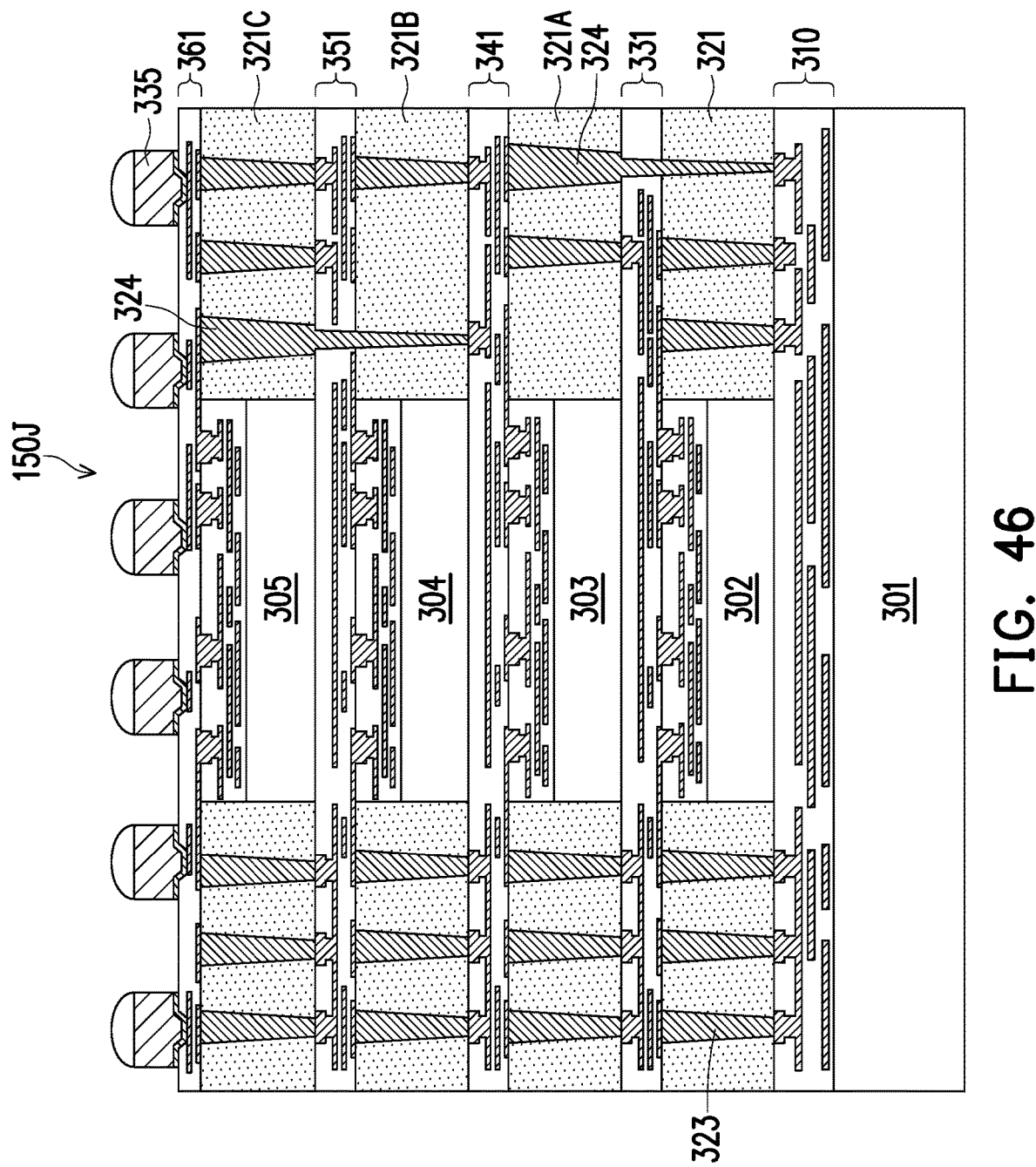

FIG. 46 illustrates a cross-sectional view of an SoIC 150J, which is similar to the SoIC 150I in FIG. 45, but with additional levels of vertical stacking. For example, additional dies (e.g., 304 and 305) and additional redistribution structures (e.g., 351 and 361) are formed compared with the SoIC 150I shown in FIG. 45. Note that in FIG. 46, each of the conductive pillars 324 extends through two adjacent dielectric layers, and may be formed in a single processing step (e.g., a dual-damascene process).

Figure 47A:
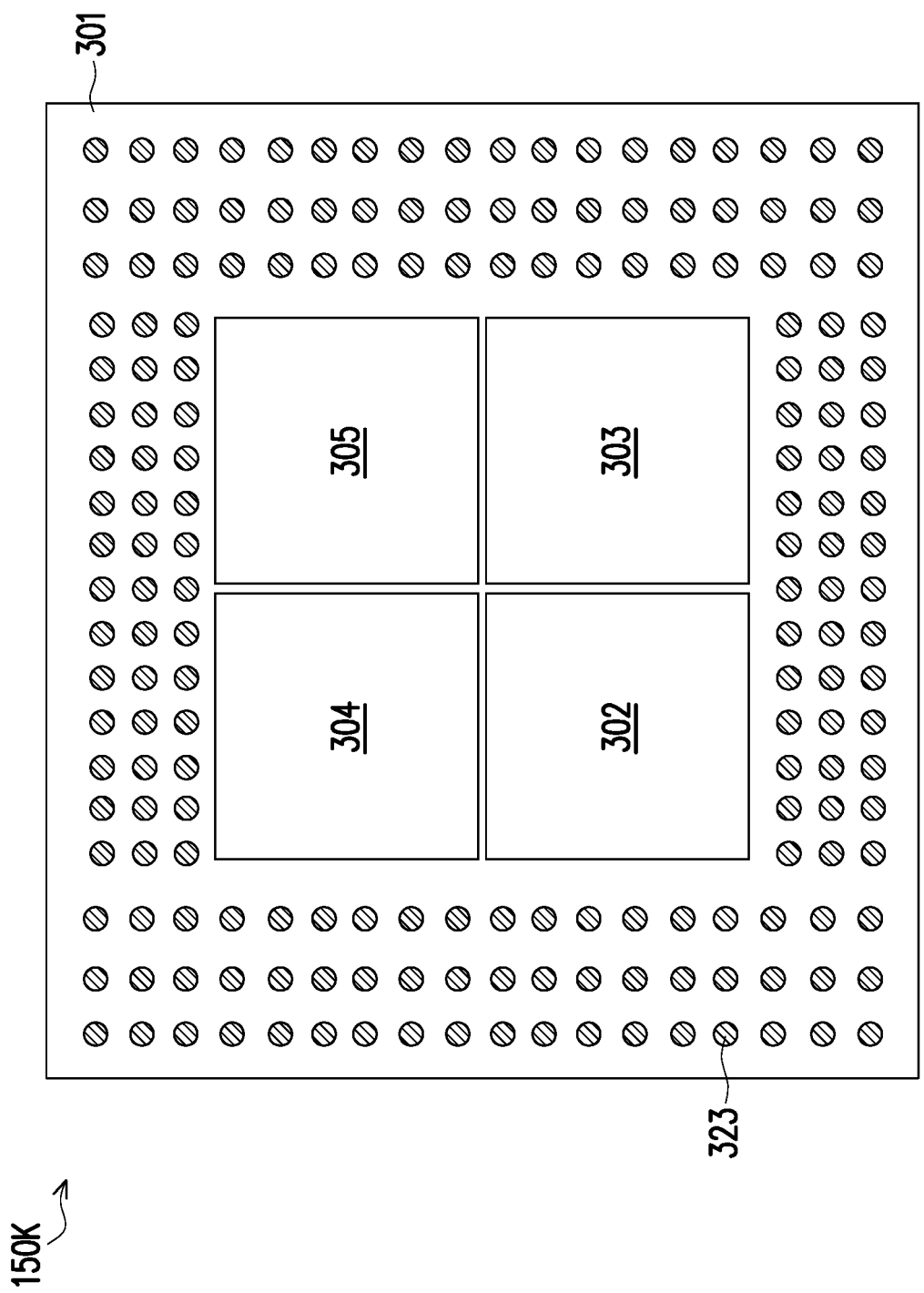
Figure 47B:
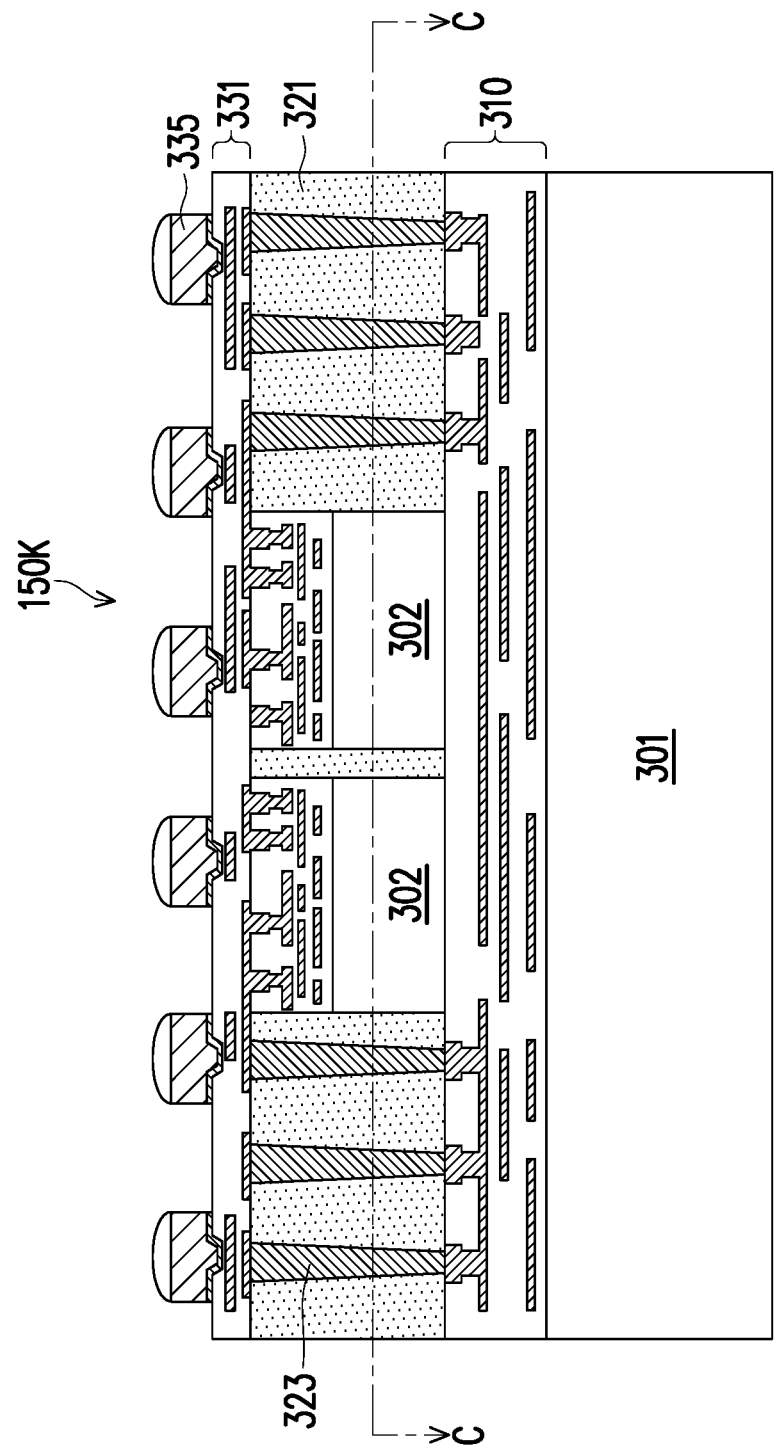

FIGS. 47A and 47B illustrate cross-sectional views of an SoIC 150K, which is similar to the SoIC 150G in FIG. 43, but with more than one dies (see 302, 303, 304, and 305 in FIG. 47A) disposed laterally next to each other at a same vertical level. FIG. 47A shows the cross-sectional view of the SoIC 150K along cross-section C-C in FIG. 47B. In the example of FIGS. 47A and 47B, four dies 302-305 are bonded to the front side of the die 301 (e.g., using a fusion bonding process), with conductive pillars 323 formed around the dies 302-305. Although no conductive pillars 323 are illustrated between the dies 302-305 in FIG. 47A, conductive pillars 323 may be formed between the dies 302-305 in other embodiments.

Figure 48:
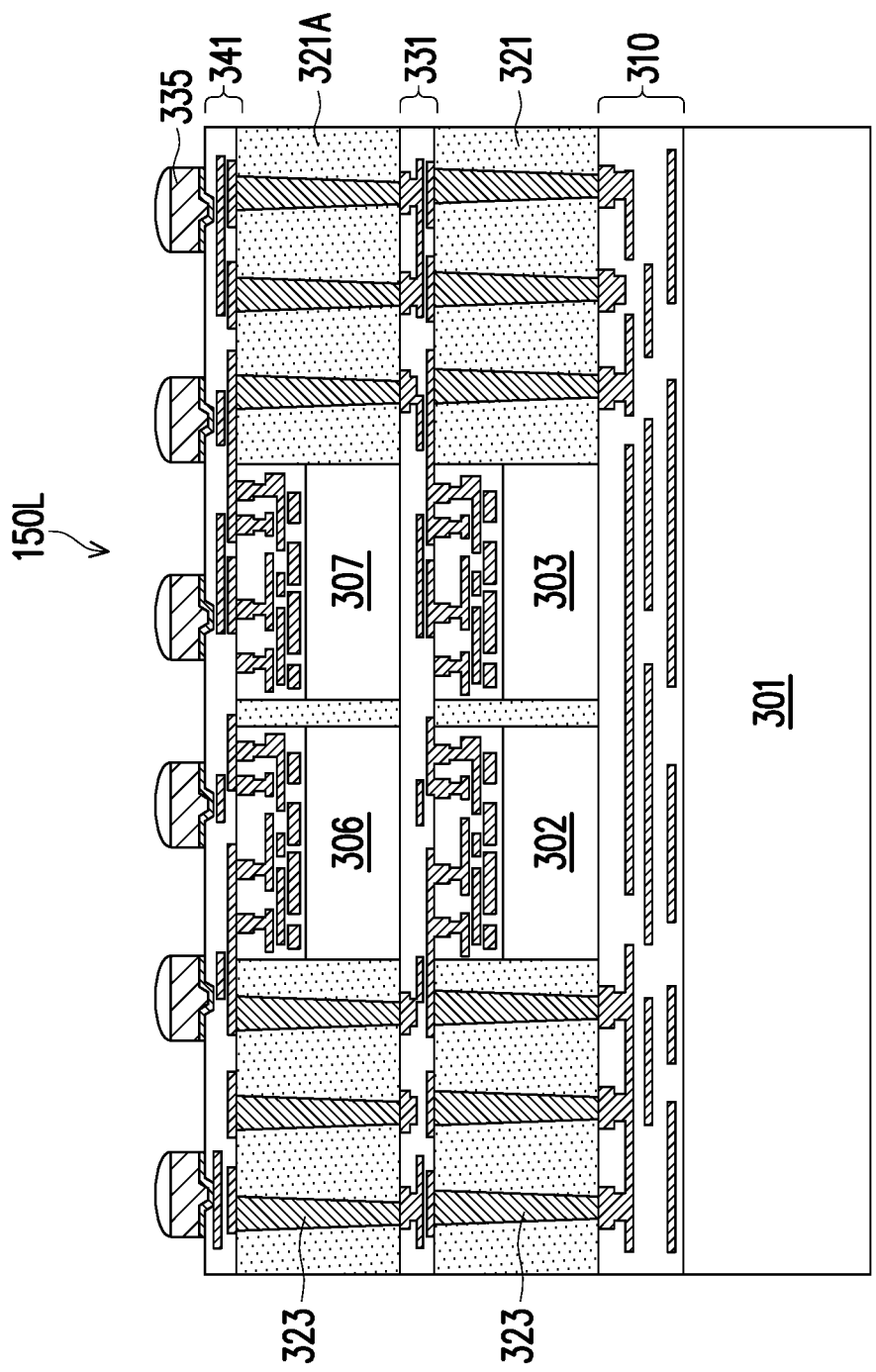

FIG. 48 illustrates a cross-sectional view of an SoIC 150L, which is similar to the SoIC 150K in FIGS. 47A and 47B, but with an additional level of vertical stacking. In particular, four additional dies 306, 307, 308, and 309 are bonded (e.g., using a fusion bonding process) to the redistribution structure 331. Note that the dies 308 and 309 are not in the cross-section of FIG. 48, thus are not illustrated in FIG. 48. In addition, a dielectric layer 321A, a redistribution structure 341, and conductive pillars 323 are formed over the redistribution structure 331.

Figure 49:
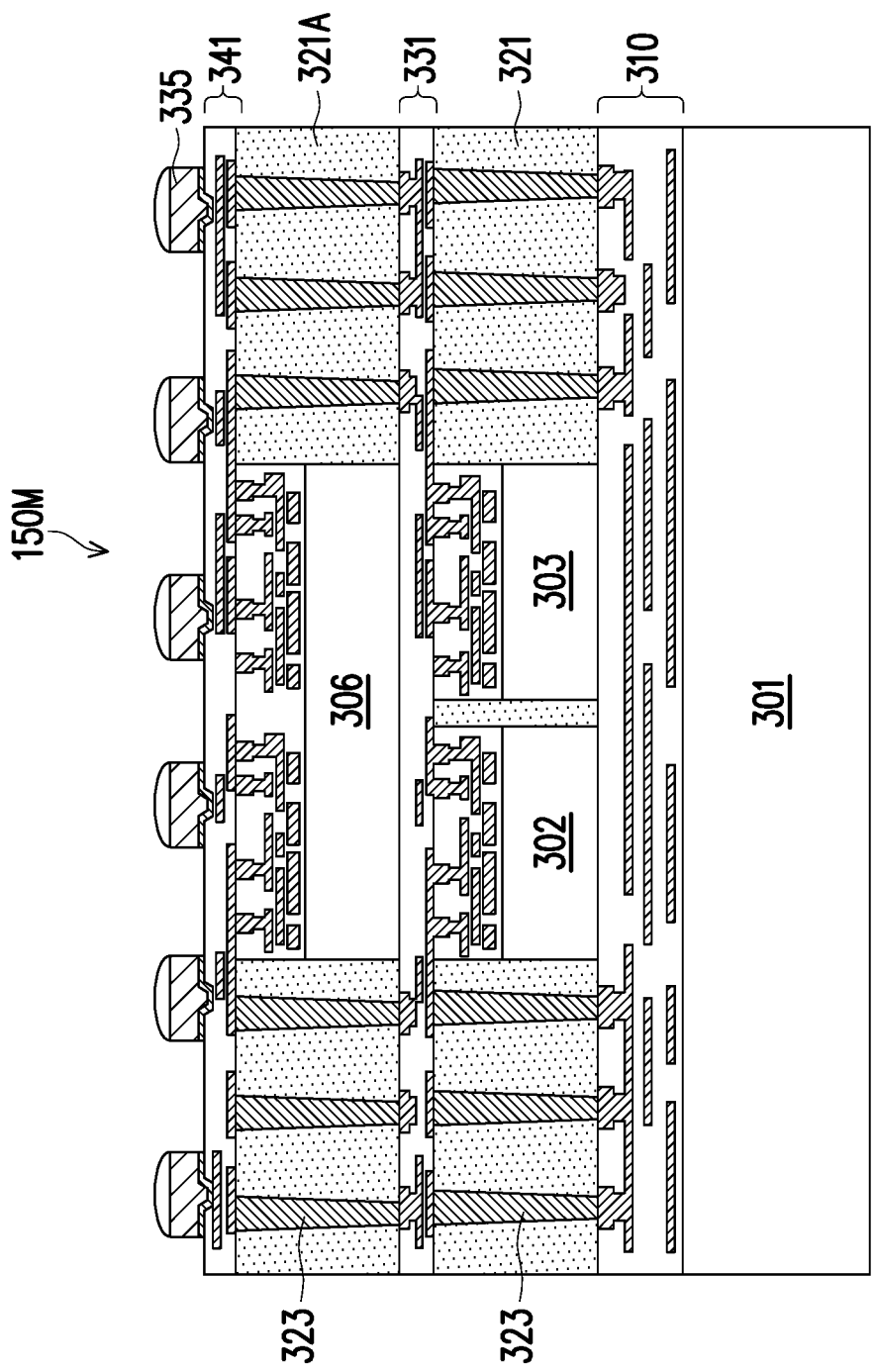

FIG. 49 illustrates a cross-sectional view of an SoIC 150M, which is similar to the SoIC 150L in FIG. 48, but with one die 306 (instead of four dies 306-309) bonded to the redistribution structure 331.

Figure 50A:
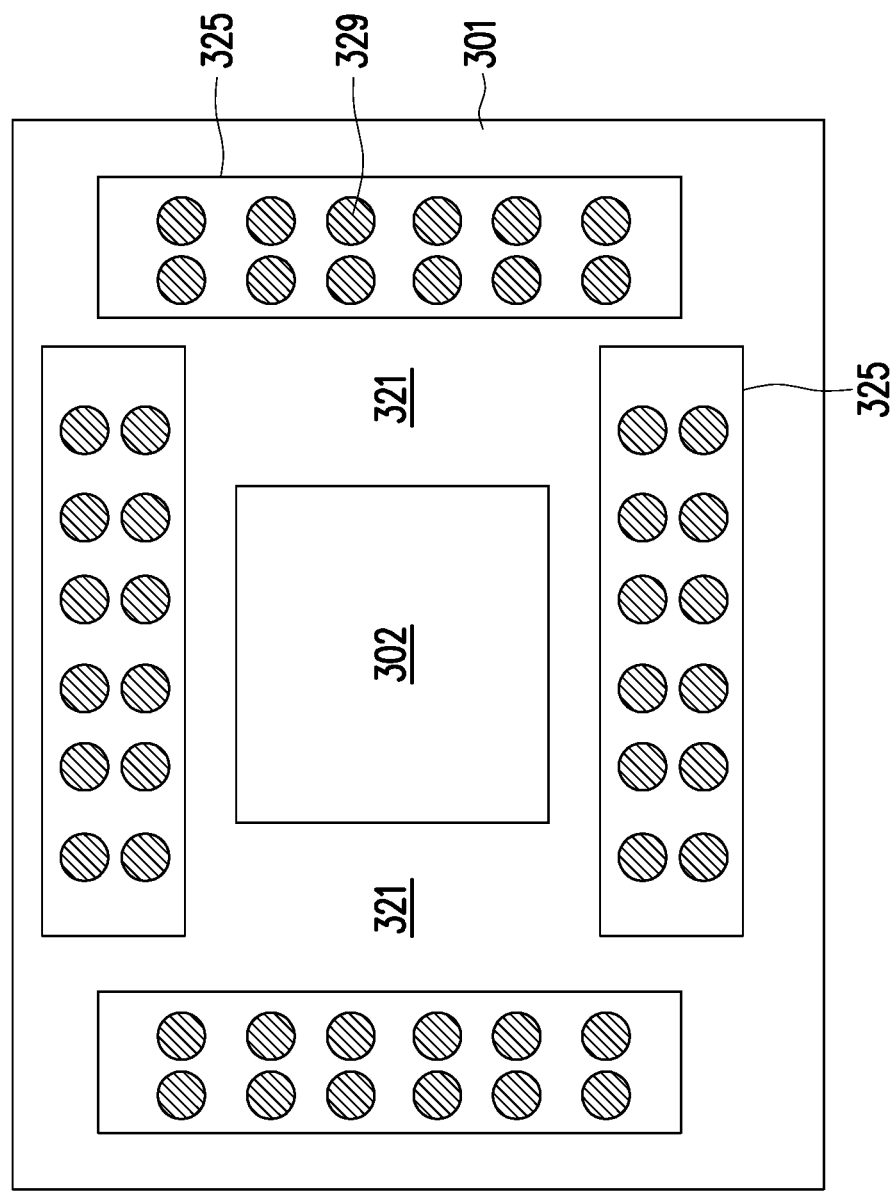
Figure 50B:
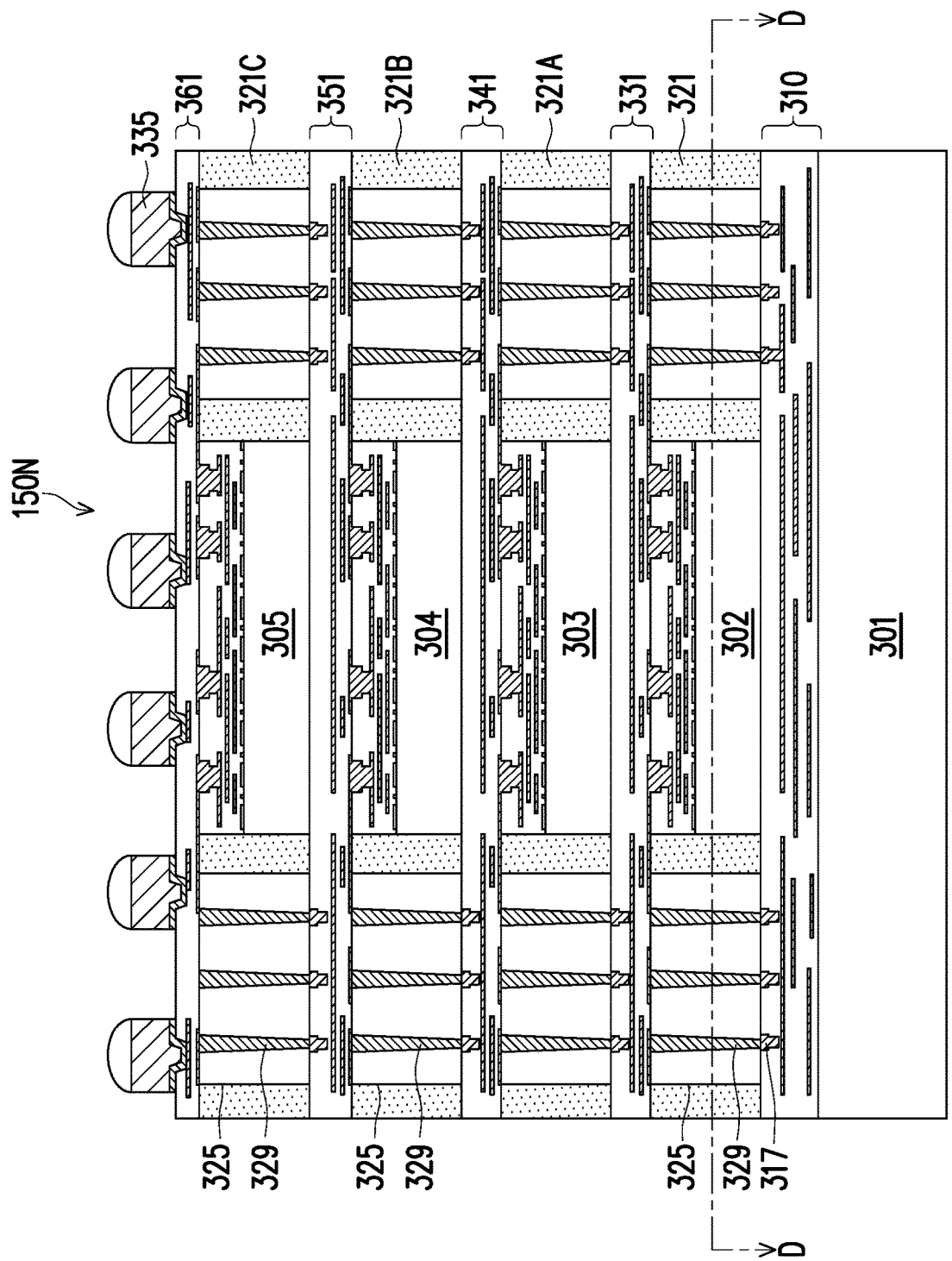

FIGS. 50A and 50B illustrate cross-sectional views of an SoIC 150N, which is similar to the SoIC 150J in FIG. 46, but with pre-formed connector chips 325 replacing the conductive pillars 323 and 324 in FIG. 46. FIG. 50A is a cross-sectional view of the SoIC 150N along cross-section D-D in FIG. 50B.

As illustrated in FIGS. 50A and 50B, pre-formed connector chips 325 replace the conductive pillars in the dielectric layers 321 and 321A-321C. For example, after the die 302 is bonded to the interconnect structure 310 of the die 301 using, e.g., a fusion bonding process, connectors chips 325, which are pre-formed, are attached to the interconnect structure 310 next to the die 302. The connectors chips 325 are attached at pre-determined locations such that vias 329 (may also be referred to as conductive pillars) of the connectors chips 325 are aligned with and contact (e.g., in physical contact with) respective bonding pads 317 of the interconnect structure 310.

Figure 50C:
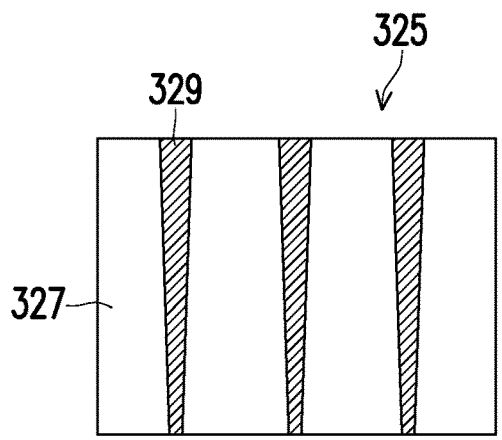

Referring to FIG. 50C, which shows a cross-sectional view of the connector chips 325. The pre-formed connectors chips 325 has a substrate 327 with vias 329 extending through the substrate 327. The substrate 327 may be a bulk material, such as a bulk silicon, although other bulk material, such as glass, ceramic, polymer, or the like, may also be used. The vias 329 are formed of an electrically conductive material, such as copper, tungsten, aluminum, or the like. In some embodiments, the substrate 327 is free of any other active or passive electrical components, such as transistors, capacitors, or the like. FIG. 50A shows the top view of the connector chips 325. The numbers of the vias 329 and the locations of the vias 329 in each connector chip 325 illustrated in FIGS. 50A and 50B are non-limiting examples. Other numbers and other locations are also possible and are fully intended to be included within the scope of the present disclosure.

Referring back to FIGS. 50A and 50B, after the pre-formed connector chips 325 are attached, the dielectric layer 321 is formed on the die 301 and around the die 302 and around the connector chips 325. A CMP process may be performed to planarize the dielectric layer 321, and the redistribution structure 331 is then formed over the dielectric layer 321. Similar processing may be repeated to form additional layers over the redistribution structure 331 to complete fabrication of the SoIC 150N.

Figure 51:
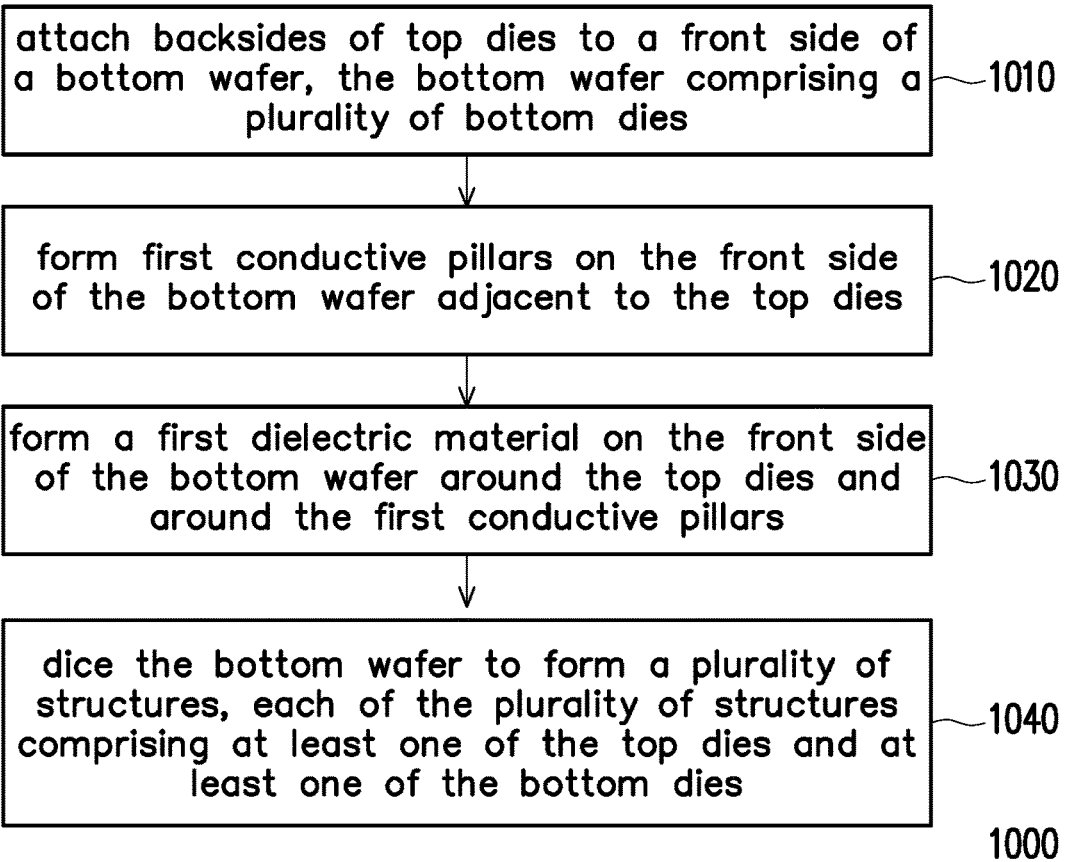
FIG. 51 illustrates a flow chart of method for forming a semiconductor structure, in some embodiments.

FIG. 51 illustrates a flow chart of method for forming a semiconductor structure, in some embodiments. It should be understood that the embodiment method shown in FIG. 51 is merely an example of many possible embodiment methods. One of ordinary skill in the art would recognize many variations, alternatives, and modifications. For example, various steps as illustrated in FIG. 51 may be added, removed, replaced, rearranged and repeated.

Referring to FIG. 51, as step 1010, backsides of top dies are attached to a front side of a bottom wafer, the bottom wafer comprising a plurality of bottom dies. At step 1020, first conductive pillars are formed on the front side of the bottom wafer adjacent to the top dies. At step 1030, a first dielectric material is formed on the front side of the bottom wafer around the top dies and around the first conductive pillars. At step 1040, the bottom wafer is diced to form a plurality of structures, each of the plurality of structures comprising at least one of the top dies and at least one of the bottom dies.

Embodiments may achieve advantages. For example, the dies in an SoIC communicate with each other through the conductive pillars and the redistribution structure(s) in the SoIC, and no through-substrate-vias (TSVs) that extend through the dies are needed to form the SoIC, which simplifies the fabrication of the dies, lowers the production cost of the dies, and allows dies of various types (e.g., logic dies, memory dies) to be integrated together to form the SoICs. The flexible structures for the SoICs, as illustrated by the various embodiments, allows for flexible sizes for the SoIC and flexible functional integration to achieve high integration densities. The SoICs formed may be integrated in different package types, such as packages with a CoWoS structure, flip-chip packages, or Integrated Fan-Out (InFO) packages. By using oxide in the redistribution structure, fine pitch (e.g., ≤0.8 μm line spacing) between conductive lines is achieved for the redistribution structure, which may not be achievable previously. By forming a nitride layer on the backside of the top dies, greater bonding strength is achieved for the fusion bonding process.

In accordance with an embodiment, a method of forming semiconductor structure includes attaching backsides of top dies to a front side of a bottom wafer, the bottom wafer comprising a plurality of bottom dies; forming first conductive pillars on the front side of the bottom wafer adjacent to the top dies; forming a first dielectric material on the front side of the bottom wafer around the top dies and around the first conductive pillars; and dicing the bottom wafer to form a plurality of structures, each of the plurality of structures comprising at least one of the top dies and at least one of the bottom dies. In an embodiment, the method further includes, before the attaching, testing the bottom wafer through disposable probing pads disposed at the front side of the bottom wafer. In an embodiment, the method further includes, after the testing and before the attaching: removing the disposable probing pads from the bottom wafer; forming a dielectric layer over the front side of the bottom wafer after removing the disposable probing pads; and forming bonding pads extending through the dielectric layer and electrically coupled to the bottom dies, wherein the first conductive pillars are formed over respective ones of the bonding pads. In an embodiment, the backsides of the top dies are attached to the front side of the bottom wafer through a fusion bonding process. In an embodiment, the backsides of the top dies physically contact the bottom wafer. In an embodiment, the method further includes forming a nitride layer on the backsides of the top dies before attaching the backsides of the top dies to the front side of the bottom wafer. In an embodiment, attaching the backsides of the top dies to the front side of the bottom wafer includes attaching the backsides of the top dies to the front side of the bottom wafer using an adhesive film. In an embodiment, the first dielectric material is an oxide and is formed on the front side of the bottom wafer before the first conductive pillars are formed. In an embodiment, forming the first conductive pillars includes: forming openings in the first dielectric material, the openings exposing electrically conductive features at the front side of the bottom wafer; and filling the openings with an electrically conductive material. In an embodiment, the method further includes, before dicing the bottom wafer, forming a redistribution structure on the first dielectric material. In an embodiment, the method further includes, after dicing the bottom wafer: bonding one or more of the plurality of structures to a first side of an interposer; forming external connectors on a second opposing side of the interposer; and bonding the external connectors of the interposer to a substrate. In an embodiment, the method further includes attaching a lid to the substrate around and over the interposer. In an embodiment, the method further includes, after dicing the bottom wafer: attaching the plurality of structures to a carrier; forming second conductive pillars on the carrier adjacent to the plurality of structures; forming a molding material on the carrier around the plurality of structures and around the second conductive pillars; and forming a redistribution structure over the molding material.

In accordance with an embodiment, a method of forming semiconductor structure includes forming an integrated circuit device, wherein forming the integrated circuit device includes: attaching a backside of a second die to a front side of a first die, wherein the first die has first conductive pads at the front side of the first die, the first conductive pads being disposed outside boundaries of the second die; forming a dielectric material on the front side of the first die and around the second die; forming first conductive pillars in the dielectric material and electrically coupled to the first conductive pads of the first die; forming a redistribution structure on the dielectric material and electrically coupled to the second die and the first conductive pillars; and forming connectors over the redistribution structure; attaching the connectors of the integrated circuit device to a first side of an interposer; and forming a molding material on the first side of the interposer around the integrated circuit device; and forming conductive bumps on a second side of the interposer. In an embodiment, the method further includes: bonding the conductive bumps on the second side of the interposer to a substrate; and attaching a lid to the substrate, wherein the integrated circuit device and the interposer are disposed in an enclosed space between the lid and the substrate. In an embodiment, the method further includes: after forming the molding material and before forming the conductive bumps, attaching a first side of the molding material distal the interposer to a carrier; and grinding the second side of the interposer to reduce a thickness of the interposer, wherein after the grinding, first end surfaces of through vias embedded in the interposer are exposed, wherein the conductive bumps are formed on the first end surfaces of the through vias. In an embodiment, attaching the backside of the second die to the front side of the first die includes: forming a nitride layer on the backside of the second die; and after forming the nitride layer, performing a fusion bonding process to bond the nitride layer on the backside of the second die to the front side of the first die.

In accordance with an embodiment, a semiconductor structure includes: a first die having first conductive pads at a first side of the first die; a second die having a first side that faces away from the first die and having a second side that is attached to the first side of the first die, the second die having second conductive pads at the first side of the second die; a first conductive pillar attached to a first conductive pad of the first die and adjacent to the second die; a first dielectric material on the first side of the first die and around the second die and around the first conductive pillar, wherein the first dielectric material is conterminous with the first die; a redistribution structure on the first dielectric material and electrically coupled to the first conductive pillar and the second conductive pads of the second die; and external connectors on a first side of the redistribution structure facing away from the second die. In an embodiment, the semiconductor structure further includes: a molding material around the first die, the second die, and the first dielectric material; and a second conductive pillar in the molding material and electrically coupled to the redistribution structure. In an embodiment, the second side of the second die contacts the first side of the first die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming semiconductor structure, the method comprising:
    attaching backsides of top dies to a front side of a bottom wafer, the bottom wafer comprising a plurality of bottom dies;
    forming first conductive pillars on the front side of the bottom wafer adjacent to the top dies;
    forming a first dielectric material on the front side of the bottom wafer around the top dies and around the first conductive pillars; and
    dicing the bottom wafer to form a plurality of structures, each of the plurality of structures comprising at least one of the top dies and at least one of the bottom dies.

2. The method of claim 1, further comprising:
    before the attaching, testing the bottom wafer through disposable probing pads disposed at the front side of the bottom wafer.

3. The method of claim 2, further comprising, after the testing and before the attaching:
    removing the disposable probing pads from the bottom wafer;
    forming a dielectric layer over the front side of the bottom wafer after removing the disposable probing pads; and
    forming bonding pads extending through the dielectric layer and electrically coupled to the bottom dies, wherein the first conductive pillars are formed over respective ones of the bonding pads.

4. The method of claim 1, wherein the backsides of the top dies are attached to the front side of the bottom wafer through a fusion bonding process.

5. The method of claim 4, wherein the backsides of the top dies physically contact the bottom wafer.

6. The method of claim 4, further comprising forming a nitride layer on the backsides of the top dies before attaching the backsides of the top dies to the front side of the bottom wafer.

7. The method of claim 1, wherein attaching the backsides of the top dies to the front side of the bottom wafer comprises attaching the backsides of the top dies to the front side of the bottom wafer using an adhesive film.

8. The method of claim 1, wherein the first dielectric material is an oxide and is formed on the front side of the bottom wafer before the first conductive pillars are formed.

9. The method of claim 8, wherein forming the first conductive pillars comprises:
    forming openings in the first dielectric material, the openings exposing electrically conductive features at the front side of the bottom wafer; and
    filling the openings with an electrically conductive material.

10. The method of claim 1, further comprising, before dicing the bottom wafer, forming a redistribution structure on the first dielectric material.

11. The method of claim 10, further comprising, after dicing the bottom wafer:
    bonding one or more of the plurality of structures to a first side of an interposer;
    forming external connectors on a second opposing side of the interposer; and bonding the external connectors of the interposer to a substrate.

12. The method of claim 11, further comprising attaching a lid to the substrate around and over the interposer.

13. The method of claim 1, further comprising, after dicing the bottom wafer:
    attaching the plurality of structures to a carrier;
    forming second conductive pillars on the carrier adjacent to the plurality of structures;
    forming a molding material on the carrier around the plurality of structures and around the second conductive pillars; and
    forming a redistribution structure over the molding material.

14. A method of forming semiconductor structure, the method comprising:
    attaching backsides of a plurality of top dies to a front side of a wafer, the wafer comprising a plurality of bottom dies, the wafer having conductive pads at the front side of the wafer, the plurality of top dies being attached to regions of the front side free of the conductive pads;
    forming conductive pillars over and electrically coupled to the conductive pads of the wafer;
    forming a dielectric material over the front side of the wafer and around the plurality of top dies; and
    dicing the wafer to from a plurality of semiconductor structures, each of the plurality of semiconductor structures comprising a top die, a bottom die, and a conductive pillar.

15. The method of claim 14, further comprising, before dicing the wafer:
    forming redistribution structures on the dielectric material and electrically coupled to the plurality of top dies and the conductive pillars; and
    forming connectors over and electrically coupled to the redistribution structures, wherein each of the plurality of semiconductor structures further comprises a redistribution structure and a connector.

16. The method of claim 15, further comprising, after the dicing:
    attaching the connector of a first semiconductor structure of the plurality of semiconductor structures to a first side of an interposer; and
    forming a molding material on the first side of the interposer around the first semiconductor structure; and
    forming conductive bumps on a second side of the interposer.

17. The method of claim 16, further comprising:
    bonding the conductive bumps on the second side of the interposer to a substrate; and
    attaching a lid to the substrate, wherein the first semiconductor structure and the interposer are disposed in an enclosed space between the lid and the substrate.

18. A method of forming semiconductor structure, the method comprising:
    bonding backsides of a plurality of top dies to a front side of a wafer, the wafer comprising a plurality of bottom dies, the plurality of top dies being bonded to a top dielectric layer of the wafer;
    forming first conductive pillars over and electrically coupled to conductive pads at the front side of the wafer;
    forming a dielectric material over the front side of the wafer and around the plurality of top dies; and
    performing a dicing process to separate the wafer to from a plurality of semiconductor structures, wherein each of the plurality of semiconductor structures comprises at least a top die, a bottom die, and a first conductive pillar.

19. The method of claim 18, wherein the top die are bonded to the top dielectric layer of the wafer by a fusion bonding process, wherein the method further comprises forming a nitride layer on the backsides of the plurality of top dies before the bonding.

20. The method of claim 18, further comprising, after the dicing:
    embedding a first semiconductor structure of the plurality of semiconductor structures in a molding material;
    forming a second conductive pillar in the molding material;
    forming a redistribution structure over the molding material and electrically coupled to the first semiconductor structure and the second conductive pillar; and
    forming external connectors over and electrically coupled to the redistribution structure.

* * * * *